United States Patent
Hutzler et al.

(10) Patent No.: US 9,793,387 B2
(45) Date of Patent: Oct. 17, 2017

(54) SEMICONDUCTOR DEVICE INCLUDING A VERTICAL PN JUNCTION BETWEEN A BODY REGION AND A DRIFT REGION

(71) Applicant: Infineon Technologies Austria AG, Villach (AT)

(72) Inventors: Michael Hutzler, Villach (AT); Georg Ehrentraut, Villach (AT); Matthias Kuenle, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/239,093

(22) Filed: Aug. 17, 2016

(65) Prior Publication Data
US 2017/0054012 A1 Feb. 23, 2017

(30) Foreign Application Priority Data
Aug. 18, 2015 (DE) .................. 10 2015 113 605

(51) Int. Cl.
| | |
|---|---|
| H01L 29/66 | (2006.01) |
| H01L 29/739 | (2006.01) |
| H01L 29/40 | (2006.01) |
| H01L 29/36 | (2006.01) |
| H01L 29/423 | (2006.01) |
| H01L 29/10 | (2006.01) |

(52) U.S. Cl.
CPC ...... *H01L 29/7397* (2013.01); *H01L 29/1095* (2013.01); *H01L 29/36* (2013.01); *H01L 29/407* (2013.01); *H01L 29/4236* (2013.01); *H01L 29/66348* (2013.01)

(58) Field of Classification Search
CPC ............. H01L 29/7397; H01L 29/1095; H01L 29/407; H01L 29/66348; H01L 29/36; H01L 29/4236
See application file for complete search history.

(56) References Cited

U.S. PATENT DOCUMENTS

| | | | |
|---|---|---|---|
| 2007/0108469 A1 | 5/2007 | Nakano et al. | |
| 2012/0319199 A1* | 12/2012 | Zeng ................. | H01L 29/407 257/334 |
| 2017/0040420 A1* | 2/2017 | Mori .................. | H01L 29/739 |

FOREIGN PATENT DOCUMENTS

DE     102004005775 A1    8/2005

* cited by examiner

*Primary Examiner* — Dale E Page
*Assistant Examiner* — Wasiul Haider
(74) *Attorney, Agent, or Firm* — Murphy, Bilak & Homiller, PLLC

(57) ABSTRACT

A semiconductor device includes a drift region extending from a first surface into a semiconductor portion. A body region between two portions of the drift region forms a first pn junction with the drift region. A source region forms a second pn junction with the body region. The pn junctions include sections perpendicular to the first surface. Gate structures extend into the body regions and include a gate electrode. Field plate structures extend into the drift region and include a field electrode separated from the gate electrode. A gate shielding structure is configured to reduce a capacitive coupling between the gate structures and a backplate electrode directly adjoining a second surface.

24 Claims, 47 Drawing Sheets

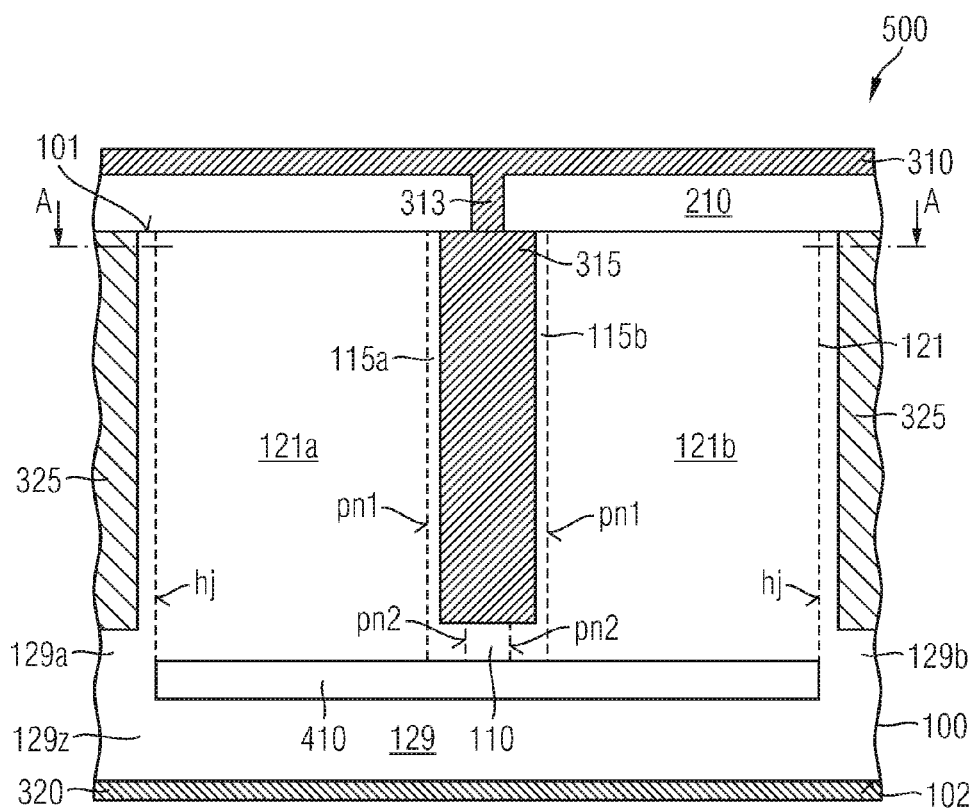

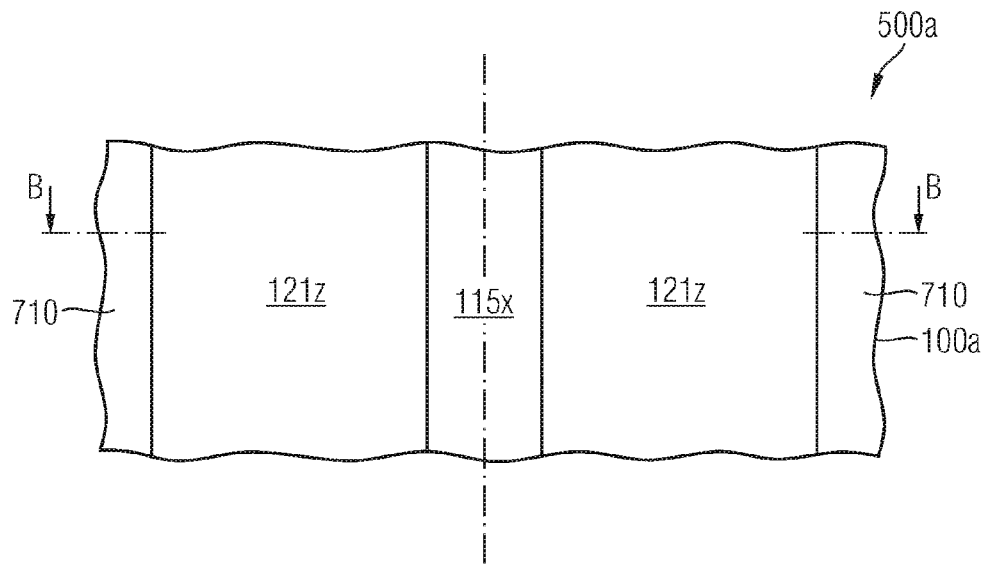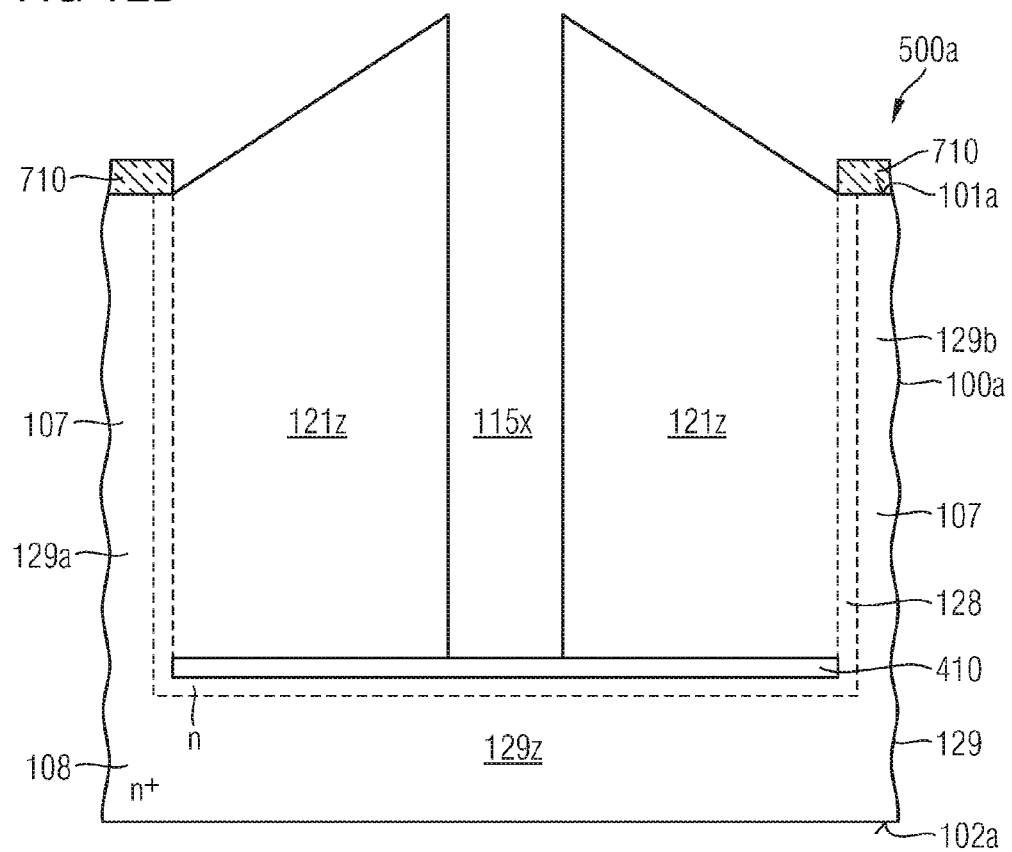

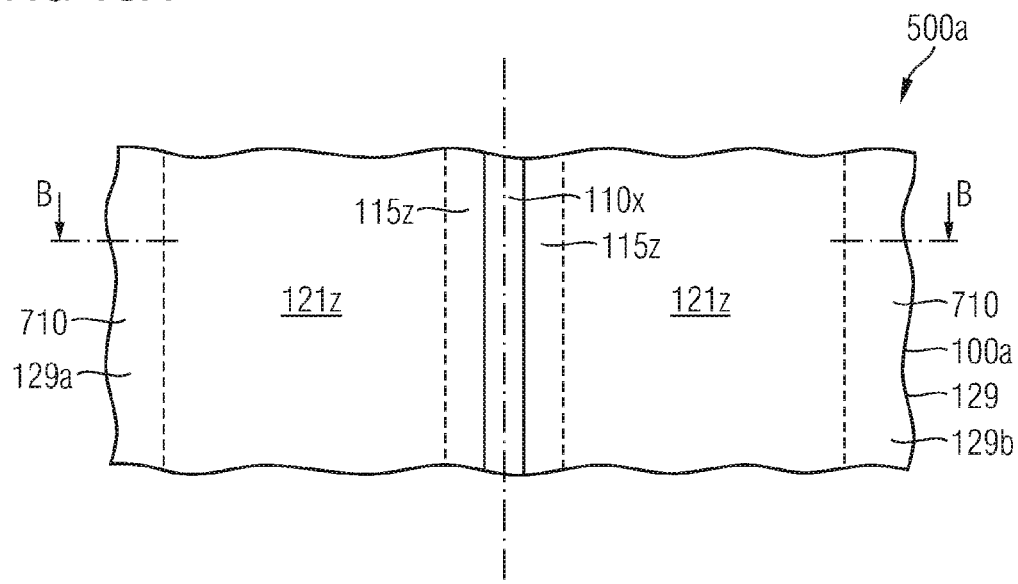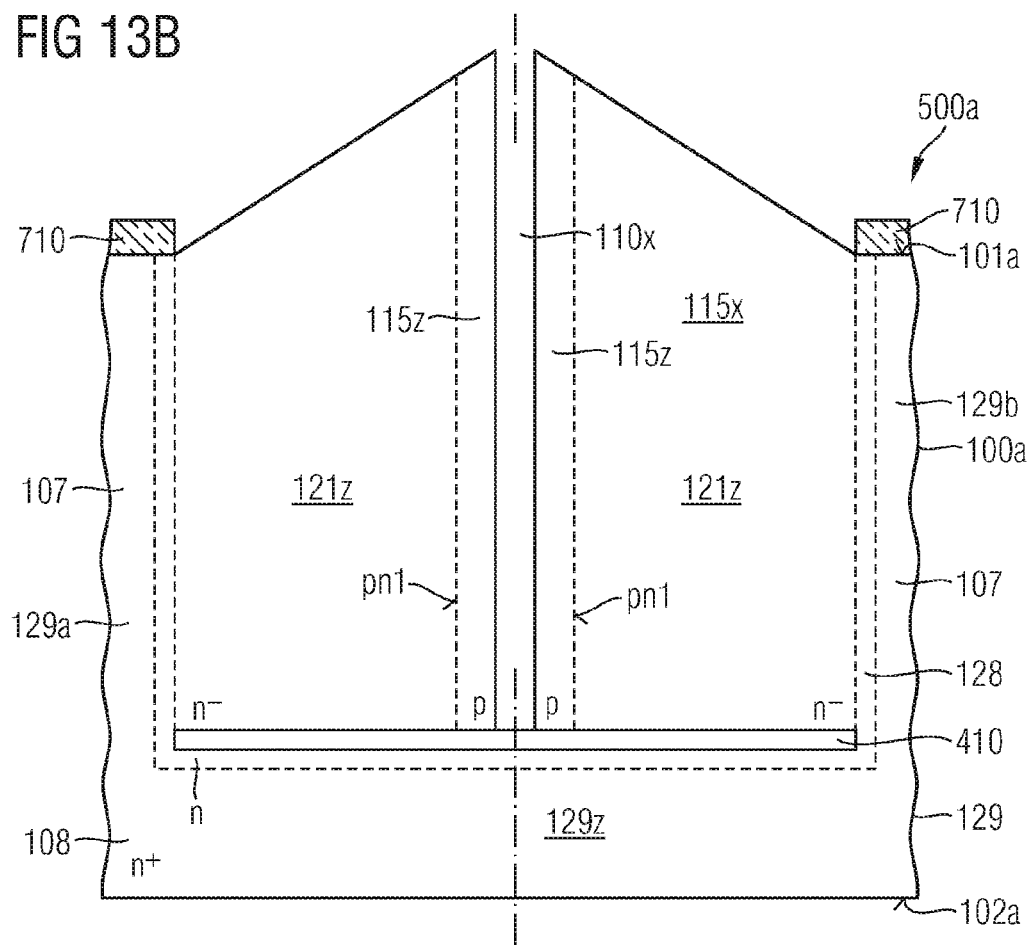

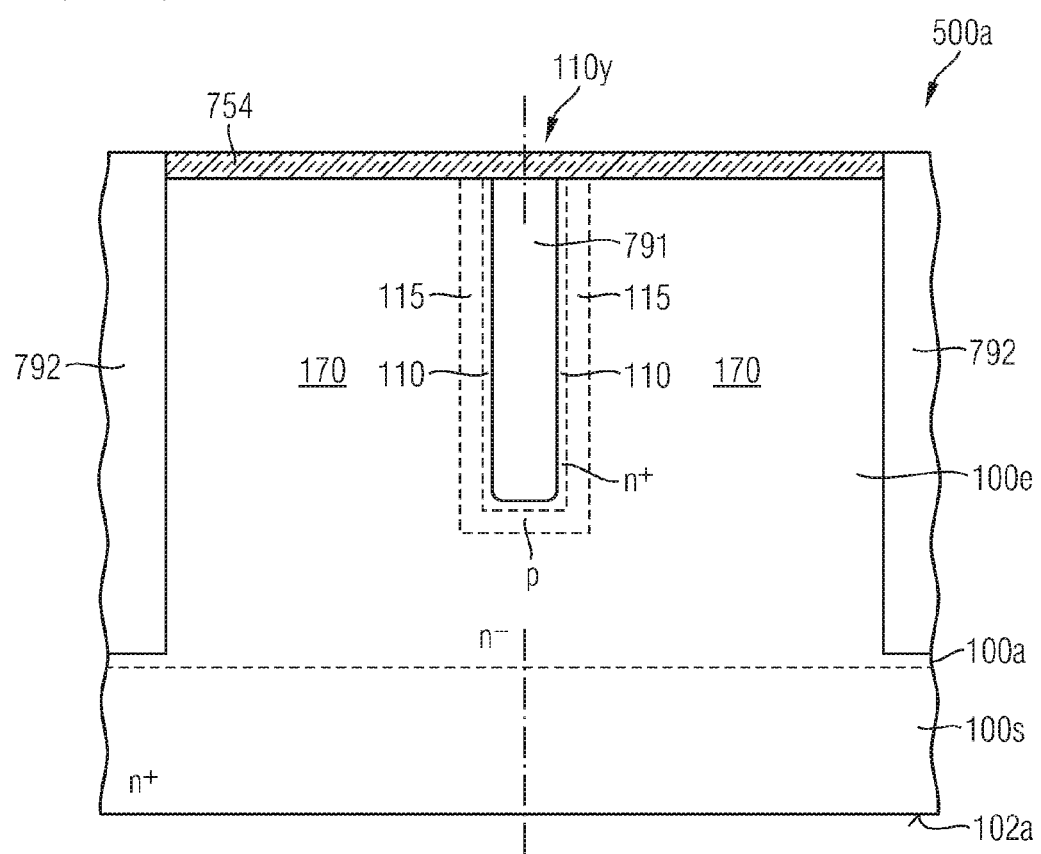

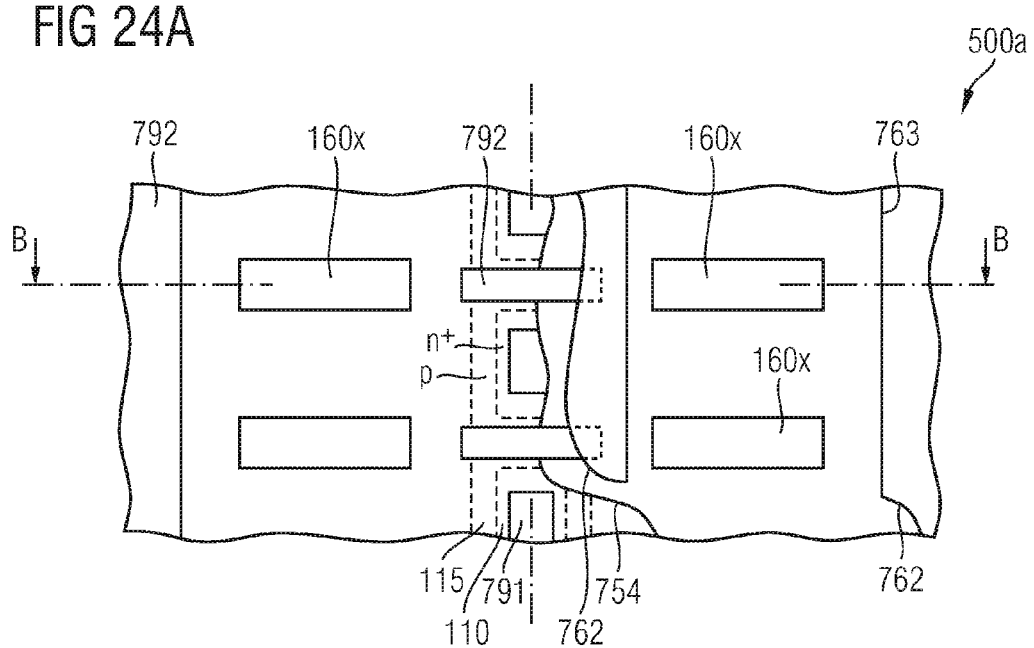
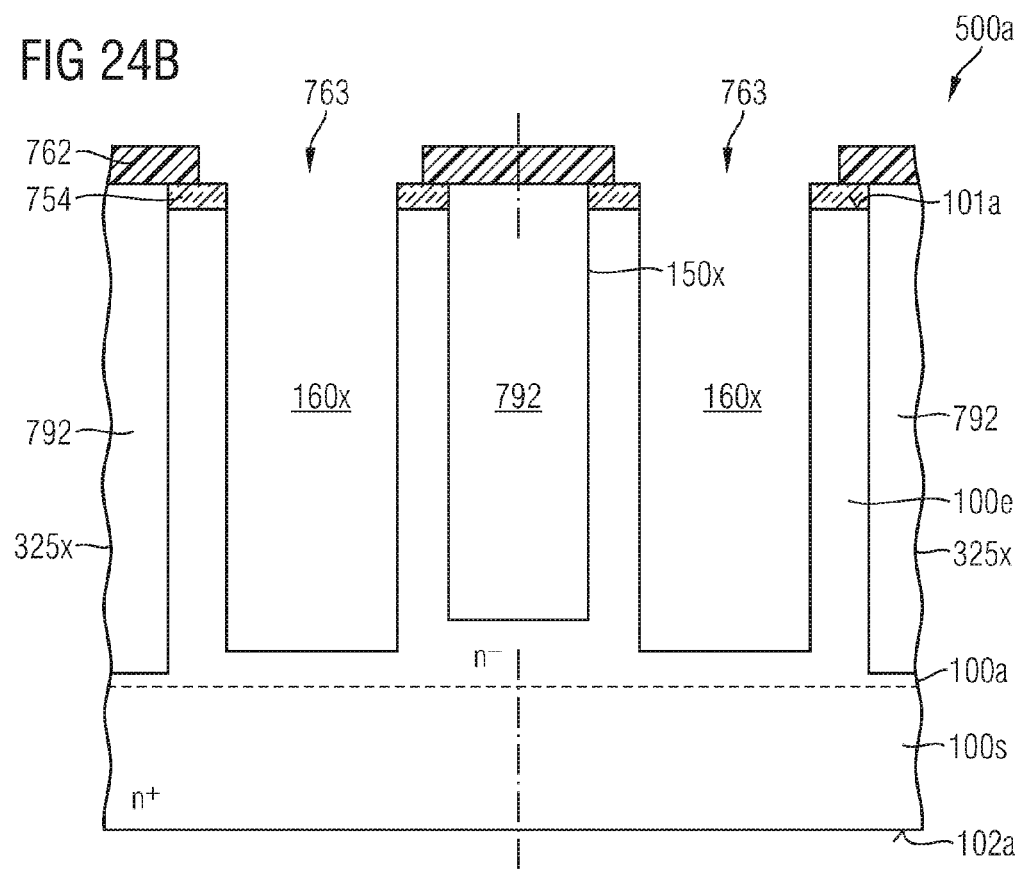

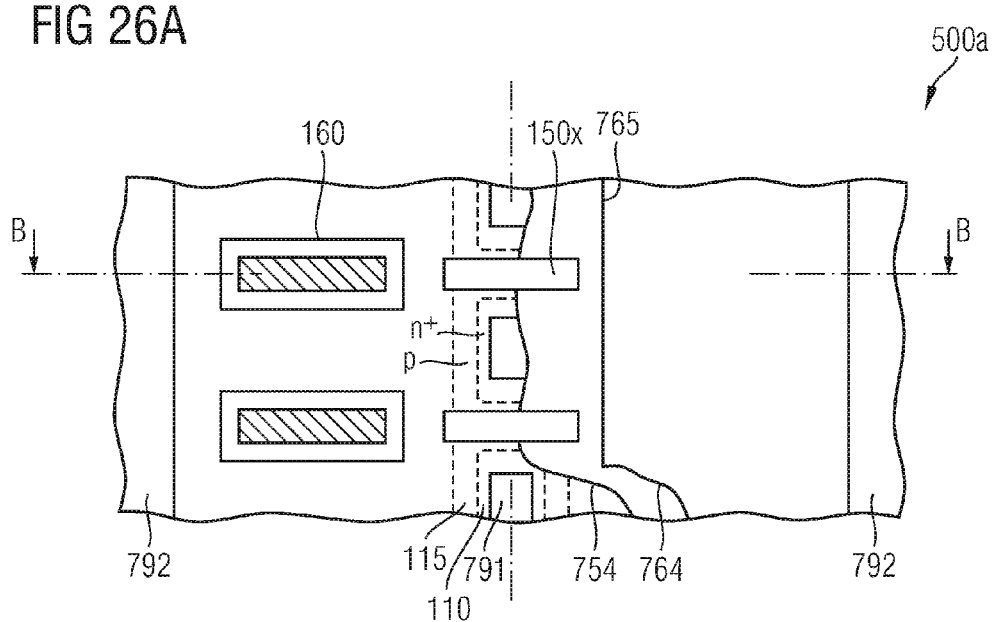
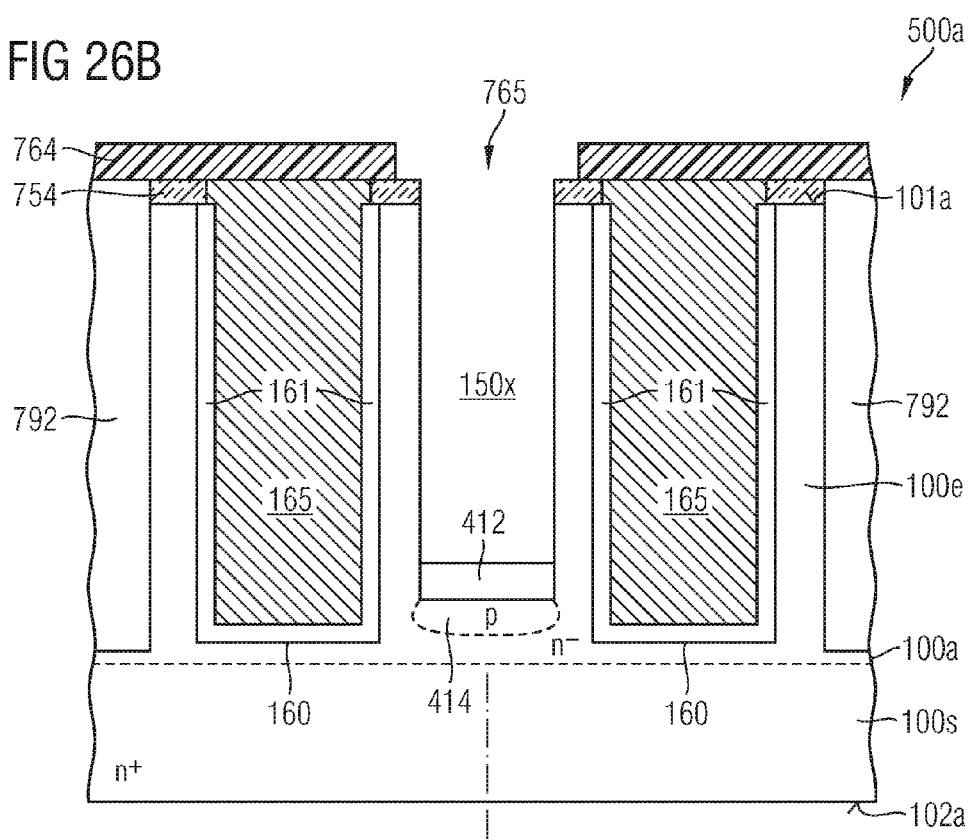

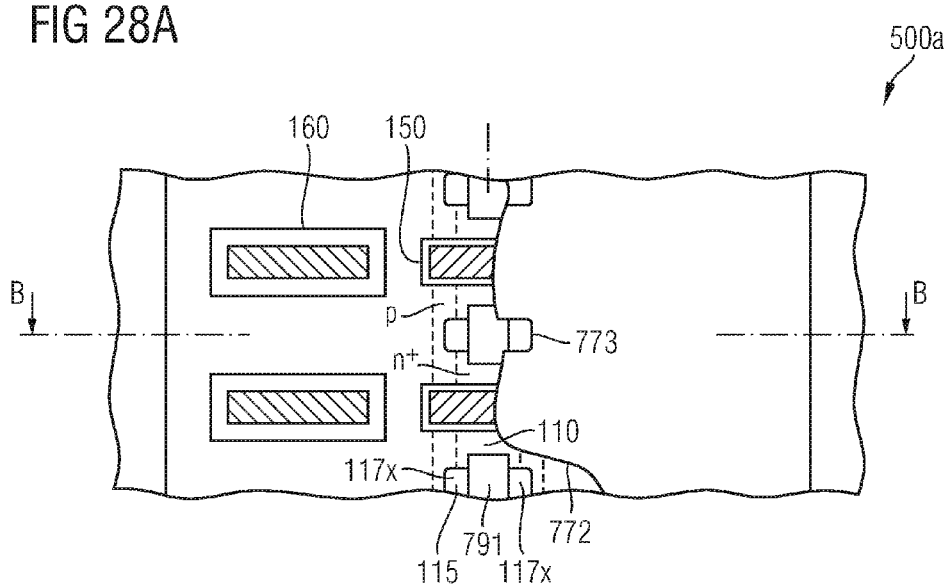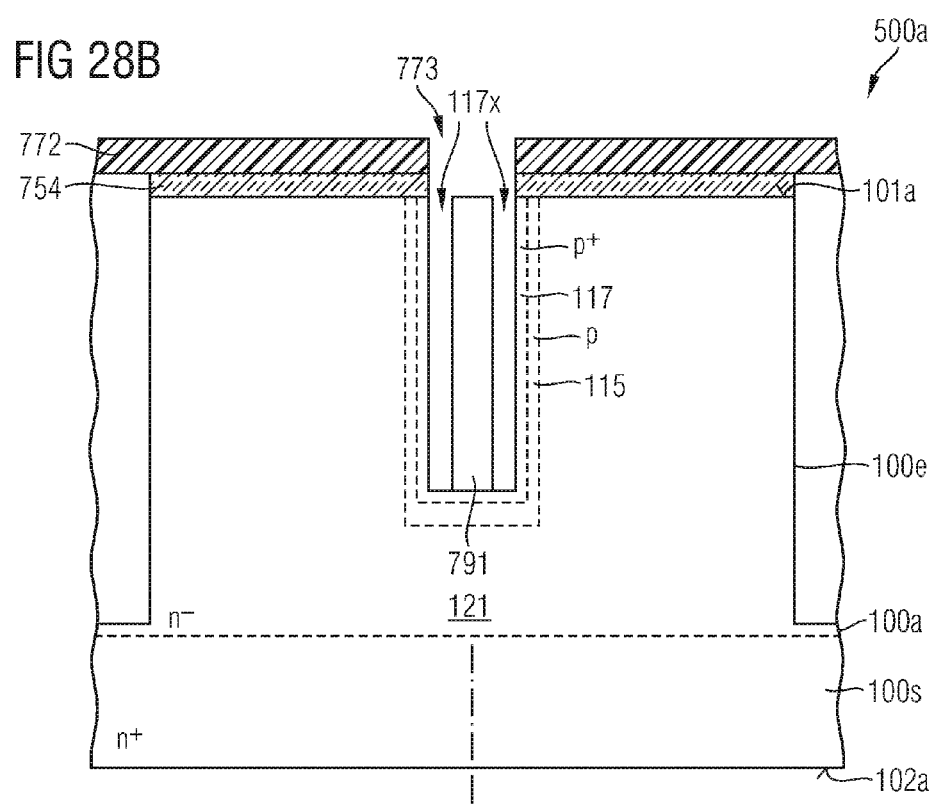

SEMICONDUCTOR DEVICE INCLUDING A VERTICAL PN JUNCTION BETWEEN A BODY REGION AND A DRIFT REGION

BACKGROUND

In power semiconductor devices, for example, IGFETs (insulated gate field effect transistors) a load current typically flows in a vertical direction between two load electrodes formed at opposite sides of a semiconductor die that includes a weakly doped drift layer. A dopant concentration in the drift layer results from a tradeoff between blocking capability and on-state resistance of the semiconductor device. Field plate structures extending from a front side into the semiconductor die deplete a portion of the drift layer in the blocking mode such that the dopant concentration in the drift layer can be increased without adverse impact on the blocking capability. Shrinking stripe-shaped field plate structures to needle-shaped field plate structures increases an active transistor area and allows the gate structure to form a grid with larger channel width compared to stripe-shaped gate structures.

It is desirable to further improve the performance of power semiconductor devices.

SUMMARY

According to an embodiment a semiconductor device includes a drift region that extends from a first surface into a semiconductor portion. A body region between two portions of the drift region forms a first pn junction with the drift region. A source region between two portions of the body region forms a second pn junction with the body region. The first and second pn junctions include sections perpendicular to the first surface. Gate structures including gate electrodes extend from the first surface into the body regions. Field plate structures including field electrodes separated from the gate electrodes extend from the first surface into the drift region. A gate shielding structure in a vertical projection of the gate structures is configured to reduce a capacitive coupling between the gate structures and a backplate electrode directly adjoining a second surface of the semiconductor portion opposite to the first surface.

According to another embodiment a method of forming a semiconductor device includes forming a drift region extending from a main surface into a base substrate. A body region is formed between two portions of the drift region, wherein the body region forms a first pn junction with the drift region. A source region is formed between two portions of the body region, wherein the source region forms a second pn junction with the body region. The first and second pn junctions include sections perpendicular to the main surface. Gate structures are formed that extend from the main surface into the body regions and that include a gate electrode. Field plate structures are formed that extend from the main surface into the drift region and that include a field electrode separated from the gate electrode. A gate shielding structure is formed in a vertical projection of the gate structures. The gate shielding structure is configured to reduce a capacitive coupling between the gate structures and a backplate electrode that directly adjoins a supporting surface opposite to the main surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3C is a schematic vertical cross-sectional view of the semiconductor device portion of FIG. 3A along line C-C through gate and field plate structures.

FIG. 12A is a schematic plan view of the semiconductor substrate portion of FIG. 11A, after forming precursor drift regions above a dielectric separation structure.

FIG. 12B is a schematic vertical cross-sectional view of the semiconductor substrate portion of FIG. 12A along line B-B.

FIG. 13A is a schematic plan view of the semiconductor substrate portion of FIG. 12A, after forming precursor body regions on sidewalls of the precursor drift regions and above the dielectric separation structure.

FIG. 13B is a schematic vertical cross-sectional view of the semiconductor substrate portion of FIG. 13A along line B-B.

FIG. 23C is a schematic vertical cross-sectional view of the semiconductor substrate portion of FIG. 23A along line C-C through the mesa portions of the drift region.

FIG. 24A is a schematic plan view of the semiconductor substrate portion of FIG. 23A, after removing the second sacrificial material from the field plate trenches.

FIG. 24B is a schematic vertical cross-sectional view of the semiconductor substrate portion of FIG. 24A along line B-B along horizontal longitudinal axes of the field plate trenches.

FIG. 26A is a schematic plan view of the semiconductor substrate portion of FIG. 25A, after removing the second sacrificial material from the gate trenches and after forming a gate shielding dielectric.

FIG. 26B is a schematic vertical cross-sectional view of the semiconductor substrate portion of FIG. 26A along line B-B along horizontal longitudinal axes of the field plate structures.

FIG. 28A is a schematic plan view of the semiconductor substrate portion of FIG. 27A, after forming source contact trenches.

FIG. 28B is a schematic vertical cross-sectional view of the semiconductor substrate portion of FIG. 28A along line B-B through a source contact trench and orthogonal to a horizontal longitudinal axis of the source region.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
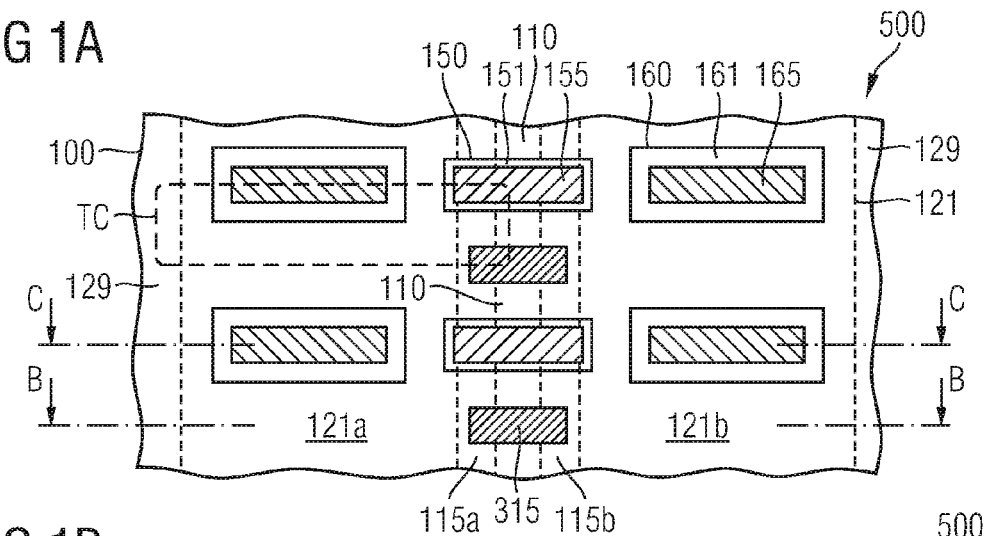
FIG. 1A is a schematic horizontal cross-sectional view of a portion of a semiconductor device according to embodiments referring to a vertical pn junction between a body region and a drift region and with a gate shielding structure between gate structures and a backplate electrode.
Figure 1B:
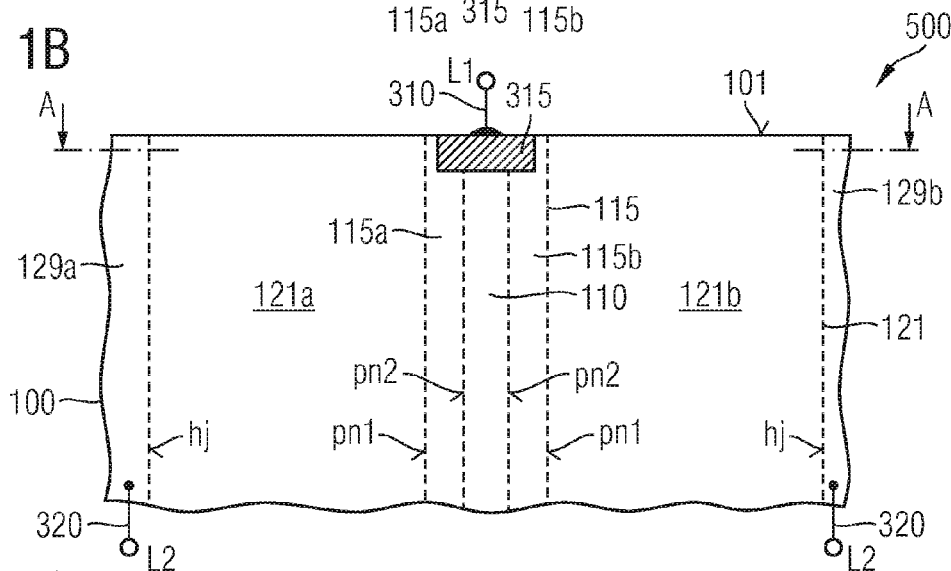
FIG. 1B is a schematic vertical cross-sectional view of the semiconductor device portion of FIG. 1A along line B-B through a contact structure.
Figure 1C:
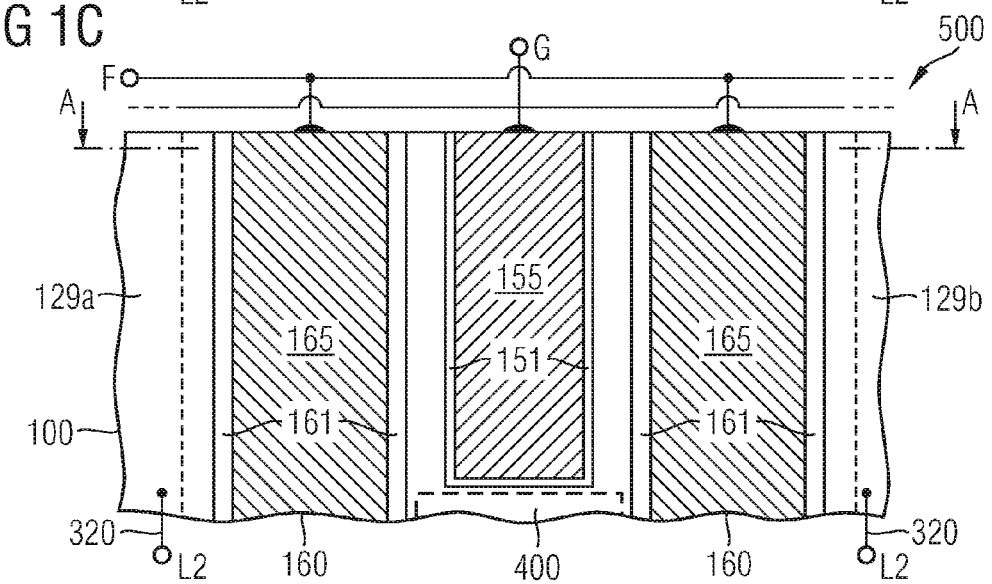
FIG. 1C is a schematic vertical cross-sectional view of the semiconductor device portion of FIG. 1A along line C-C through gate and field plate structures.

FIGS. 1A to 1C refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT (insulated gate bipolar transistor) or an MCD (MOS controlled diode).

The semiconductor device 500 includes a semiconductor portion 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

FIG. 1A is a plan view of a first surface 101 at a front side of the semiconductor portion 100, wherein the first surface 101 may be approximately planar or may be defined by a plane spanned by coplanar surface sections. A planar second surface 102 on the back of the semiconductor portion 100 is parallel to the first surface 101. A distance between the first and second surfaces 101, 102 may be at least 40 μm, e.g., greater than 175 μm. According to other embodiments, the distance may be in the range of several hundred μm. A lateral outer surface tilted to the first and second surfaces 101, 102 connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

A drift region 121 of a first conductivity type extends from the first surface 101 into the semiconductor portion 100. A vertical extension of the drift region 121 may be in a range from 20 μm to 2 mm, for example in a range from 20 μm to 200 μm for a blocking voltage capability of at least 100 V. A horizontal cross-sectional area of the drift region 121 may be a rectangle with a horizontal longitudinal axis and a horizontal short axis. A length of the drift region 121 along the horizontal longitudinal axis may be in a range from 20 μm to 1 mm, for example from 300 μm to 800 μm. A width of the drift region 121 along the horizontal short axis may be in a range from 100 nm to 200 μm, for example from 2 μm to 50 μm.

In the drift region 121, a net dopant concentration may be approximately uniform along the vertical axis and along the horizontal longitudinal axis. Along the horizontal short axis, the net dopant concentration may be uniform or may gradually or in steps increase or decrease with increasing distance to a longitudinal center plane. A mean net dopant concentration in the drift region 121 may be in a range from $1E13$ $cm^{-3}$ to $1E17$ $cm^{-3}$, e.g., from $5E15$ $cm^{-3}$ to $5E16$ $cm^{-3}$.

A body region 115 of a second conductivity type complementary to the first conductivity type may extend from the first surface 101 into the drift region 121. A width of the body region 115 is smaller than a width of the drift region 121 and a horizontal longitudinal center axis of the body region 115 may coincide with a horizontal longitudinal center axis of the drift region 121 such that the body region 115 is formed between two symmetric portions 121a, 121b of the drift region 121. The body region 115 forms a first pn junction pn1 with the drift region 121. The first pn junction pn1 includes sections that run vertical or approximately vertical with respect to the first surface 101. A longitudinal extension of the body region 115 in the horizontal plane may be smaller than a longitudinal extension of the drift region 121 such that the drift region 121 surrounds the body region 115 in the horizontal plane.

A total width between two neighboring vertical first pn junctions pn1 of the body regions 115 may be in a range from 1 μm to 15 μm. A vertical extension of the body region 115 may be equal to or smaller than the vertical extension of the drift region 121. A net dopant concentration in the body region 115 may be approximately uniform and may be in a range from $1E16$ $cm^{-3}$ to $1E18$ $cm^{-3}$. The body region 115 may include a higher doped body contact region with a dopant concentration of, e.g., at least $5E17$ $cm^{-3}$.

A source region 110 of the first conductivity type extends from the first surface 101 into the body region 115. A vertical extension of the source region 110 may be equal to or smaller than the vertical extension of the body region 115. A width of the source region 110 is smaller than a width of the body region 115. A horizontal longitudinal center axis of the source region 110 may coincide with the horizontal longitudinal center axis of the body region 115 such that the source region 110 separates two symmetric portions 115a, 115b of the body region 115. A longitudinal extension of the source region 110 in the horizontal plane may be smaller than the longitudinal extension of the body region 115, such that the body region 115 may surround the source region 110 in the horizontal plane. A net dopant concentration in the source region 110 may be in a range from $1E19$ $cm^{-3}$ to $1E20$ $cm^{-3}$ and may be uniform or may have a Gaussian distribution with the center of the Gaussian distribution at the longitudinal center axis.

The source region 110 forms a second pn junction pn2 with the body region 115. The second pn junction pn2 includes sections that are vertical or approximately vertical.

A drain structure 129 includes collection portions 129a, 129b formed at opposite sides of the drift region 121. The drain structure 129 may exclusively include the collection portions 129a, 129b on opposite sides of the intermediate drift region 121 or may include, in addition to the collection portions 129a, 129b, a horizontal base portion in the vertical projection of the drift region 121 between the drift region 121 and the second surface 102. For IGFETs and MCDs, the drain structure 129 may have the first conductivity type and may form unipolar homojunctions hj, which include vertical sections, with the drift region 121. For IGBTs, the drain structure 129 may have the second conductivity type and may form third pn junctions, which include vertical sections, with the drift region 121.

Gate structures 150 extend from the first surface 101 at least into the body regions 115. Horizontal transverse center axes of the gate structures 150 may coincide with the horizontal longitudinal center axes of the source and body regions 110, 115. For example, pairs of separated gate structures 150 may be formed symmetrically with respect to the horizontal longitudinal center axis of the source region 110, wherein the two gate structures 150 may to some degree overlap with the source region 110. According to the illustrated embodiment, one single gate structure 150 extends into both symmetric portions 115a, 115b of the body region 115 and into the intermediate portion of the source region 110.

A vertical extension of the gate structure 150 may be in a range from 100 nm to 1 mm, for example in a range from 1 μm to 500 μm. A width of a gate structure 150 along the horizontal longitudinal axis of the source region 110 may be at least 100 nm, for example at least 300 nm and at most 5 μm, e.g., at most 3 μm. A vertical extension of the gate structures 150 may be equal to, smaller than or greater than the vertical extension of the body regions 115. A center-to-center distance between neighboring gate structures 150 along the horizontal longitudinal center axis of the source region 110 may be in a range from 0.2 μm to 10 μm, e.g., from 0.5 μm to 5 μm. According to an embodiment, portions of the body regions 115 sandwiched between neighboring gate structures 150 are not fully depleted under the operation conditions the semiconductor device 500 is specified for.

The gate structures 150 include a conductive gate electrode 155, which includes or consists of a heavily doped polycrystalline silicon layer and/or a metal-containing layer. The gate electrode 155 is insulated against the semiconductor portion 100, wherein a gate dielectric 151 separates the gate electrode 155 from at least the body region 115. The gate electrode 155 may be electrically connected or coupled to a gate terminal G of the semiconductor device 500 or to an output of an internal gate driver circuit integrated in the semiconductor device 500.

The gate dielectric 151 may include or consist of semiconductor oxide, for example thermally grown or deposited silicon oxide, semiconductor nitride, for example deposited or thermally grown silicon nitride, semiconductor oxynitride, for example silicon oxynitride, or any combination thereof.

Field plate structures 160 extend from the first surface 101 into the drift region 121. A vertical extension of the field plate structures 160 may be equal to or greater than the vertical extension of the gate structures 150.

A horizontal longitudinal extension of the field plate structures 160 perpendicular to the horizontal longitudinal axis of the source region 110 may in a range from 500 nm to 25 μm, for example in a range from 1 μm to 12 μm. A transverse extension of the field plate structures 160 parallel to the horizontal longitudinal axis of the source region 110 may be in a range from 100 nm to 5 μm, for example in a range from 300 nm to 3 μm. A center-to-center distance between neighboring field plate structures 160 along the horizontal longitudinal center axis of the source region 110 may be in a range from 0.2 μm to 10 μm, e.g., from 0.5 μm to 5 μm. The center-to-center distance between neighboring field plate structures 160 may be equal to or greater than the center-to-center distance between neighboring gate structures 150.

The field plate structures 160 may be arranged symmetrically with respect to the horizontal longitudinal center axis of the source region 110. Number and placement of the field plate structures 160 may correspond to the number and placement of the gate structures 150. For example, the number of gate structures 150 may be twice or four times the number of the field plate structures 160. The horizontal longitudinal axes of pairs of symmetric field plate structures 160 may coincide with the longitudinal axes of the intermediate gate structure 150 or may be shifted with respect to the longitudinal axes of the gate structures 150. According to other embodiments, the field plate structures 160 are not aligned to the gate structures 150.

The field plate structures 160 may be separated from the gate structures 150 and portions of the drift region 121 may separate the gate structures 150 from the field plate structures 160, respectively. According to other embodiments, the field plate structures 160 may directly adjoin to the gate structures 150.

The field plate structures 160 may have approximately vertical sidewalls or may slightly taper at an angle of, e.g., 89° with respect to the first surface 101. Sidewalls of the field plate structures 160 may be straight or slightly bulgy. The field plate structures 160 include a conductive field electrode 165 and a field dielectric 161 surrounding the field electrode 165, respectively.

The field electrode 165 includes or consists of a heavily doped polycrystalline silicon layer and/or a metal containing layer and is electrically separated from the gate electrode 155. Instead, the field electrode 165 may be electrically connected to a field electrode terminal F, to a load terminal through which a load current flows, or to an internal network node of the semiconductor device 500, e.g., to a network node of a voltage divider circuit or to an output of an internal driver circuit.

The field dielectric 161 separates the field electrode 165 from the surrounding semiconductor material of the semiconductor portion 100 and may include or consist of a thermally grown silicon oxide layer, a deposited silicon oxide layer, e.g., a silicon oxide formed by using TEOS (tetraethylorthosilicate) as precursor material, a gap filled with a gas or vacuum, or any combination thereof.

Contact structures 315 directly adjoin to both the source and body regions 110, 115. The contact structures 315 may directly adjoin to the first surface 101 or may extend into the semiconductor portion 100. The contact structures 315 may include two or more liners of conductive material and further includes a fill layer, wherein at least one of the liners contains a metal. For example, the contact structures 315 include a barrier liner containing at least one of titanium (Ti) tantalum (Ta), tungsten (W), tungsten titanium (TiW) and a metal nitride, for example tantalum nitride (TaN) or titanium nitride (TiN). The fill layer may contain tungsten (W), which may be deposited by sputtering or by CVD (chemical vapor deposition.).

The contact structures 315 may alternate with the gate structures 150 along the horizontal longitudinal center axis of the source region 110 and are electrically connected or coupled to a first load terminal L1. An electric connection between the source region 110 and the first load terminal L1 may include a front side electrode 310 formed at the front side of the semiconductor device 500.

A drain structure 129 includes collection portions 129a, 129b on opposite sides of the drift region 121 as well as a base portion 129z connecting the collection portions 129a, 129b and directly adjoining to the second surface 102. The drain structure 129 is electrically connected to a second load terminal L2. An electric connection between the drain structure 129 and the second load terminal L2 may include a backplate electrode 320 formed directly on the second surface 102. A load current between the first load terminal L1 and the second load terminal L2 basically flows in a vertical direction through the semiconductor portion 100 from the first surface 101 to the second surface 101 or vice versa, wherein in the drift zone 121 the load current flows along the horizontal direction.

The following description refers to transistor cells TC of the enhancement type and forming n-channel IGFET cells, wherein the source region 110 and the drift region 121 are n-conductive and the body region 115 is p-conductive. Similar considerations apply to embodiments with p-channel IGFET cells with p-conductive source and drain regions 110, 121 and n-conductive body region 115.

When in absence of a gate voltage the first pn junction pn1 is reversed biased, the transistor cells TC block. When a sufficiently high gate voltage is applied to the gate electrode 155, an inversion layer of minority charge carriers of the body region 115 forms a conductive channel along the gate dielectric 151. The conductive channel by-passes the first pn junction pn1 for minority charge carriers such that a unipolar load current can flow between the source region 110 and the drain structure 129 in a horizontal (lateral) direction parallel to the horizontal plane.

Since the vertical extension of the gate structure 150 defines a channel width, the channel width can be increased without increasing to the same degree a horizontal chip area. By extending the vertical extensions of the drift region 121, the field plate structures 160, and the gate structures 150, the total drift volume can be increased without increasing to the same degree the horizontal chip area. By increasing both the total channel width and the total drift zone volume, the on state resistance of the semiconductor device 500 can be significantly reduced without that the horizontal chip area is increased.

Since in the blocking mode the field plate structures 160 deplete an intermediate portion of the drift region 121, the dopant concentration in the drift region 121 can be increased without adverse impact on the blocking capability. The increased dbpant concentration in the drift region 121 decreases the on-state resistance RDSon of the transistor cells TC. Since the vertical extension of the field plate structures 160 defines the depletable semiconductor volume, the doping level can be kept high over the full vertical extension of the field plate structure 160 and the on state resistance is further reduced compared to conventional vertical cell concepts. A gate shielding structure 400 in a vertical projection of the gate structures 150 between the gate structures 150 and the second surface 102 reduces a capacitive coupling between the backplate electrode 320 and the gate electrode 155, decreases the gate-to-drain capacity, facilitates higher switching frequencies and reduces switching losses.

The gate shielding structure 400 may be a dielectric structure, for example a dielectric separation layer which extends on both sides of the horizontal transverse center axis of the gate structure 150 to below or beyond the field plate structures 160. According to other embodiments, the gate shielding structure 400 may be a gate shielding dielectric exclusively formed in the vertical projection of the gate electrode 155. Alternatively or in addition, two symmetrically arranged field plate structures 160 and a portion of the drift region 121 extending between the two symmetrically arranged field plate structures 160 may form the gate shielding structure 400, wherein the electric field extending from the field plate structures 160 reduces the electric field strength effective between the backplate electrode 320 and the gate electrode 155. Alternatively or in addition, the gate shielding structure 400 may include counter-doped zones or a zone of reduced net dopant concentration in the vertical projection of the gate structures 150.

Figure 2A:
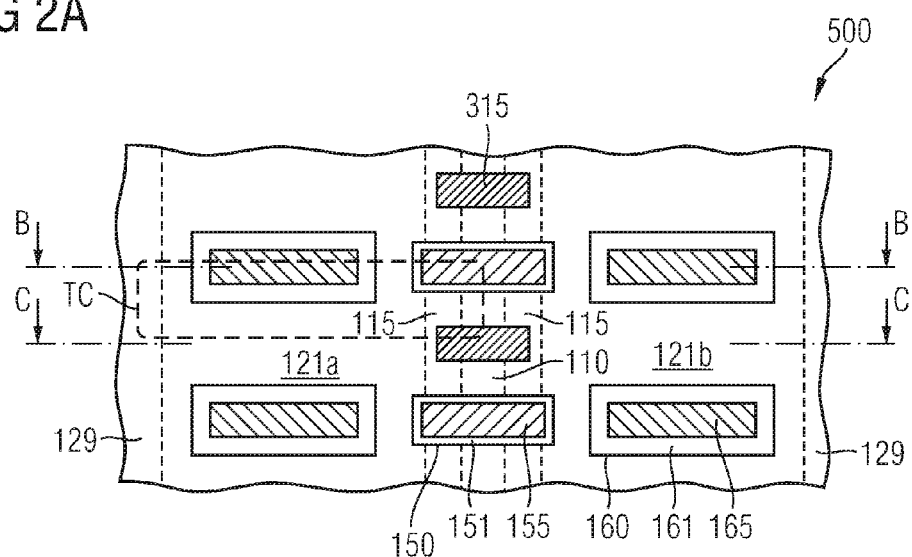
FIG. 2A is a schematic cross-sectional view of a portion of a semiconductor device according to an embodiment including a dielectric separation layer between a drift region and a backplate electrode.
Figure 2B:
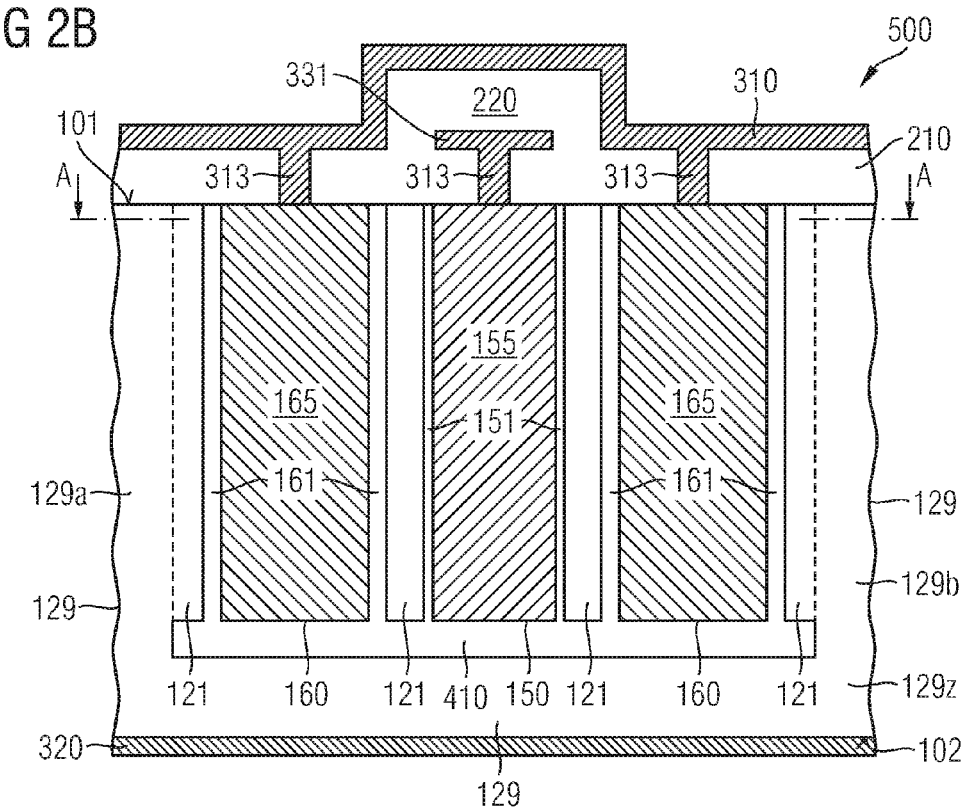
FIG. 2B is a schematic vertical cross-sectional view of the semiconductor device portion of FIG. 2A along line B-B through a contact structure.
Figure 2C:
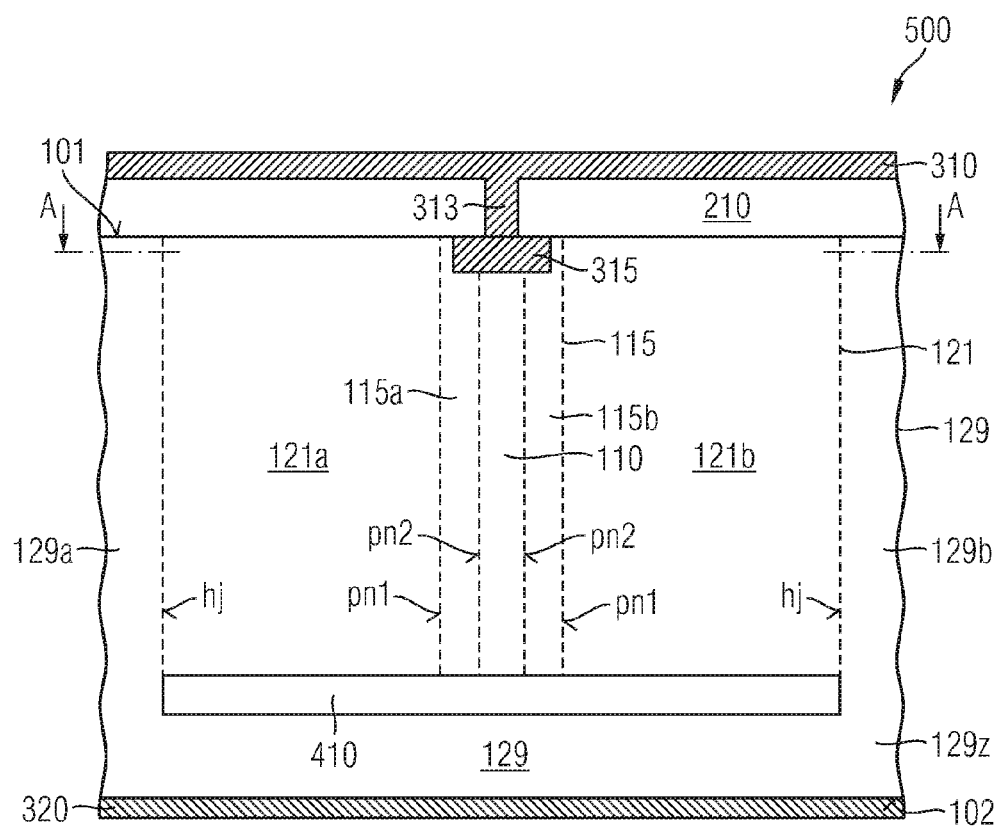
FIG. 2C is a schematic vertical cross-sectional view of the semiconductor device portion of FIG. 2A along line C-C through gate and field plate structures.

FIGS. 2A to 2C refer to an embodiment of a semiconductor device 500 with a dielectric separation layer 410 forming the gate shielding structure 400 of FIG. 1C.

The dielectric separation layer 410 may be, for example a semiconductor oxide layer, for example a silicon oxide layer. A vertical extension of the dielectric separation layer 410 may be a range from 100 nm to 2 μm, by way of example. The dielectric separation layer 410 may extend across the complete longitudinal and transversal extension of the drift region 121. The field plate structures 160, the gate structures 150, the body region 115 and the source region 110 may extend from the first surface 101 to the dielectric separation layer 410. The dielectric separation layer 410 suppresses any vertical current flow from the drift region 121 to the second surface 102 such that designs for conventional vertical transistor cells can be easily adapted by rotation by 90° with respect to the first surface 101.

An interlayer dielectric 210 on the first surface 101 may separate a front side electrode 310 from the gate electrode 155. Through-vias 313 extending through the interlayer dielectric 210 may electrically connect the front side electrode 310 with the field electrodes 165 and the contact structures 315, as well as a gate wiring line 331 with the gate electrodes 155. An auxiliary dielectric layer 220 may electrically separate the front side electrode 310 from the gate wiring line 331.

Figure 3A:
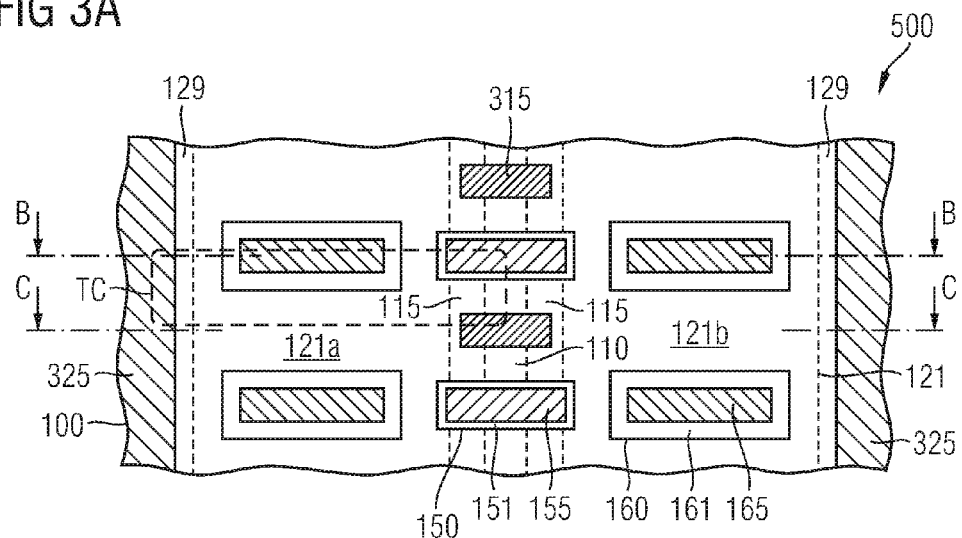
FIG. 3A is a schematic horizontal cross-sectional view of a portion of a semiconductor device according to an embodiment including vertical metal drain conductors.
Figure 3B:
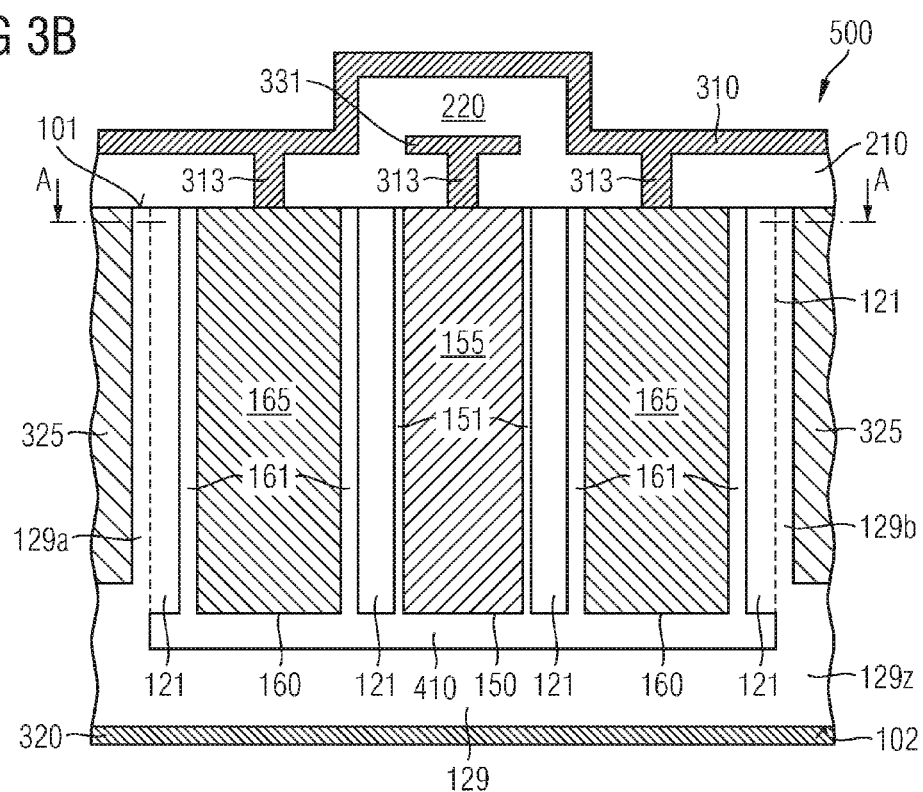
FIG. 3B is a schematic vertical cross-sectional view of the semiconductor device portion of FIG. 3A along line P-P through a contact structure.

FIGS. 3A to 3C show metal drain conductors 325 extending from the first surface 101 into the semiconductor portion 100 and forming vertical interfaces with the collection portions 129a, 129b of the drain structure 129. A vertical extension of the metal drain conductors 325 may be equal to or greater than a vertical extension of the source region 110. According to an embodiment, the vertical extension of the metal drain conductors 325 is equal to or greater than a vertical extension of the drift region 121.

The metal drain conductors 325 may include two or more conductive liners, for example a barrier liner based on TiN, TaN, Ti, Ta, or WTi as well as a fill layer, which may be based on sputtered W or W deposited by CVD. One single pair of metal drain conductors 325 may extend along opposite sides of the drift region 121 parallel to the horizontal longitudinal center axis of the source region 110. According to other embodiments, two rows of separated metal drain conductors may extend along opposite sides of the drift region 121 parallel to the horizontal longitudinal center axis of the source region 110.

A vertical extension of the contact structure 315 may correspond to a vertical extension of the metal drain conductor 325. The contact structures 315 in combination with the metal drain conductor 325 reduce the connection resistance between the front side electrode 310 and the source region 110 as well as between the collection portions 129a, 129b of the drain structure 129 and the backplate electrode 320.

Figure 4A:
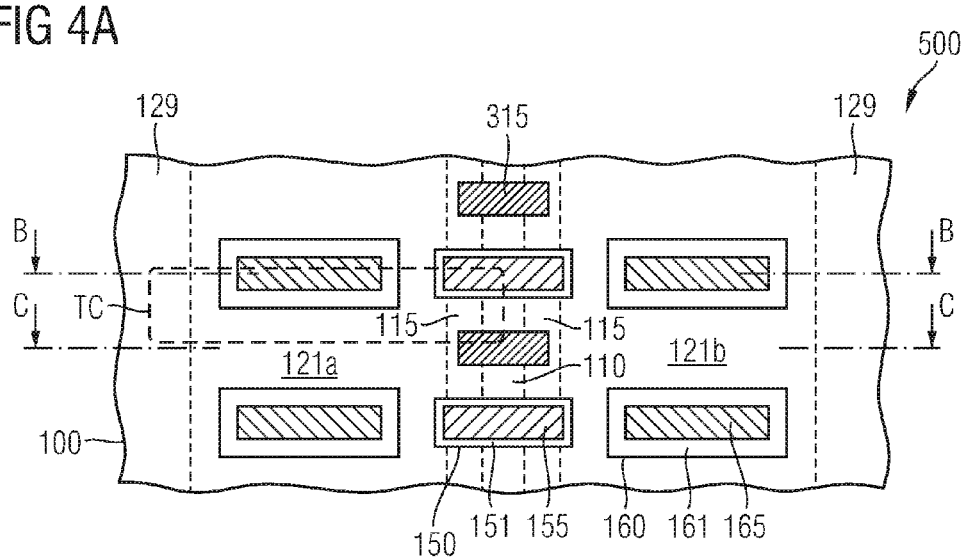
FIG. 4A is a schematic horizontal cross-sectional view of a portion of a semiconductor device according to an embodiment including a horizontal homojunction between a drift region and a base portion of a drain structure.
Figure 4B:
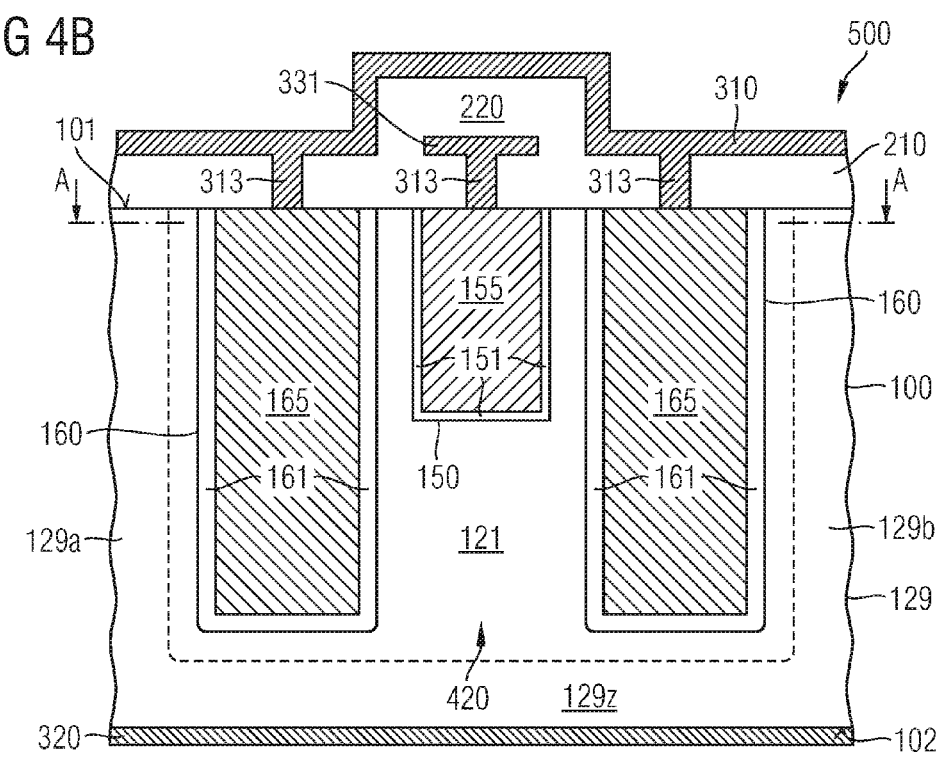
FIG. 4B is a schematic vertical cross-sectional view of the semiconductor device portion of FIG. 4A along line B-B through a contact structure.
Figure 4C:
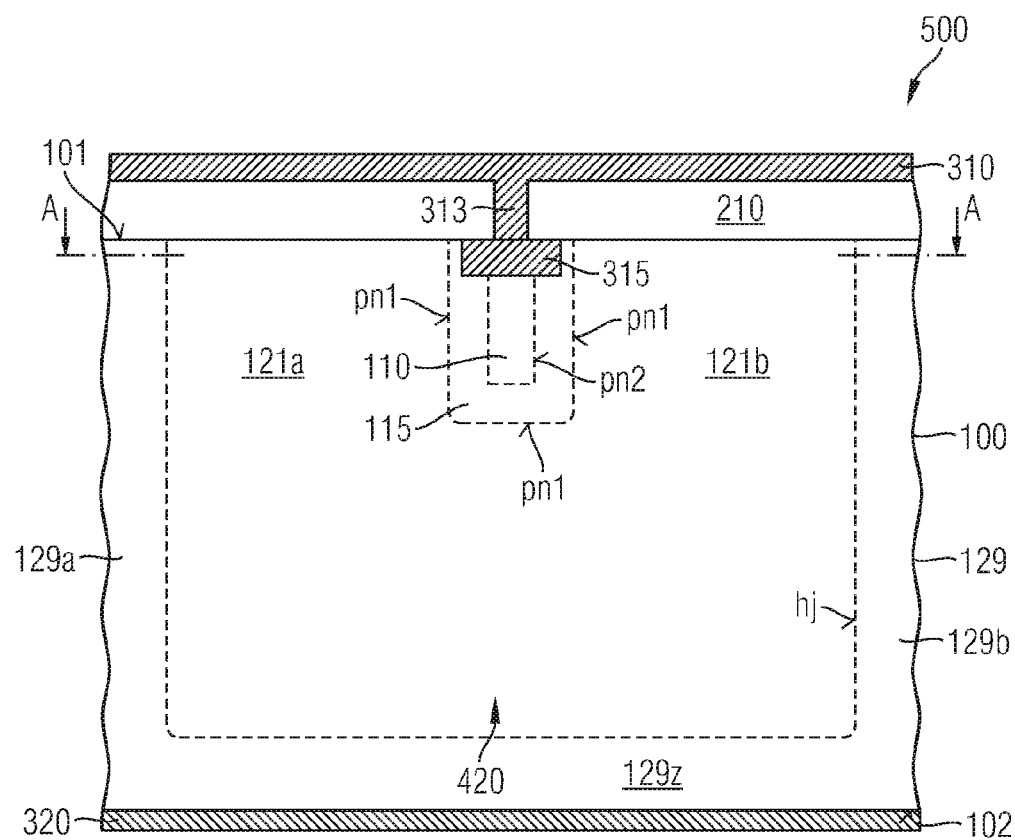
FIG. 4C is a schematic vertical cross-sectional view of the semiconductor device portion of FIG. 4A along line C-C through gate and field plate structures.

In FIGS. 4A to 4C, the unipolar homojunction hj between the drift region 121 and the drain structure 129 includes two vertical sections along the collection portions 129a, 129b and a horizontal section parallel to the second surface 102 along the base portion 129z of the drain structure 129 such that both the vertical collection portions 129a, 129b and the horizontal base portion 129z directly adjoin to the drift region 121.

The vertical extension of the field plate structures 160 is significantly greater than the vertical extension of the gate structure 150. For example, the vertical extension of the field plate structures 160 is at least 50% or at least 100% greater than the vertical extension of the gate structures 150. A portion of the drift region 121 between the gate structure 150 and the horizontal base portion 129z of the drain structure 129 is at least partially compensated by portions of the field plate structure 160 extending deeper into the semiconductor portion 100 than the gate structures 150. An electric field extending from the field plate structures 160 shapes the electric field in the intermediate portion of the drift region 121 between the gate structure 150 and the base portion 129z of the drain structure 129 in a way that the gate structure 150 is shielded against a potential applied to the backplate electrode 320 such that a field shielding structure 420 that includes the portion of the field plate structures 160 protruding from a bottom edge of the gate structures 150 and the portion of the drift region 121 between the protruding portions of the field plate structures 160 is effective as the gate shielding structure 400 of FIG. 1C.

As illustrated in FIG. 4C the vertical extensions of the body region 115 and the source region 110 may be smaller than the vertical extension of the gate structure 150 such that a load current through the semiconductor portion 100 includes, in addition to two symmetric horizontal components through the drift region 121, a vertical component through the portion of the drift region 121 between the gate structure 150 and the horizontal base portion 129z of the drain structure 129.

Figure 5A:
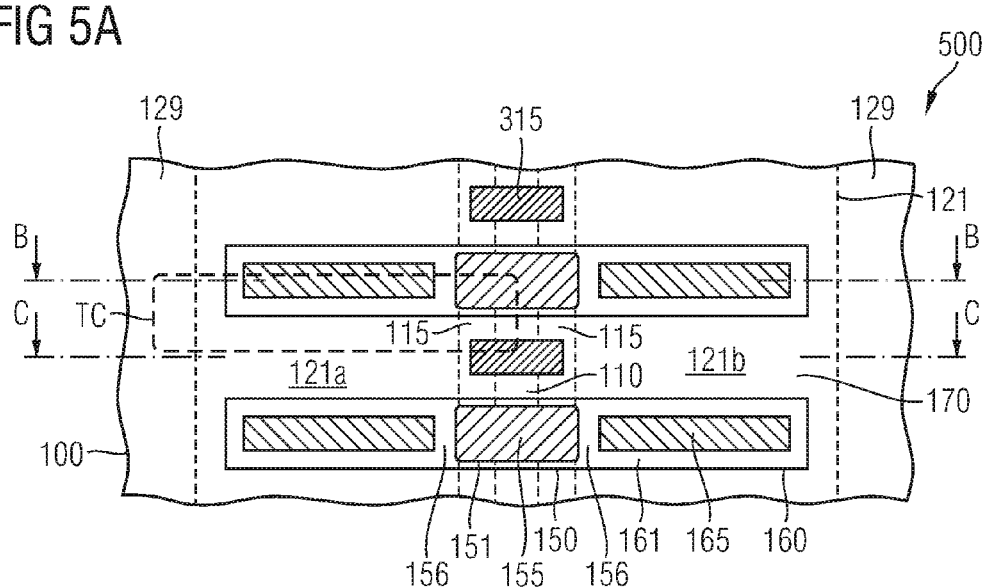
FIG. 5A is a schematic horizontal cross-sectional view of a portion of a semiconductor device according to an embodiment including an U-shaped field plate structure and a gate structure formed between the legs of the U-shaped field plate structure.
Figure 5B:
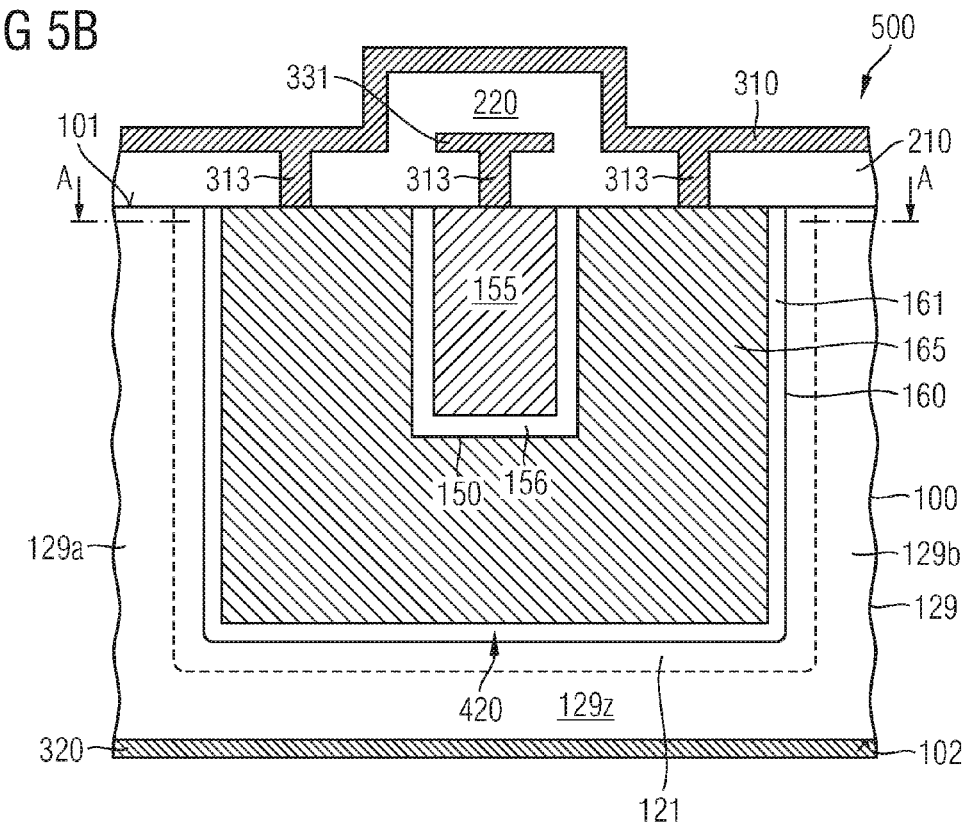
FIG. 5B is a schematic vertical cross-sectional view of the semiconductor device portion of FIG. 5A along line B-B through a contact structure.
Figure 5C:
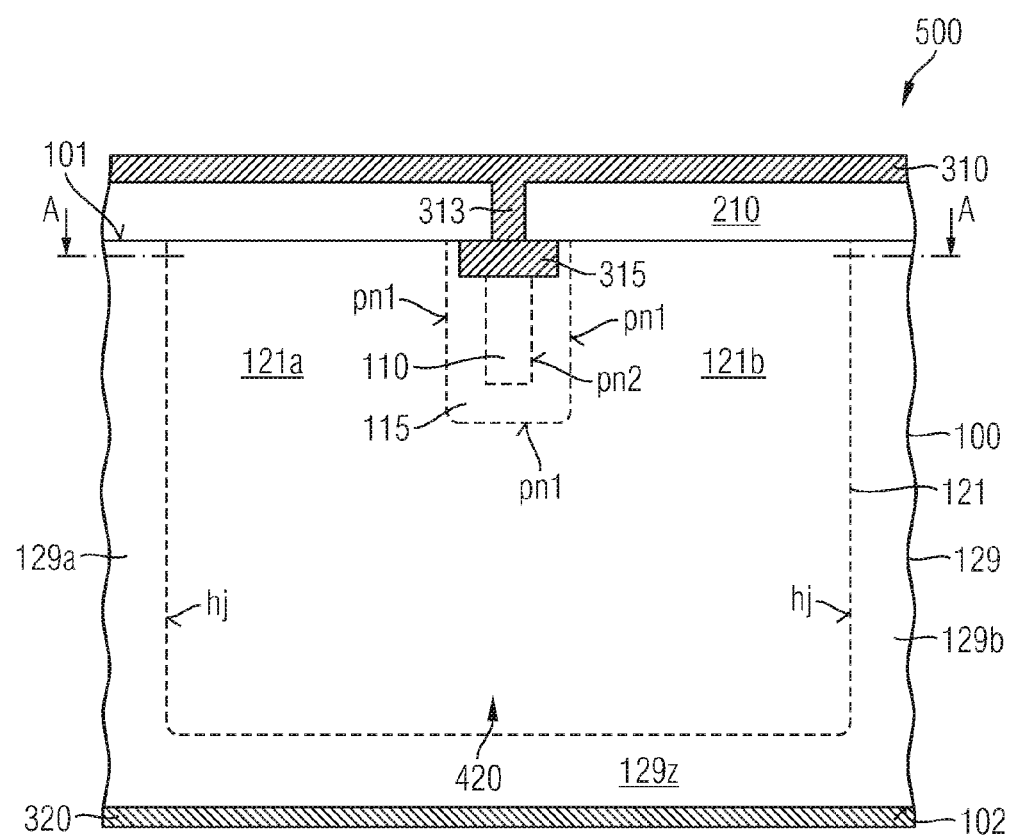
FIG. 5C is a schematic vertical cross-sectional view of the semiconductor device portion of FIG. 5A along line C-C through gate and field plate structures.

FIGS. 5A to 5C refer to combined field plate/gate structures with the field plate structure 160 having a U-shaped vertical cross-sectional area along the horizontal longitudinal axis. The gate structures 150 may fill the spaces between the legs of the U-shaped field plate structures 160. The gate dielectric 151 is formed along vertical interfaces between the gate electrode 155 and mesa portions 170 of the semiconductor portion 100 between neighboring pairs of combined field plate/gate structures. A separation dielectric 156 separates the gate electrode 155 from the field electrode 165 along a horizontal longitudinal axis of the combined field plate/gate structures and along the vertical direction.

According to FIG. 5C the vertical extension of the body region 115 is smaller than the vertical extension of the gate electrode 155 and the vertical extension of the source region 110 is smaller than the vertical extension of the body region 115 such that a load current through the drift region 121 includes two symmetric horizontal portions and a vertical portion. A field shielding structure 420 includes the portion of the field plate structure 160 in the vertical projection of the gate structure 150 between the gate structure 150 and the horizontal base portion 129z of the drain structure 129 and shields the gate structure 150 against the horizontal base portion 129z in a similar way as the portions of the field plate structure 160 on opposite sides of the gate structure 150 shield the gate electrode 155 against the vertical collection portions 129a, 129b of the drain structure 129 and is effective as the gate shielding structure 400 of FIG. 1C.

Figure 6A:
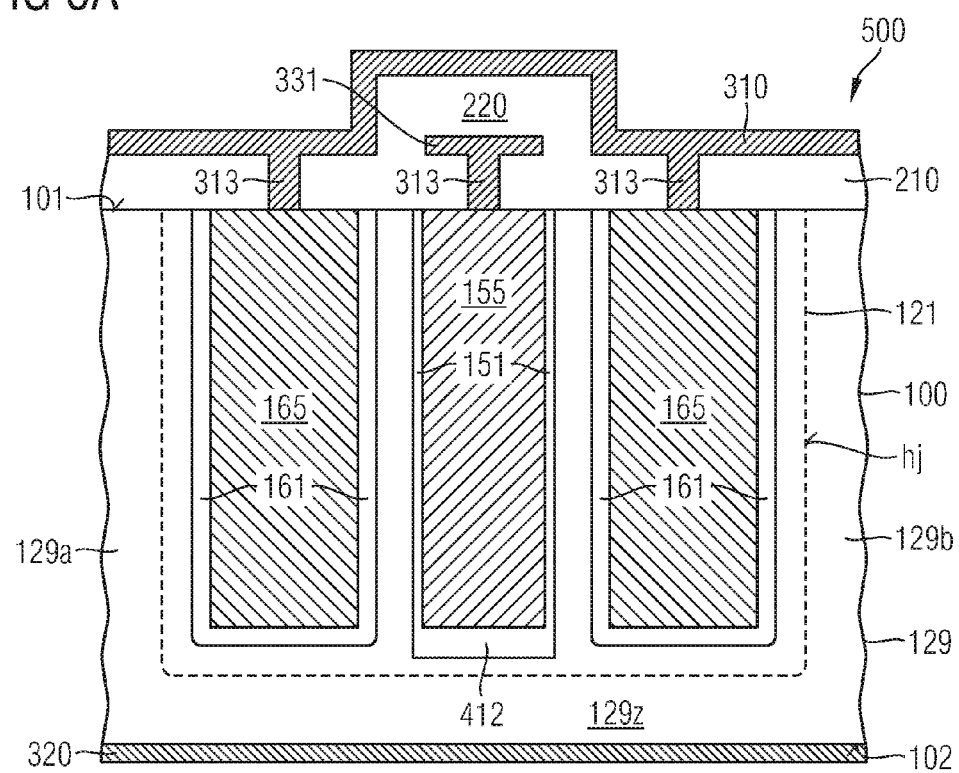
FIG. 6A is a schematic vertical cross-sectional view of a portion of a semiconductor device according to an embodiment including a gate shielding dielectric.

FIG. 6A shows a vertical cross-section along a horizontal longitudinal center line of symmetrically arranged field plate structures 160 according to an embodiment with a gate shielding dielectric 412 formed in the vertical projection of the gate electrode 155 between the gate electrode 155 and the horizontal base portion 129z of the drain structure 129.

The gate shielding dielectric 412 may directly adjoin to the gate electrode 155 and may be significantly thicker than the gate dielectric 151. For example, a thickness of the gate shielding dielectric 412 may be in a range from 100 nm to 1 µm.

The gate shielding dielectric 412 may include a thermally grown layer, one or more deposited layers or any combination thereof. For example, the gate shielding dielectric 412 includes a silicon oxide layer, e.g., a TEOS-oxide, a silicon nitride layer, a silicon oxynitride layer, a silicate glass or any combination thereof. The gate shielding dielectric 412 shields the gate electrode 155 against a potential applied to the backplate electrode 320 and is effective as the gate shielding structure 400 of FIG. 1C.

A vertical extension of the gate structure 150 may differ from a vertical extension of the field plate structures 160 by less than 30%, for example by less than 10%. According to other embodiments, the gate shielding dielectric 412 may be combined with embodiments based on FIGS. 4A to 4C.

Figure 6B:
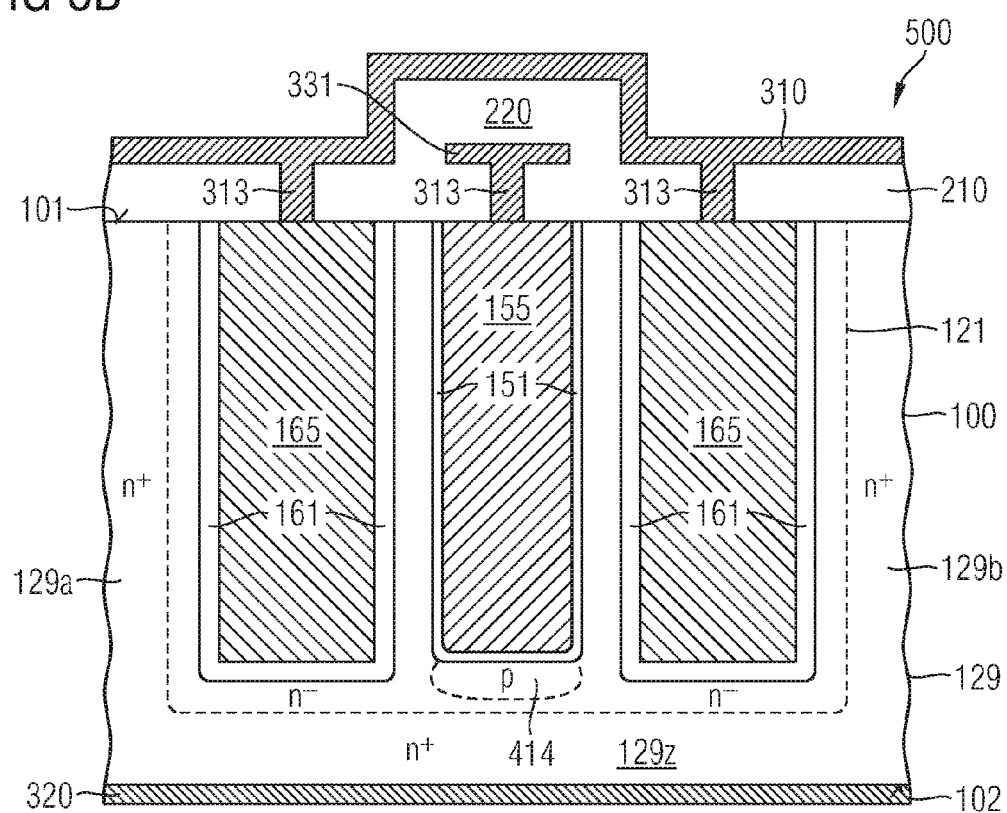
FIG. 6B is a schematic vertical cross-sectional view of a portion of a semiconductor device according to an embodiment including a gate shielding zone.

In FIG. 6B a gate shielding zone 414 in the vertical projection of the gate structure 150 between the gate structure 150 and the base portion 129z of the drain structure 129 at least partially reduces the electric field between the backplate electrode 320 and the gate structure 150. The gate shielding zone 414 may have the opposite conductivity type of the drift region 121. According to other embodiments, a counter implant may locally decrease the net dopant concentration in the gate shielding zone 414 without changing the conductivity type of the drift region 121. The gate shielding zone 414 may directly adjoin to the gate structure 150 or may be separated from the gate structure 150 in the vertical direction. The gate shielding zone 414 may be combined with the gate shielding dielectric 412 as illustrated in FIG. 6A.

Figure 7:
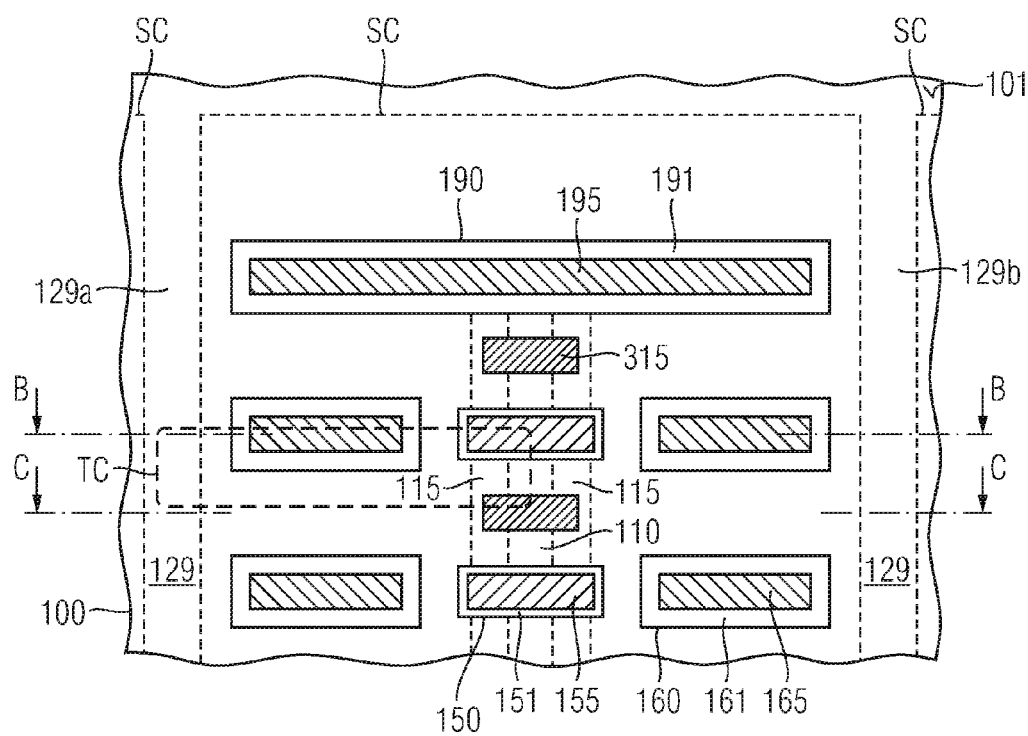
FIG. 7 is a schematic horizontal cross-sectional view of a portion of a semiconductor device in accordance with an embodiment including a termination field plate structure.

FIG. 7 is a top view onto a first surface 101 of a semiconductor portion 100 in an end portion of a stripe cell SC including a plurality of identical transistor cells TC. In the horizontal plane, the drift region 121 may be a rectangle with a horizontal longitudinal axis and a horizontal transverse axis. The body region 115 is narrower and has a smaller longitudinal extension than the drift region 121 such that the drift region 121 completely surrounds the body region 115 in the horizontal plane. Longitudinal center axes of the drift region 121 and the body region 115 may coincide. The source region 110 is narrower than the body region 115 and a horizontal longitudinal extension of the source region 110 is smaller than the horizontal longitudinal extension of the body region 115 such that the body region 115 may completely surround the source region 110 in the horizontal plane. The horizontal longitudinal center axes of the body and drift regions 115, 121 may coincide with the horizontal longitudinal center axis of the source region 110. The semiconductor device 500 may include a plurality of stripe cells SC arranged parallel to each other, wherein collection portions 129a, 129b of drain structures 129 may separate the drift regions 121 of neighboring stripe cells SC.

A termination field plate structure 190 may be formed in an end portion of the stripe cell SC. A horizontal longitudinal axis of the termination field plate structure 190 may be parallel to horizontal longitudinal axes of the field plate structures 160. The termination field plate structure 190 may directly adjoin to an end face of the body region 115. One or more of the contact structures 315 may be arranged between the termination field plate structure 190 and a neighboring one of the gate structures 150 of the stripe cell SC. The termination field plate structure 190 shapes the electric field in the end portions of the stripe cell SC such that field crowding along a buried edge of the body region 115 along the end face is attenuated.

Figure 8:
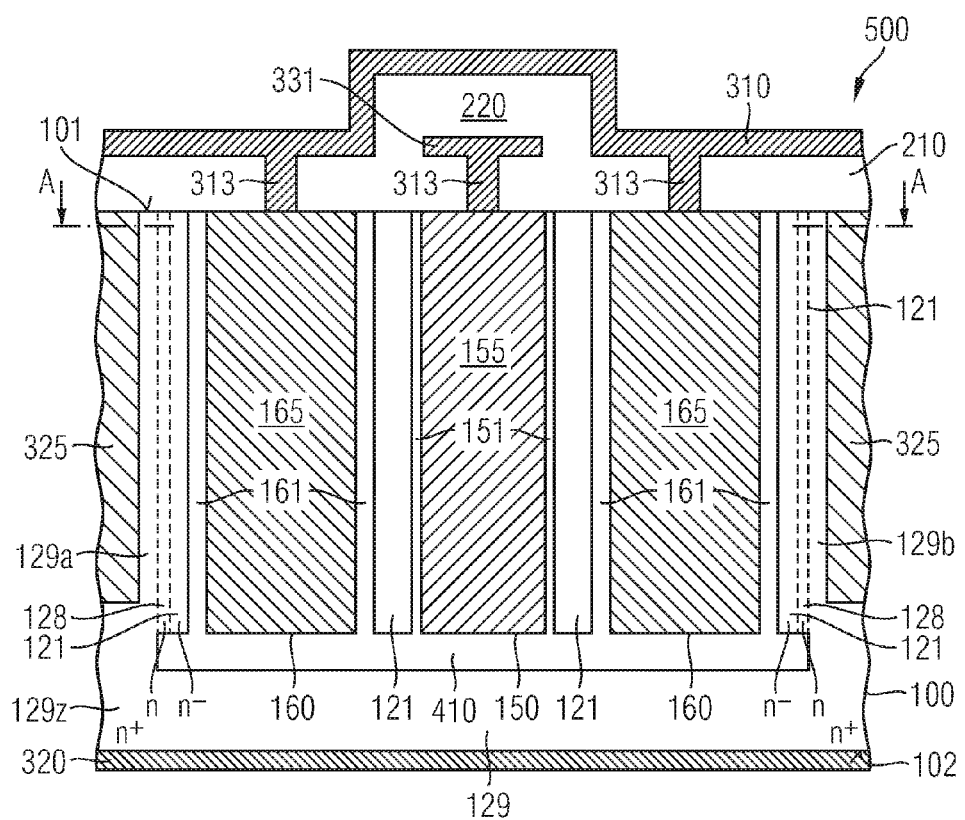
FIG. 8 is a schematic vertical cross-sectional view of a portion of a semiconductor device in accordance with an embodiment including a field stop region.

The semiconductor device of FIG. 8 includes a field stop region 128 forming vertical homojunctions with both the drift region 121 and the drain structure 129. A mean dopant concentration in the field stop region 128 is at least twice, e.g., at least five times or at least ten times as high as in the drift region 121, whereas a mean dopant concentration in the drain structure 129 is at least twice, e.g., at least five times or at least ten times as high as in the field stop region 128.

FIGS. 9A to 9D show details of embodiments including heavily $p^+$-type body contact zones 117 for low-ohmic connection of the body regions 115 to the potential applied to the source region 110 for improving latch-up ruggedness.

Figure 9A:
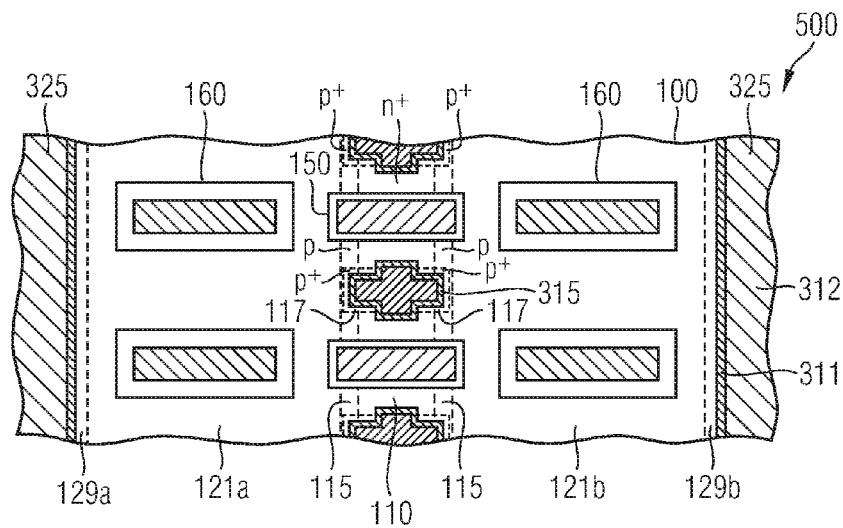
FIG. 9A is a schematic horizontal cross-sectional view of a portion of a semiconductor device according to an embodiment including cross-shaped contact structures directly adjoining to both source regions and body contact zones.

In FIG. 9A the contact structures 315 have a cross-shape in the horizontal plane. A first bar of the cross is formed by recessing a trench insulator 230 formed along the horizontal longitudinal center axis of the body region 115 and extending between pairs of neighboring gate structures 150, respectively. A second bar of the cross orthogonally intersects the first bar and may laterally extend into the body region 115. The body contact zones 117 are formed along the two opposite end faces of the second bar and may locally counterdope first portions of the source region 110. The first bar directly adjoins to not-counterdoped second portions of the source region 110 that directly adjoin to the neighboring gate structures 150.

Figure 9B:
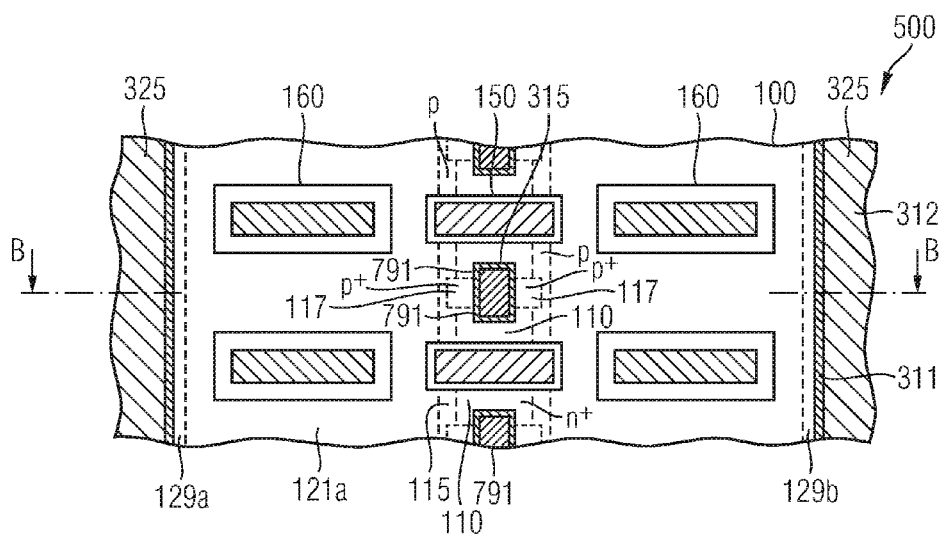
FIG. 9B is a schematic horizontal cross-sectional view of a portion of a semiconductor device according to another embodiment including rectangular contact structures directly adjoining to both source regions and body contact zones.

In FIG. 9B the contact structures 315 have a rectangular shape and source regions 110 separate the contact structures 315 from the gate structures 150. Along the horizontal longitudinal axis of the body region 115, body contact zones 117 are formed only along center portions of the contact structures 315. Outside of the center portions and around end faces of the contact structures 315 oriented to the gate structures 150, the contact structures 315 directly adjoin to the source regions 110.

Figure 9C:
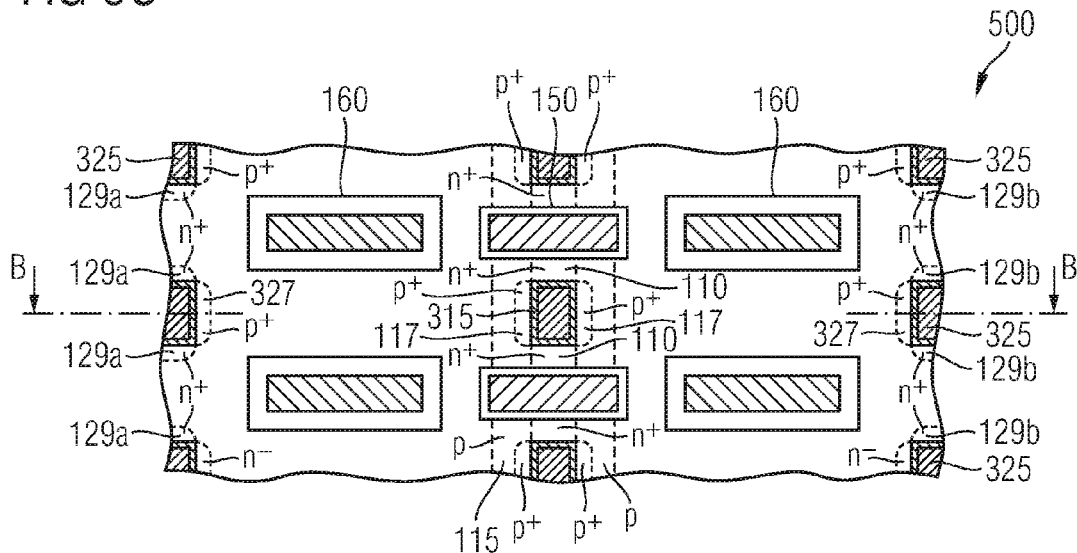
FIG. 9C is a schematic horizontal cross-sectional view of a portion of a semiconductor device according to an embodiment including rows of drain conductors.

According to the embodiment illustrated in FIG. 9C the contact structures 315 have a rectangular shape and source regions 110, which are formed from the side of the contact structures 315, separate the contact structures 315 from the gate structures 150. Body contact zones 117 are formed along opposite sides of the contact structures 315 and cross to the horizontal longitudinal axis of the body region 115.

Rows of metal drain conductors 325 are formed on sides of the field plate structures 160 opposite to the body region 115. Heavily doped $n^+$-type collection portions 129a, 129b of a drain structure 129 may be formed on opposite sides of the metal drain conductors 325 along the horizontal longitudinal axis of the body region 115. Heavily doped $p^+$-type zones 327 may be formed on opposite sides of the metal drain conductors 325 along the horizontal transverse axis of the body region 115.

Figure 9D:
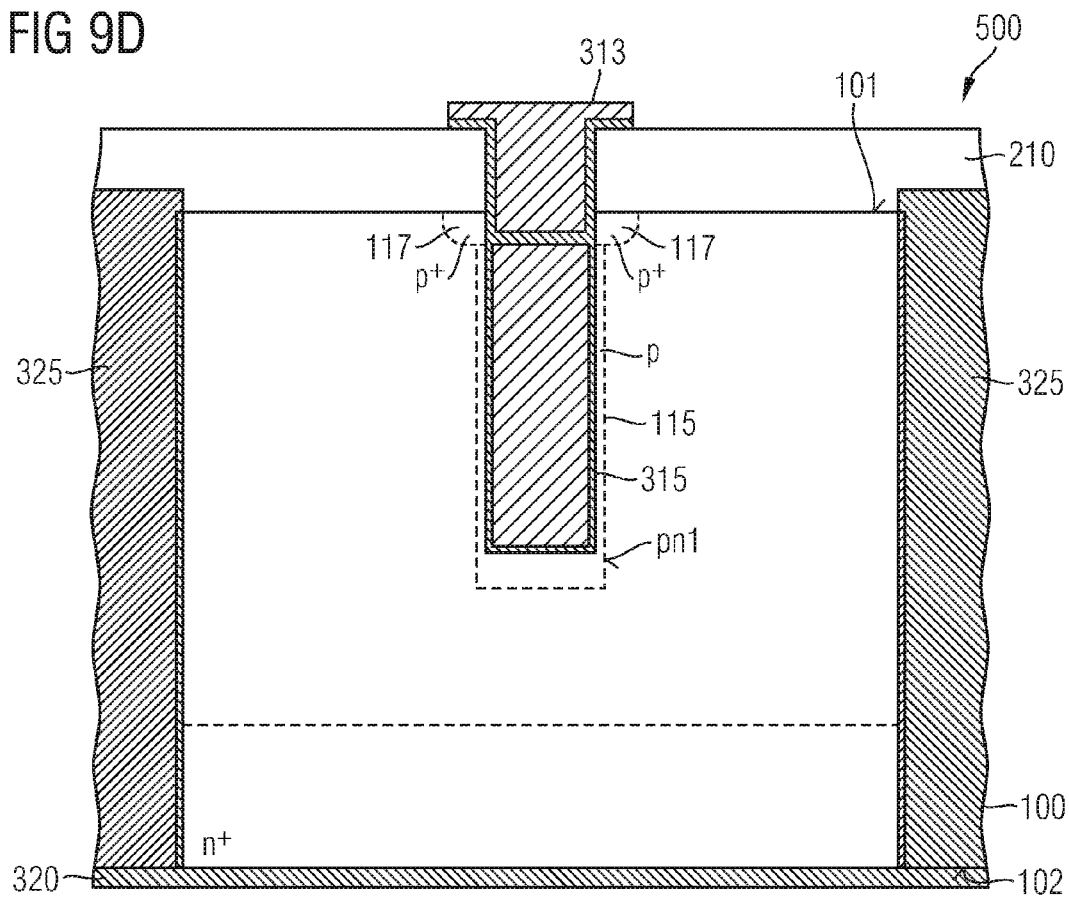
FIG. 9D is a schematic vertical cross-sectional view of a portion of a semiconductor device according to another embodiment including close-to-surface body contact zones.

FIG. 9D shows close-to-surface body contact zones 117 formed on opposite sides of a contact structure 315. The close-to-surface body contact zones 117 directly adjoin to the first surface 101 and to a through-via 313 extending through an interlayer dielectric 210 and filling a contact trench between a plane spanned by the first surface 101 and the contact structure 315. The body contact zones 117 may surround the through-vias 313 in a horizontal plane.

The metal drain conductors 325 may extend down to the second surface 102 and may directly adjoin the backplate electrode 320 such that the metal drain conductors 325 effectively convey thermal energy out from the semiconductor portion 100 to the backplate electrode 320, which may be part of a heat sink structure. Alternatively or in addition, the contact structures 315 may be connected to the front side electrode 310 as illustrated in FIG. 8, e.g., directly or through metal structures such as the through-vias 313 such that the contact structures 313 effectively convey thermal energy out from the semiconductor portion 100 to the front side electrode 310, which may be part of a heat sink structure. As part of a heat sink structure, the front side electrode 310 and/or the backplate electrode 320 may have a thickness of several ten micrometers, e.g., several hundred micrometers. Metal drain conductors 325 and/or contact structures 315 for cooling the semiconductor portion 100 may be combined with any of the previous and following embodiments.

Figure 10:
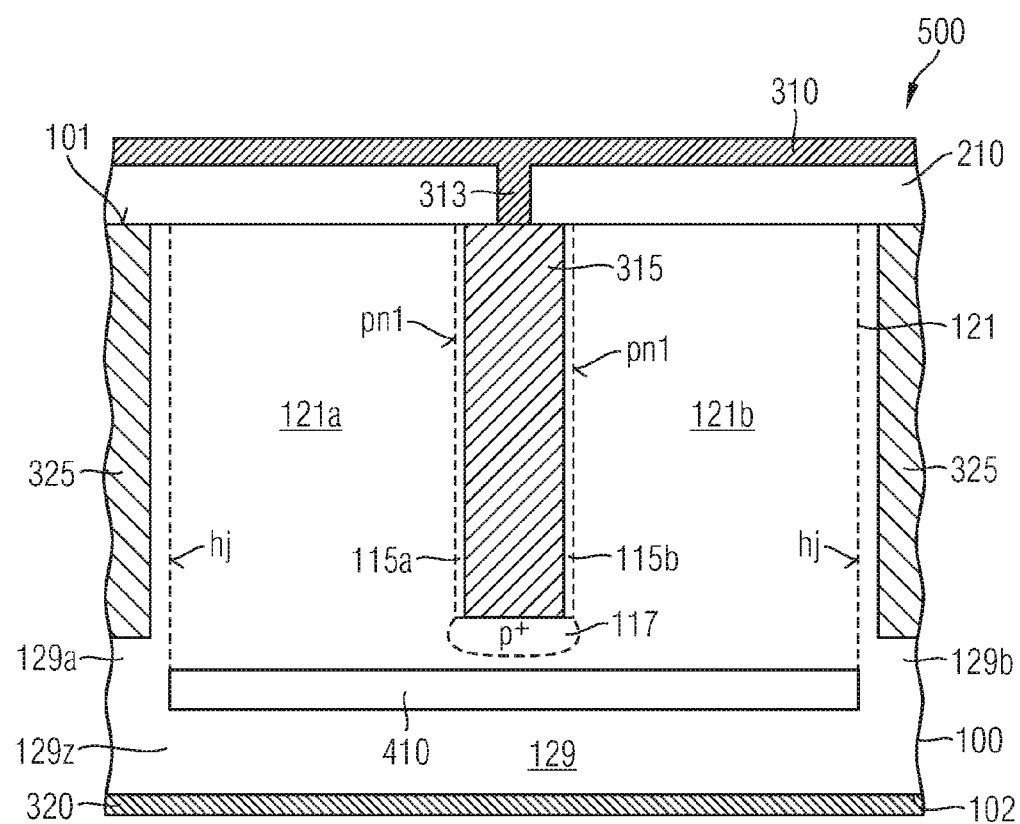
FIG. 10 is a schematic vertical cross-sectional view of a portion of a semiconductor device according to an embodiment including a body contact zone in a vertical projection of contact structures.

The semiconductor device 500 of FIG. 10 includes buried body contact zones 117 in the vertical projection of the contact structures 315 that electrically connect the front side electrode 310 with source regions, which directly adjoin to the contact structures 315 in a plane perpendicular to the cross-sectional plane and to the first surface 101. The buried body contact zones 117 may be formed by an implant through a bottom of a trench in which the contact structures 315 are formed after the implant forming the buried body contact zones 117.

FIGS. 11A to 17F illustrate a method of manufacturing a semiconductor device, wherein the method uses lateral epitaxial growth and provides deep field plate structures, deep gate structures, a predominantly lateral current flow through a drift region, and a gate shielding structure including a dielectric separation layer.

Figure 11A:
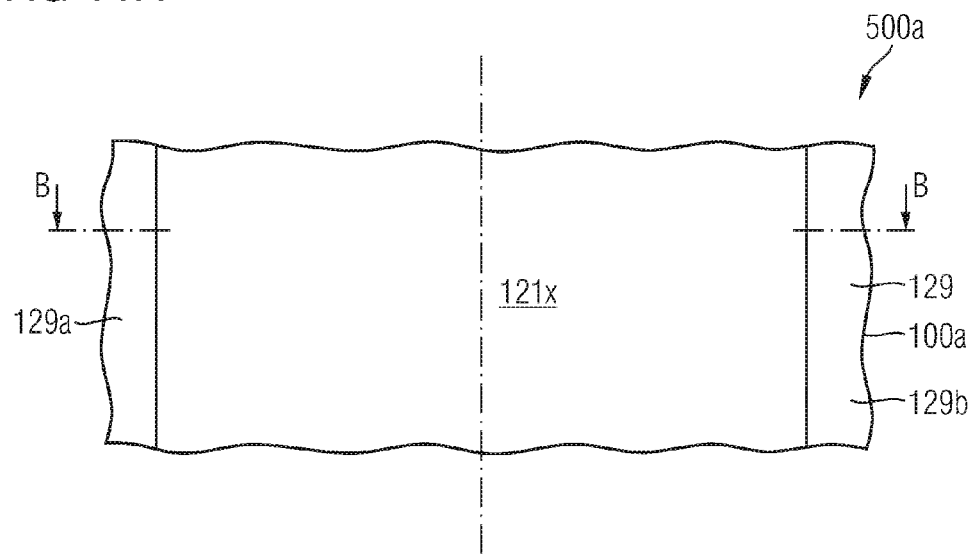
FIG. 11A is a schematic horizontal cross-sectional view of a portion of a semiconductor substrate for illustrating a method of manufacturing a semiconductor device according to an embodiment that includes growing by epitaxy a drift region in epitaxy trenches, after forming the epitaxy trenches in the semiconductor substrate.

FIG. 11A shows a semiconductor substrate 500a that includes a base substrate 100a of a crystalline semiconductor material. The base substrate 100a may be a semiconductor wafer from which a plurality of identical semiconductor dies is obtained. The semiconductor material may be crystalline silicon (Si), silicon carbide (SiC), germanium (Ge), a silicon germanium crystal (SiGe), gallium nitride (GaN), gallium arsenide (GaAs) or any other $A_{III}B_V$ semiconductor, by way of example. The base substrate 100a may or may not include an epitaxy layer grown on a substrate portion.

A perpendicular to a planar main surface 101a of the base substrate 100a defines a vertical direction. Directions orthogonal to the vertical directions are horizontal directions. The base substrate 100a may be heavily doped. According to an embodiment referring to n-FETs, the base substrate 100a is heavily n-doped with arsenic or phosphorus atoms. The dopant concentration may be approximately uniform and may be in a range from 1E18 cm$^{-3}$ to 1E21 cm$^{-3}$, for example in a range from 1E19 cm$^{-3}$ to 1E20 cm$^{-3}$. A thickness of the base substrate 100a between the main surface 101a and a supporting surface 102a on the opposite side of the base substrate 100a may be at least 175 µm, for example at least 600 µm, and may be thinned at a later stage of processing.

A mask layer, e.g., a silicon nitride layer or a silicon oxide layer formed by CVD using TEOS as precursor material, is deposited on the main surface 101a and patterned by photolithography to form a first mask 710 with first mask openings 711. The first mask openings 711 may have a rectangular shape in the horizontal plane, wherein a horizontal longitudinal extension may be in a range between 10 µm and 5 mm and a horizontal transverse extension may be in a range from 100 µm to 500 µm, by way of example.

Using the first mask 710 as etch mask, epitaxy trenches 121x are etched from the main surface 101a into the base substrate 100a.

Figure 11B:
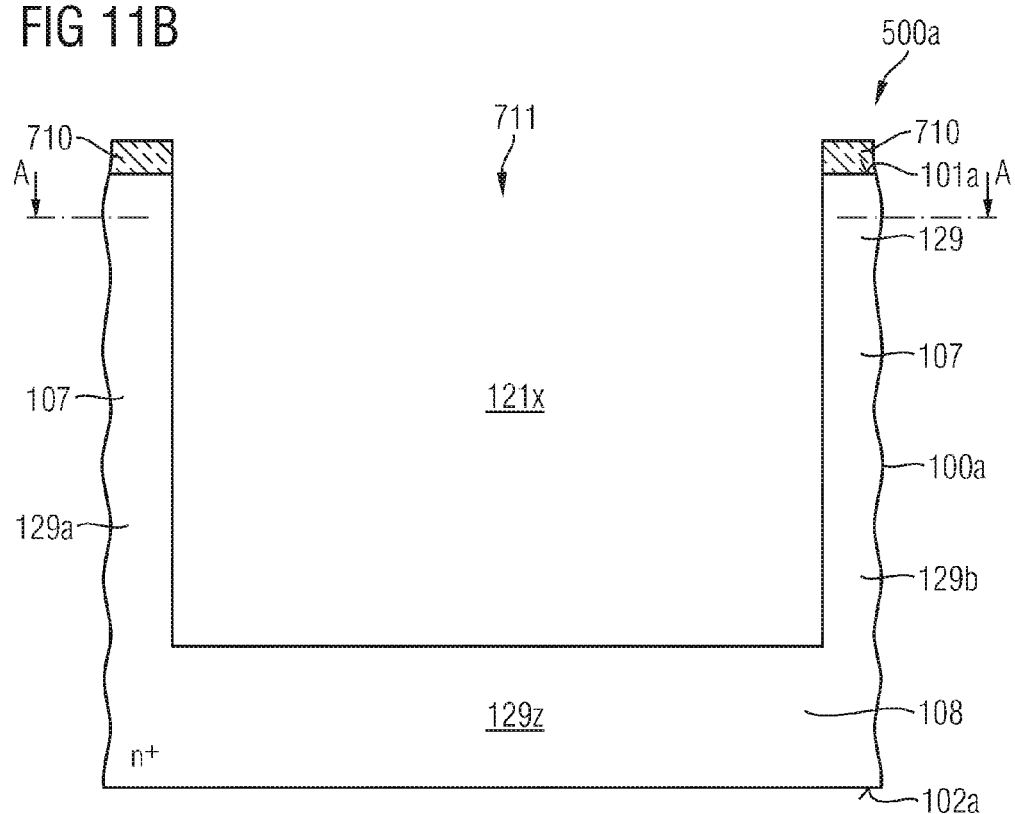
FIG. 11B is a schematic vertical cross-sectional view of the semiconductor substrate portion of FIG. 11A along line B-B.

FIGS. 11A and 11B show an epitaxy trench 121x extending from the main surface 101a into the base substrate 100a. A vertical extension of the epitaxy trench 121x may be greater than 5 µm, e.g., greater than 10 µm. Remnant portions of the base substrate 100a between neighboring epitaxy trenches 121x form fin sections 107 including collection portions 129a, 129b of a drain structure 129. A continuous section 108 of the base substrate 100a between the epitaxy trenches 121x and the supporting surface 102a may include a base portion 129z of the drain structure 129.

Dopant atoms of a conductivity type opposite to that of the base substrate 100a may be introduced through sidewalls of the fin sections 107 and through the exposed surface of the continuous section 108, for example, by out-diffusion from a gaseous or solid auxiliary material containing the dopant atoms or by a tilted implant of suitable dopant atoms.

A layer of dielectric material may be selectively formed on the bottom of the epitaxy trench 121x, for example, by a non-conformal deposition method that deposits the dielectric material at higher rate on horizontal surfaces like the exposed surface of the continuous section 108. For example, silicon oxide may be deposited in an HDP (high density plasma) deposition process. A mainly isotropic etch process may remove portions of the dielectric material deposited on the sidewalls of the fin sections 107 without completely removing portions of the dielectric material deposited on the exposed surface of the continuous section 108. Then semiconductor material is selectively grown by epitaxy on exposed vertical sidewalls of the fin sections 107.

The first mask 710 or a further mask replacing the first mask 710 may shield the main surface 101a against introduction of dopants into the sidewalls of the fin sections 107 and may suppress epitaxial growth on the main surface 101a.

FIGS. 12A and 12B show a field stop region 128 defined by the dopant atoms introduced through the sidewalls of the fin sections 107 and through the exposed surface of the continuous section 108. In the field stop region 128 introduced dopants locally reduce a net dopant concentration, to at most a half, for example, to at most a tenth of the dopant concentration in the base substrate 100a.

The deposited dielectric material forms a dielectric separation layer 410 on the continuous section 108. The material of the dielectric separation layer 410 may be silicon oxide. A vertical extension of the dielectric separation layer 410 may be at least 100 nm, for example at least 1 µm. The epitaxy process forms precursor drift regions 121z along the vertical sidewalls of the fin sections 107. The two opposite precursor drift regions 121z leave a central body trench 115x between them.

Precursor body regions 115z are formed in the central body trench 115x or in portions of the precursor drift regions 121z directly adjoining the central body trench 115x. For example, in-situ p-doped layers may be grown by epitaxy on vertical sidewalls of the central body trench 115x. According to another embodiment, a further auxiliary layer may be deposited that lines sidewalls of the central body trench 115x and that contains p-type dopants such as boron. The further auxiliary layer may be a BSG (boron silicate glass) layer. According to a further embodiment, p-type dopants are deposited, e.g., from the gas phase using a gaseous precursor material containing the p-type dopants or from a plasma phase.

FIGS. 13A to 13B show the precursor body regions 115z forming vertical first pn junctions pn1 with the precursor drift regions 121z. A central source opening 110x may be left between the two precursor body regions 115z.

A precursor source region 110z is formed in the central source opening 110x and/or in portions of the precursor body regions 115z directly adjoining the central source opening 110x. For example, the precursor source region 110z is formed by epitaxy, wherein the grown epitaxy layer is in-situ heavily n-doped. According to other embodiments, n-type dopants may be out diffused from a further auxiliary layer lining the source opening 110x and containing the n-type dopants or by outdiffusion from a gaseous phase of a precursor material containing n-type dopants. A planarization process, e.g., a. CMP (chemical mechanical polishing) may remove epitaxial portions grown above the main surface 101a or above the first mask 710, wherein the first mask 710 may be used as stop layer for the planarization process.

Figure 14A:
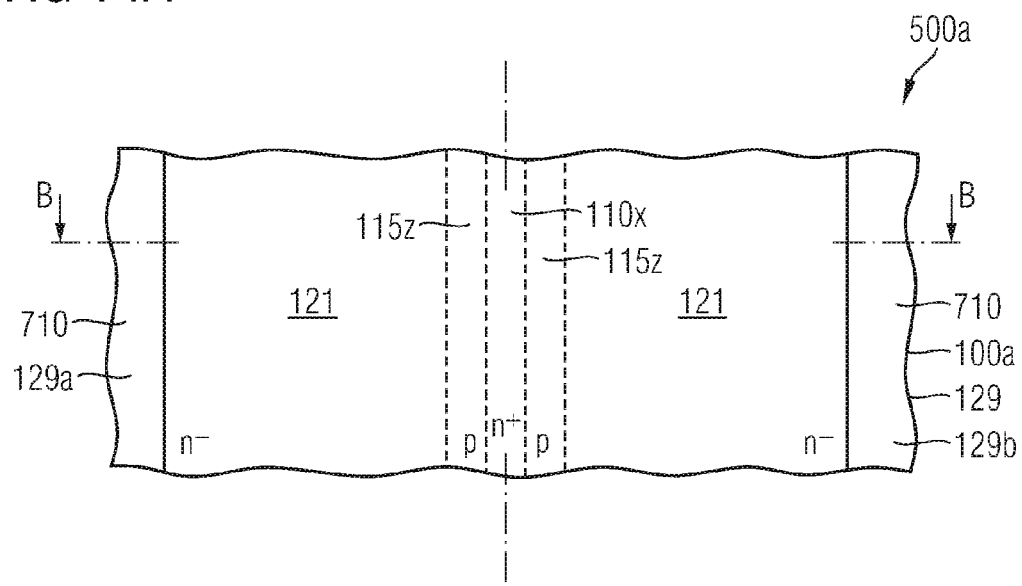
FIG. 14A is a schematic plan view of the semiconductor substrate portion of FIG. 13A, after planarizing the precursor drift regions, the precursor body regions and precursor source regions formed along sidewalls of the precursor body regions.
Figure 14B:
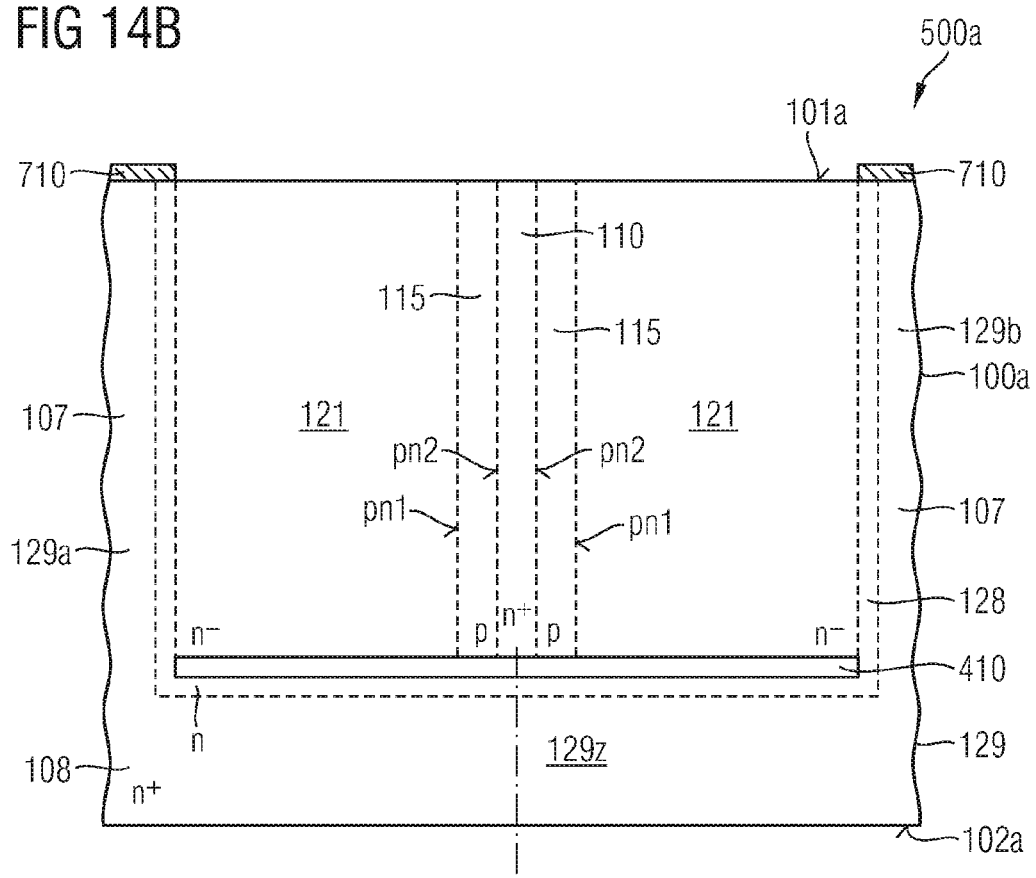
FIG. 14B is a schematic vertical cross-sectional view of the semiconductor substrate portion of FIG. 14A along line B-B.

FIGS. 14A to 14B show the planarized main surface 101a. From the precursor drift regions 121z a drift region 121 is formed with two portions 121a, 121b symmetric to both a vertical center axis and to a horizontal longitudinal center axis on opposite sides of an intermediate body region 115 formed from the precursor body region 115z. A source region 110 separates two symmetric portions 115a, 115b of the body region 115. The drift region 121, the body region 115 as well as the source region 110 may extend from the main surface 101a down to the dielectric separation layer 410. The source and body regions 110, 115 form vertical second pn junctions pn2.

A second mask layer may be deposited and patterned by photolithography to form a second mask with second mask openings that define position and dimensions of field plate structures 160 and termination field plate structures 190 as illustrated in FIG. 7. Using the second mask as an etch mask, field plate trenches are etched into the drift region 121, wherein the dielectric separation layer 410 may be effective as etch stop structure. A field dielectric 161 is formed that lines the field plate trenches. The field dielectric 161 may be formed by an oxidation process of the semiconductor material of the drift region 121, by depositing dielectric material, for example, by depositing silicon oxide formed in a CVD process using TEOS as precursor material, or by any combination thereof. Then, one or more conductive materials may be deposited to fill the remaining openings of the field plate trenches. The conductive materials may include heavily doped polycrystalline silicon and metals. A planarization process, for example, a CMP may remove the second mask as well as portions of the field dielectric 161 and the deposited conductive material from above the main surface 101a.

Figure 15A:
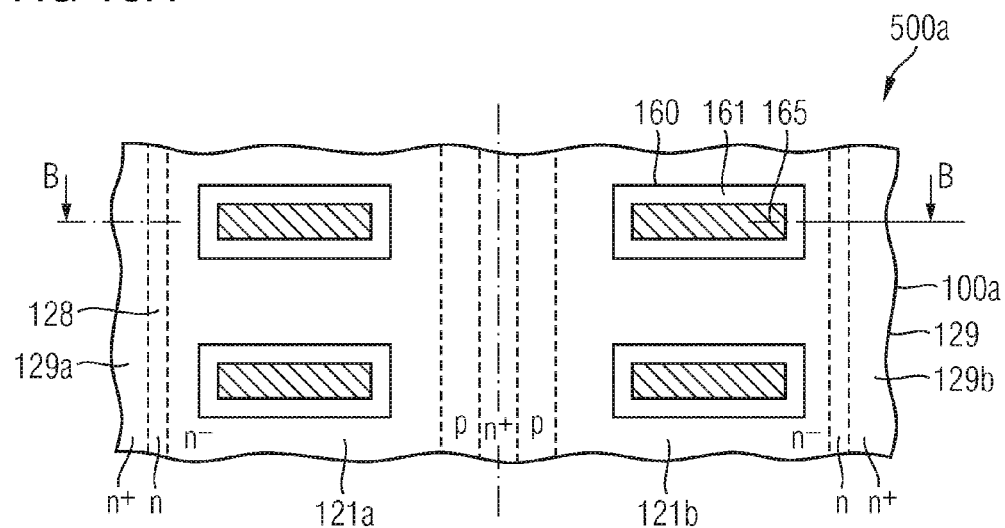
FIG. 15A is a schematic plan view of the semiconductor substrate portion of FIG. 14A, after forming field plate structures.
Figure 15B:
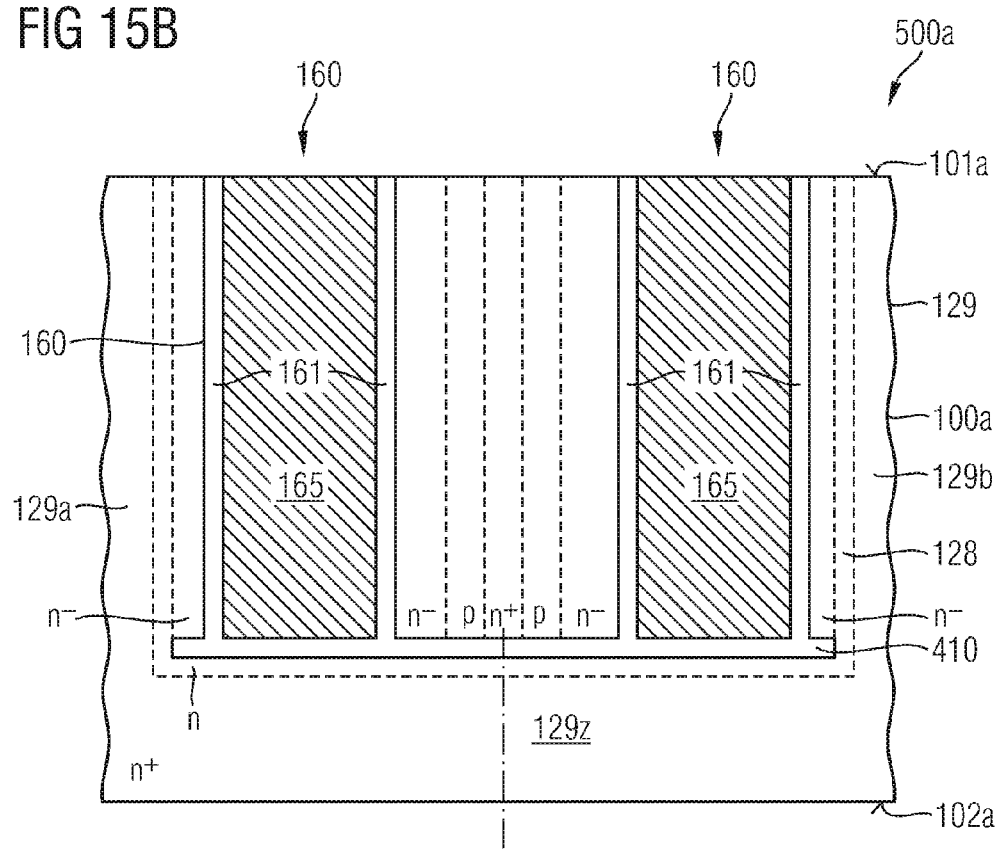
FIG. 15B is a schematic vertical cross-sectional view through the semiconductor substrate portion of FIG. 15A along line B-B along a horizontal longitudinal center axis of a pair of symmetric field plate structures.

FIGS. 15A and 15B show the resulting field plate structures 160 including conductive field electrodes 165 formed from the deposited conductive material and the field dielectric 161 separating the field electrode 165 from the drift region 121. The field plate structures 160 may extend down to the dielectric separation layer 410.

A third mask layer may be deposited and patterned by photolithography to form a third mask with third mask openings defining position and dimensions of gate structures 150. The openings may be formed along horizontal longitudinal axes of the field plate structures 160 or may be shifted with respect to the horizontal longitudinal axes of the field plate structures 160. Using the third mask as an etch mask, gate trenches may be etched into the body regions 115 or into both the source and body regions 110, 115, wherein the dielectric separation layer 410 may be effective as etch stop layer.

A gate dielectric 151 may be formed that lines the sidewalls of the gate trenches. The gate dielectric 151 may be formed by thermal oxidation of the semiconductor material, by depositing one or more dielectric materials or by a combination of both. The remaining openings in the gate trenches may be filled with one or two conductive materials such as polycrystalline silicon and metal. A polishing process such as CMP removes the third mask as well as portions of the gate dielectric and the conductive fill materials from above the main surface 101a.

Figure 16A:
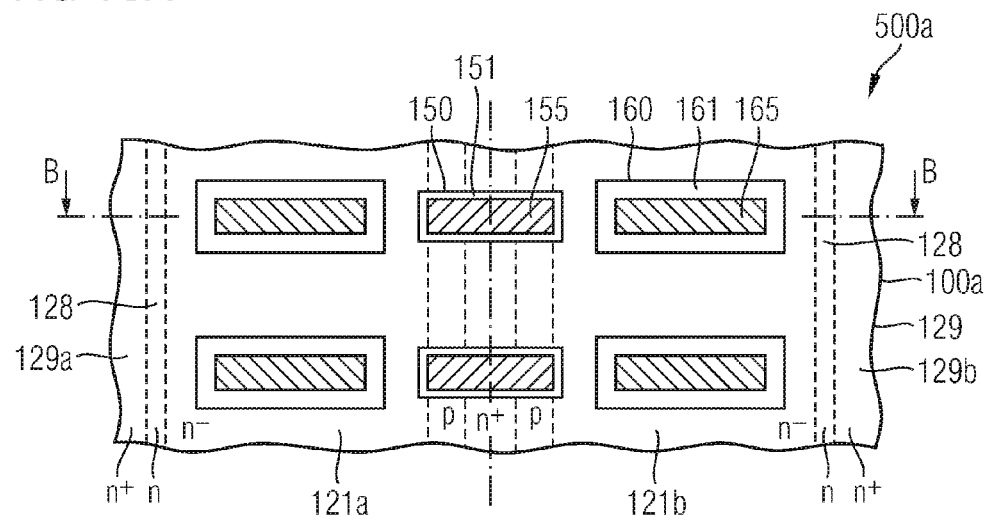
FIG. 16A is a schematic plan view of the semiconductor substrate portion of FIG. 15A, after forming gate structures.
Figure 16B:
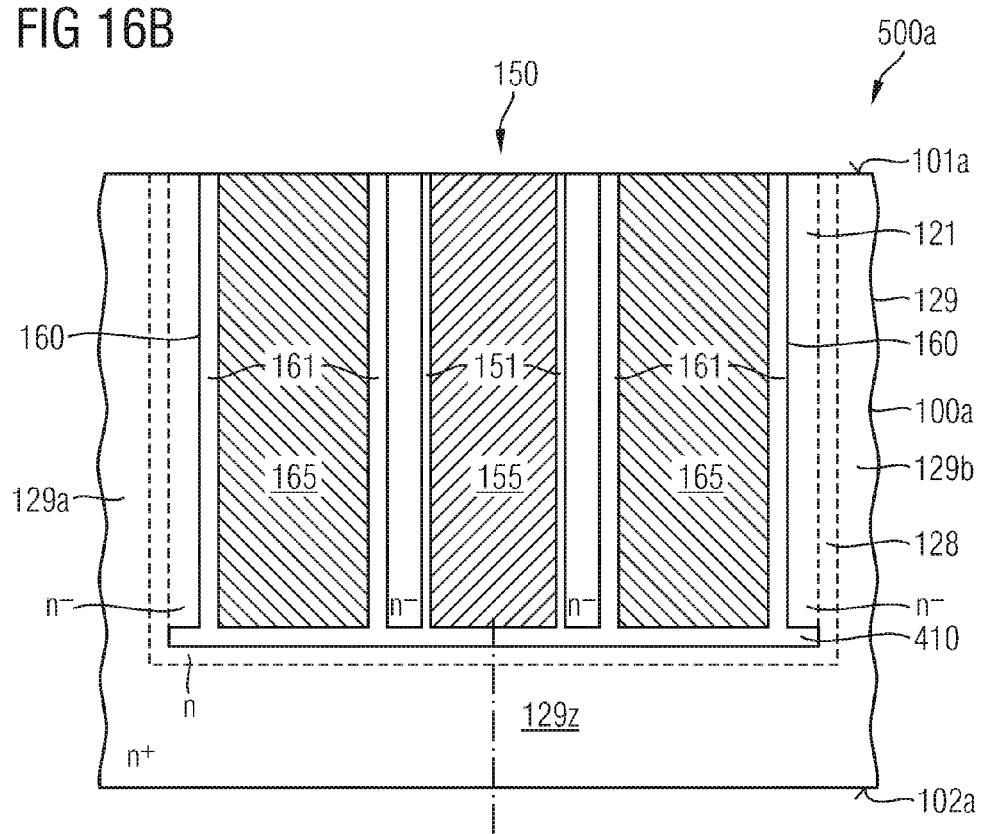
FIG. 16B is a schematic vertical cross-sectional view through the semiconductor substrate portion of FIG. 16A along line B-B along a horizontal longitudinal center axis of a pair of symmetric field plate structures.

FIGS. 16A to 16B show the resulting gate structures 150 with the conductive gate electrodes 155 extending from the main surface 101a to the dielectric separation layer 410. A gate dielectric 151 separates the gate electrode 155 from the body region 115, the source region 110 and the drift region 121. Formation of the field plate structures 160 and the gate structures 150 may be altered, such that the gate structures 150 are formed before the field plate structures 160.

An interlayer dielectric 210 may be deposited on the main surface 101a. A fourth mask layer may be deposited on the interlayer dielectric 210 and patterned by photolithography to form fourth mask openings between neighboring gate structures 150. Using the fourth mask as an etch mask, contact openings are etched through the interlayer dielectric 210. P-type dopants may be implanted through the contact openings to form heavily doped body contact zones 117, e.g., close to the main surface 101a. Contact trenches may be formed in the vertical projection of the contact openings in the base substrate 100a, wherein the contact trenches extend through the implanted body contact zones 117 and expose portions of the source region 110. One or more conductive liners may be deposited that line the contact openings in the interlayer dielectric 210 and the contact trench in the base substrate 100a. A fill layer may fill the remaining openings in the contact openings and the contact trenches.

Figure 17A:
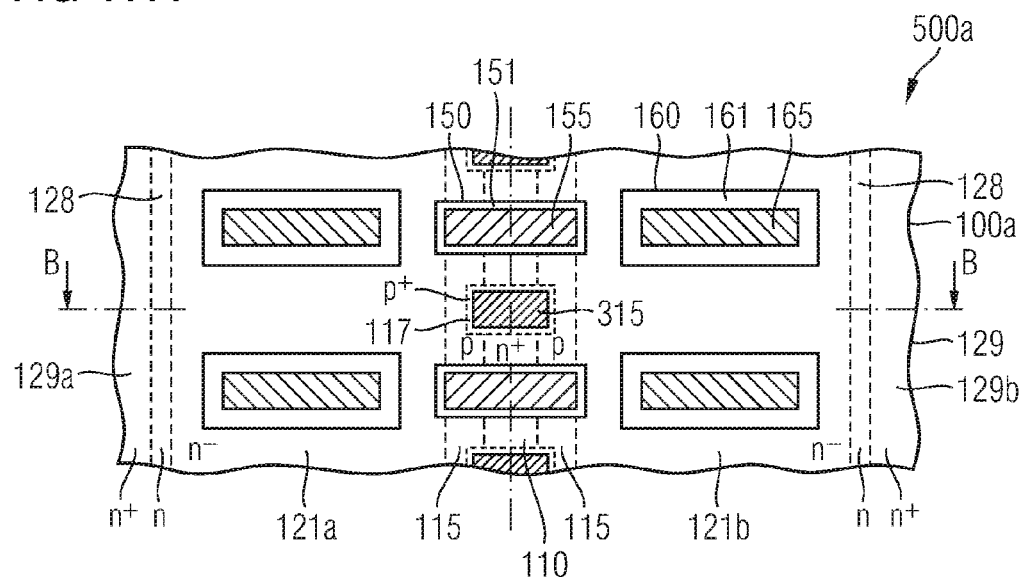
FIG. 17A is a schematic plan view of the semiconductor substrate portion of FIG. 16A, after forming contact structures extending into the source and body regions.
Figure 17B:
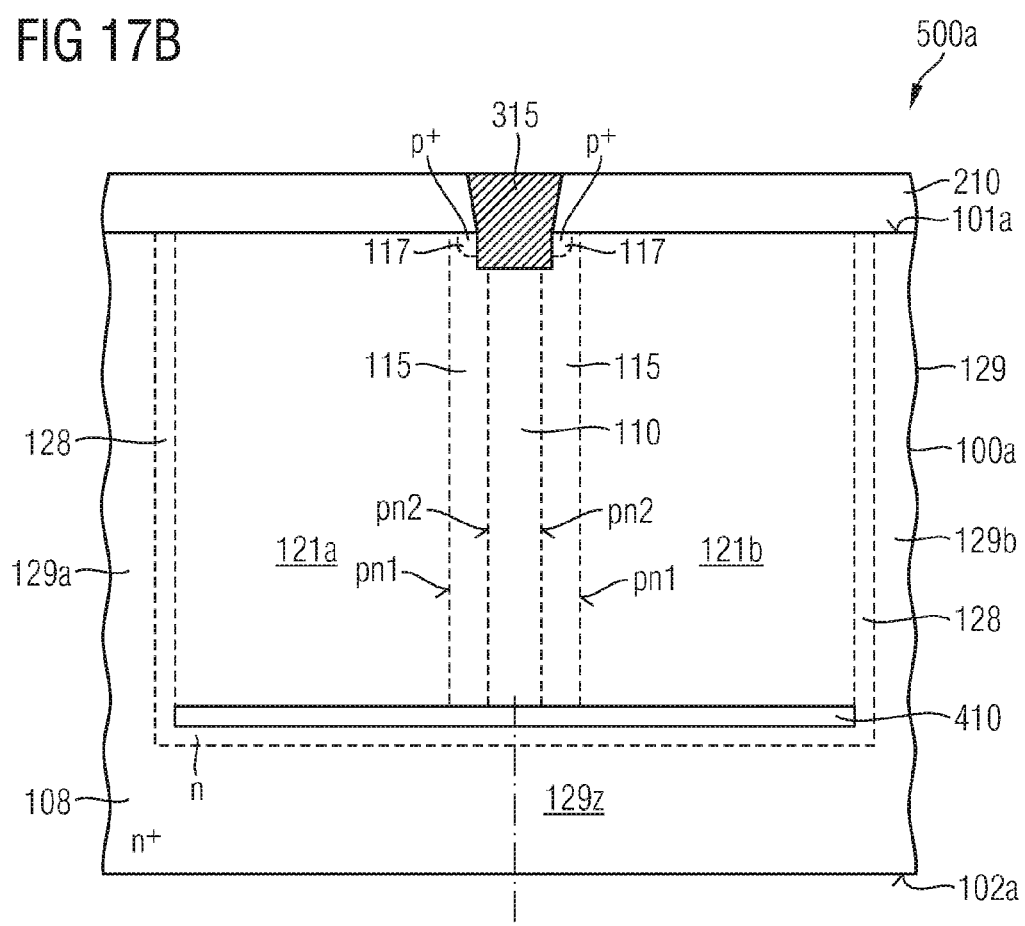
FIG. 17B is a schematic vertical cross-sectional view of the semiconductor substrate portion of FIG. 17A along line B-B through a contact structure.

FIGS. 17A and 17B show the interlayer dielectric 210 on the main surface 101a. The interlayer dielectric 210 may be a homogeneous layer or may include two or more sublayers from silicon oxide, silicon oxynitride, silicon nitride, BSG, PSG (phosphorus silicate glass), BPSG (boron phosphorus silicate glass), FSG (fluorosilicate glass) or polyimide. Contact structures 315 formed in the openings of the interlayer dielectric 210 and in the contact trenches in the base substrate 100a may include at least one barrier liner based on tantalum, titanium, tantalum nitride, titanium nitride, tungsten titanium as well as a fill layer based on sputtered tungsten. The heavily doped body contact zones 117 form low-ohmic connections between the body region 115 and the contact structures 315.

FIGS. 18A to 32C refer to a method of manufacturing a semiconductor device, wherein the method uses a deep body trench 115x in an epitaxy layer and provides deep field plate structures 160, less deep gate structures 150, a lateral and vertical current flow through a drift region 121, and a gate shielding structure based on a field plate effect.

A semiconductor substrate 500a includes a base substrate 100a that includes a weakly doped epitaxy layer 100e grown on a heavily doped substrate portion 100s of crystalline silicon (Si), germanium (Ge), a silicon germanium crystal (SiGe), silicon carbide (SiC), gallium nitride (GaN), gallium arsenide (GaAs) or any other $A_{III}B_V$ semiconductor. The substrate portion 100s may have a thickness of 100 µm and an approximately uniform dopant concentration of at least 1E19 cm$^{-3}$, by way of example.

The epitaxy layer 100e is grown by epitaxy on a process surface of the substrate portion 100s. A vertical extension of the epitaxy layer 100e may be in a range from 10 µm to 1 mm, for example in a range from 20 µm to 200 µm. The epitaxy layer 100e is in-situ doped during epitaxy. For example, the epitaxy layer 100e is uniformly n-doped at a dopant concentration in a range from 1E13 cm$^{-3}$ to 1E17 cm$^{-3}$. An exposed surface of the epitaxy layer 100e forms a main surface 101a and a surface of the substrate portion 100s opposite to the epitaxy layer 100e forms a supporting surface 102a of the base substrate 100a.

A first mask layer is deposited and patterned by photolithography to form a first mask 710 with first mask openings 711. The first mask openings 711 may be stripe-shaped. According to the illustrated embodiment, separated first mask openings 711 are formed along lines extending along a first horizontal direction and arranged parallel to each other. Using the first mask 710 as an etch mask, body trenches 115x are etched from the main surface 101a into the base substrate 100a. The material of the first mask 710 may be any material against which the material of the epitaxial layer 100e can be etched with high selectivity, for example, silicon nitride or silicon oxide.

Figure 18A:
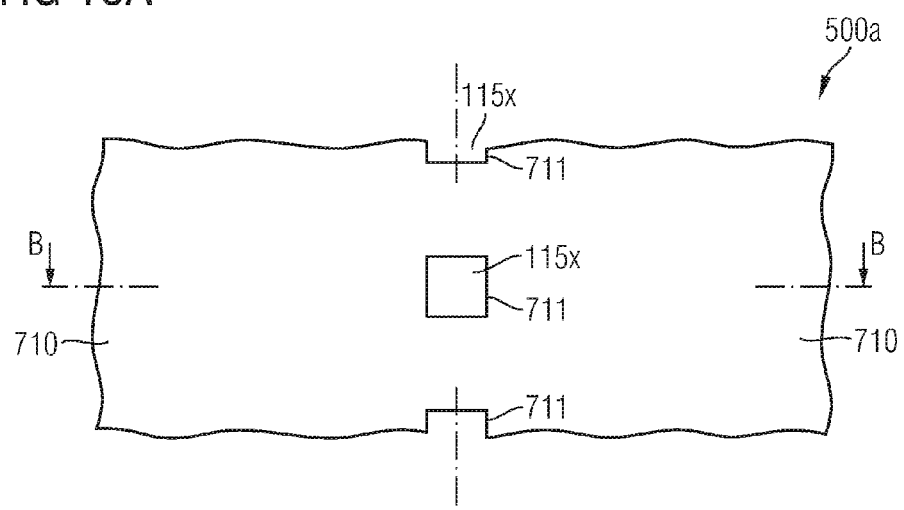
FIG. 18A is a schematic plan view of a portion of a semiconductor substrate for illustrating a method of manufacturing a semiconductor device according to an embodiment including formation of a source region along a source trench and formation of body contact zones, after forming the source trench.
Figure 18B:
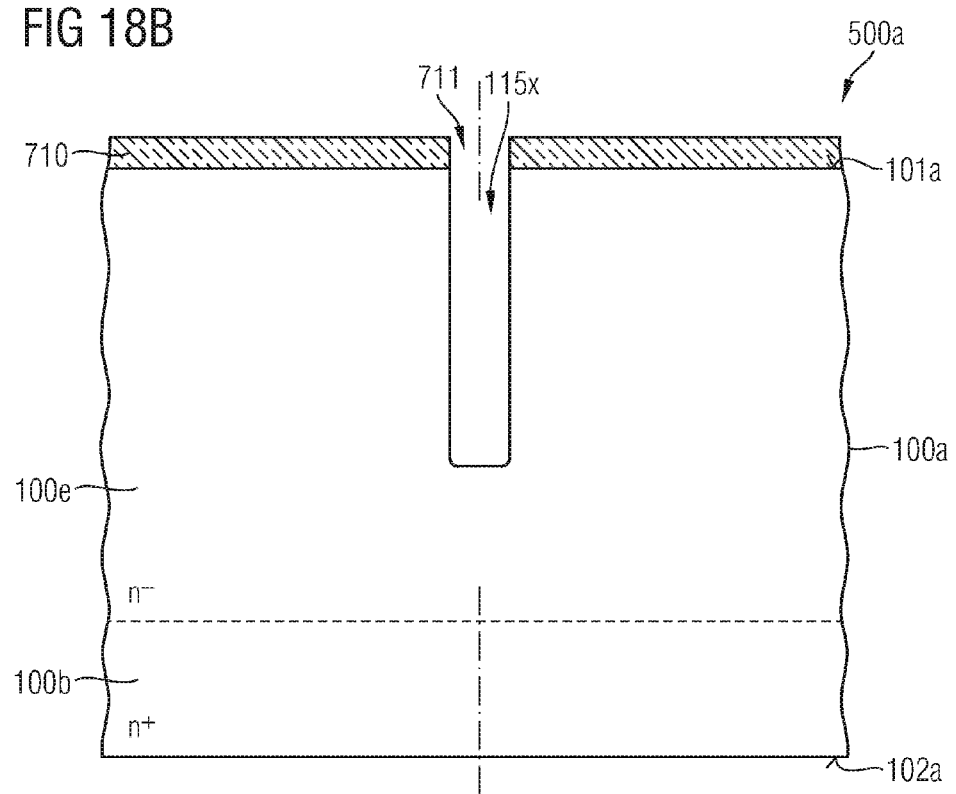
FIG. 18B is a schematic vertical cross-sectional view of the semiconductor substrate portion of FIG. 18A along line B-B orthogonal to a horizontal longitudinal axis of the source trench.

FIGS. 18A and 18B show body trenches 115x arranged in lines and extending from the main surface 101a into the weakly n-doped epitaxy layer 100e. Sidewalls of the body trenches 115x may be perpendicular or may slightly taper with increasing distance to the main surface 101a. The epitaxy layer 100e forms a unipolar homojunction with the continuous substrate portion 100s, wherein the unipolar homojunction is parallel to the main surface 101a and parallel to the supporting surface 102a.

A body region 115 is formed in or along the body trenches 115x assigned to the same line. For example, for semiconductor devices based on n-channel transistor cells, p-type dopants such as boron atoms, or, for semiconductor devices based on p-channel transistor cells, n-type dopants such as phosphorus or arsenic atoms may be introduced through the exposed sidewalls and through the bottom of the body trenches 115x into adjoining portions of the epitaxy layer 100e. For example, the dopants may be introduced from a gas phase by means of a gaseous precursor material containing the dopant atoms or from a plasma phase. According to another embodiment, an in-situ p-doped or n-doped layer may be grown by epitaxy on the exposed surfaces of the epitaxy layer 100e in the body trenches 115x, wherein the body trenches 115x are not completely filled and the epitaxy leaves central source openings 110x. The first mask 710 may be effective as doping mask that bars dopants from being introduced through the main surface 101a or as epitaxy mask locally suppressing epitaxial growth on the main surface 101a.

Figure 19A:
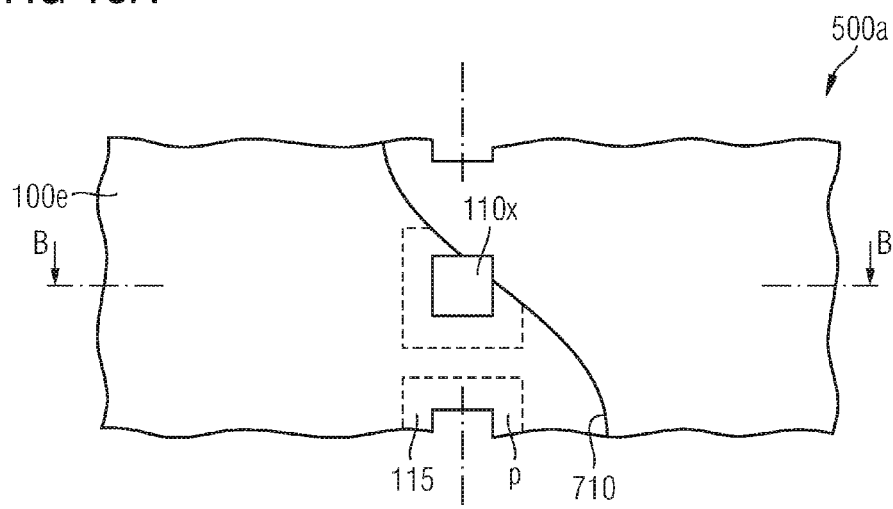
FIG. 19A is a schematic plan view of the semiconductor substrate portion of FIG. 18A, after forming a body region oriented along the source trench.
Figure 19B:
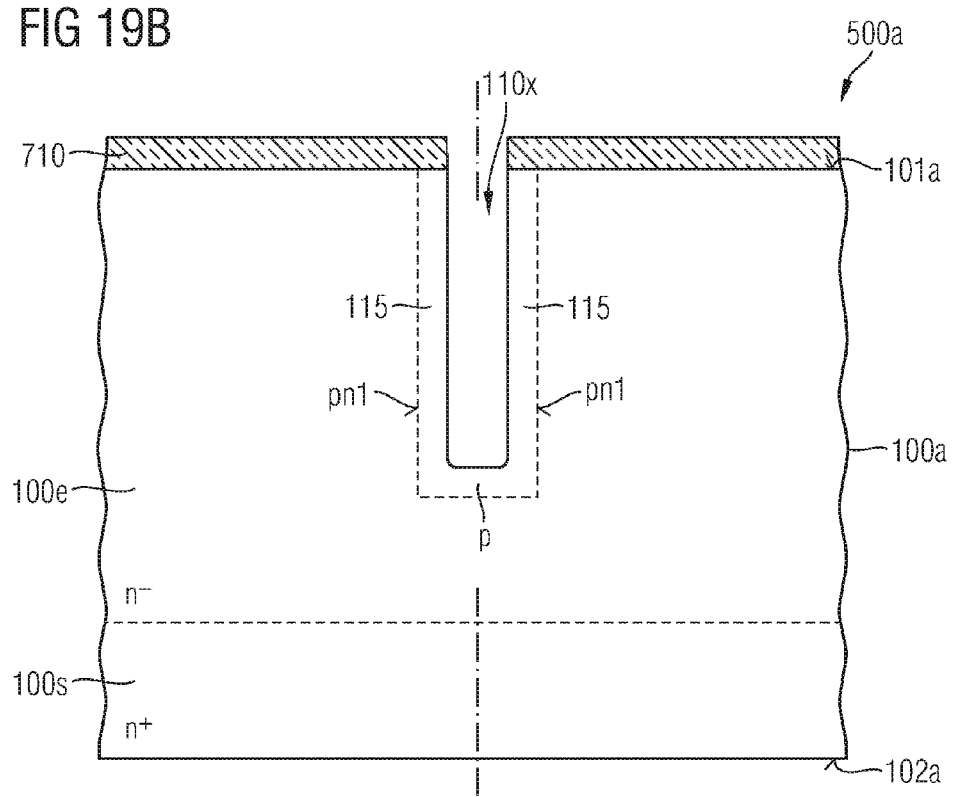
FIG. 19E is a schematic vertical cross-sectional view of the semiconductor substrate portion of FIG. 19A along line B-B orthogonal to the horizontal longitudinal axis of the source trench.

FIGS. 19A and 19B show the body region 115 formed around remaining central source openings 110x by counter-doping portions of the epitaxy layer 100e around the body trenches 115x or by epitaxy. In this stage of processing the body region 115 may include separated portions, each of them formed around one of the source openings 110a or may form one single body region 115 per line. The body region 115 forms a first pn junction pn1 with remaining portions of the epitaxy layer 100e. The first pn junction pn1 includes vertical sections and a comparatively small horizontal section.

A source region 110 is formed in the remaining central source openings 110x and/or in portions of the body region 115 along the central source openings 110x. For example, an epitaxy layer, which is in-situ heavily n-doped, is grown by epitaxy on sidewalls and on the bottom of the central source openings 110x, wherein the central source openings 110x may be filled completely, or wherein the grown epitaxy layer may leave central openings 110y in the central source openings 110x. According to another embodiment, plasma phase doping or gas phase doping based on a gaseous precursor containing n-type dopants for n-channel transistor cells or p-type dopants for p-channel transistor cells counterdopes a portion of the body region 115 directly adjoining the central source openings 110x. According to a further embodiment, a tilted implant of dopants may counter-dope exposed portions of the body region 115 or an auxiliary oxide may be formed at the bottom of the source opening 110x and a further epitaxial process may form an in-situ n+-doped source region 110 along the vertical sidewalls of the central source openings 110x. The source region 110 may fill the central source openings 110x completely or forming the source region 110 may leave central openings 110y that may be filled with a first sacrificial material, e.g., a dielectric material, for example silicon oxide.

Figure 20A:
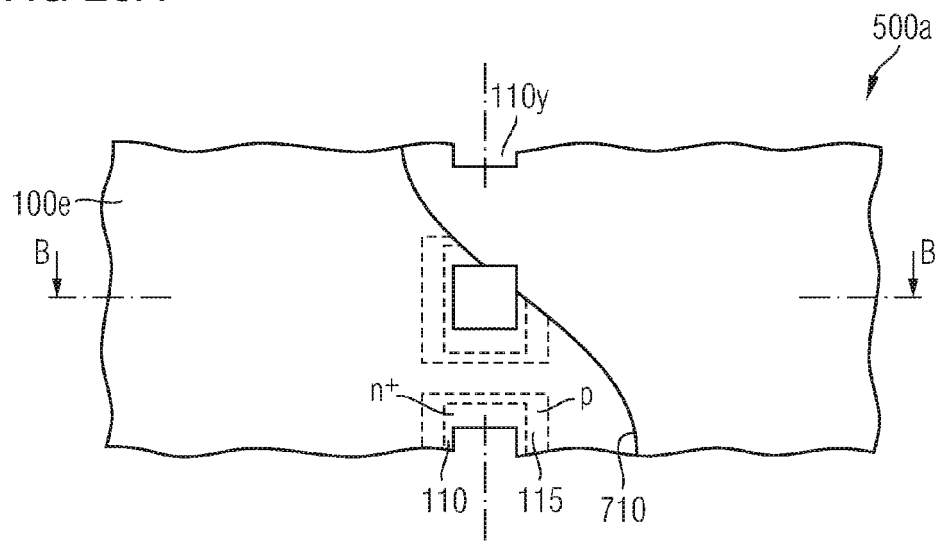
FIG. 20A is a schematic plan view of the semiconductor substrate portion of FIG. 19A, after forming a source region.
Figure 20B:
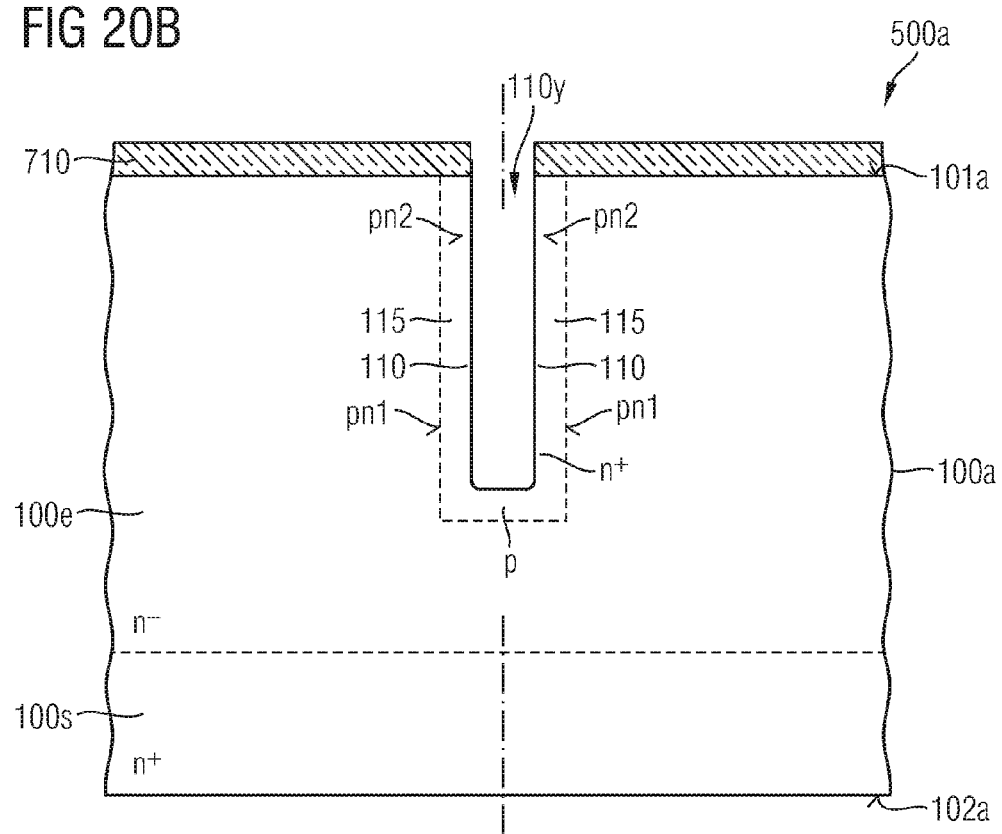
FIG. 20B is a schematic vertical cross-sectional view of the semiconductor substrate portion of FIG. 20A along line B-B orthogonal to the horizontal longitudinal axis of the source trench.

FIGS. 20A to 20B show a source region 110 formed by counter-doping portions of the body region 115 directly adjoining the source openings 110x or by an epitaxial growth of an in-situ n+-doped layer on the body region 115. The source and body regions 110, 115 form a second pn junction pn2 that includes vertical sections and a small horizontal section at the bottom. The source region 110 may completely fill the space between opposite portions of the body region 115. In the illustrated embodiment, formation of the source region 110 leaves central openings 110y. At this stage of processing the source region 110 may include separated portions, each of them formed around and/or in one of the source openings 110a or may form one single source region 110 per line. A first sacrificial material may be deposited that fills the central openings 110y. Portions of the first sacrificial material deposited outside of the central openings 110y as well as the first mask 710 and other materials deposited above the main surface 101a during formation of the body and source regions 115, 110 may be removed, e.g., by CMP.

Figure 21A:
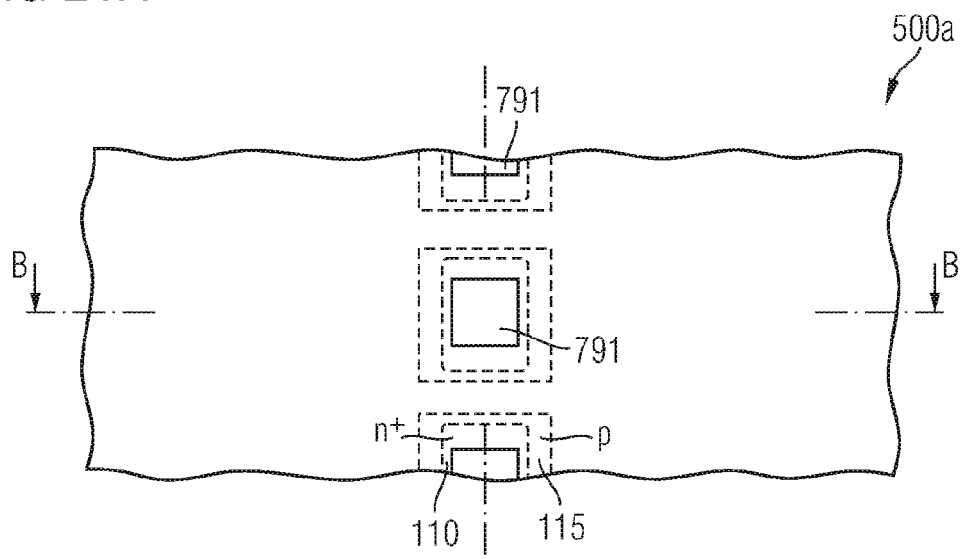
FIG. 21A is a schematic plan view of the semiconductor substrate portion of FIG. 20A, after filling a remaining opening of the source trench with a first sacrificial material.
Figure 21B:
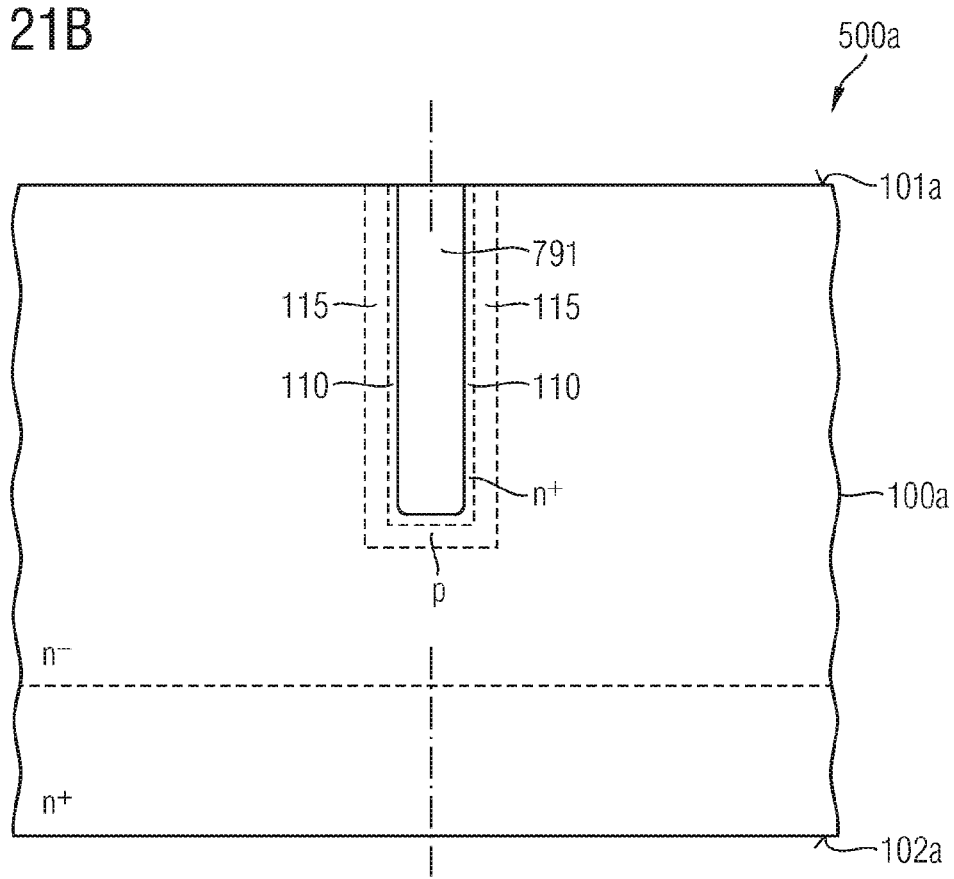
FIG. 21B is a schematic vertical cross-sectional view of the semiconductor substrate portion of FIG. 21A along line B-B orthogonal to the horizontal longitudinal axis of the source trench.

FIGS. 21A to 21B show the first sacrificial material 791, filling the central openings 110y after removal of the first mask 710 and after removal of portions of the body region 115, the source region 110 and the first sacrificial material deposited outside of the central openings 110y.

A protection mask layer may be deposited and patterned by photolithography to form a protection mask 754 with openings defining position and dimensions of gate trenches 150x, field plate trenches 160x and drain contact trenches 325x. Using the protection mask 754 as an etch mask, gate trenches 150x, field plate trenches 160x and drain contact trenches 325x are etched into the base substrate 100a. By using one single photolithographic mask for defining the gate trenches 150x, the field plate trenches 160x and the drain contact trenches 325x, no misalignment between photolithographic masks for, e.g., gate structures and field plate structures can contribute to fluctuations of device parameters.

Figure 22A:
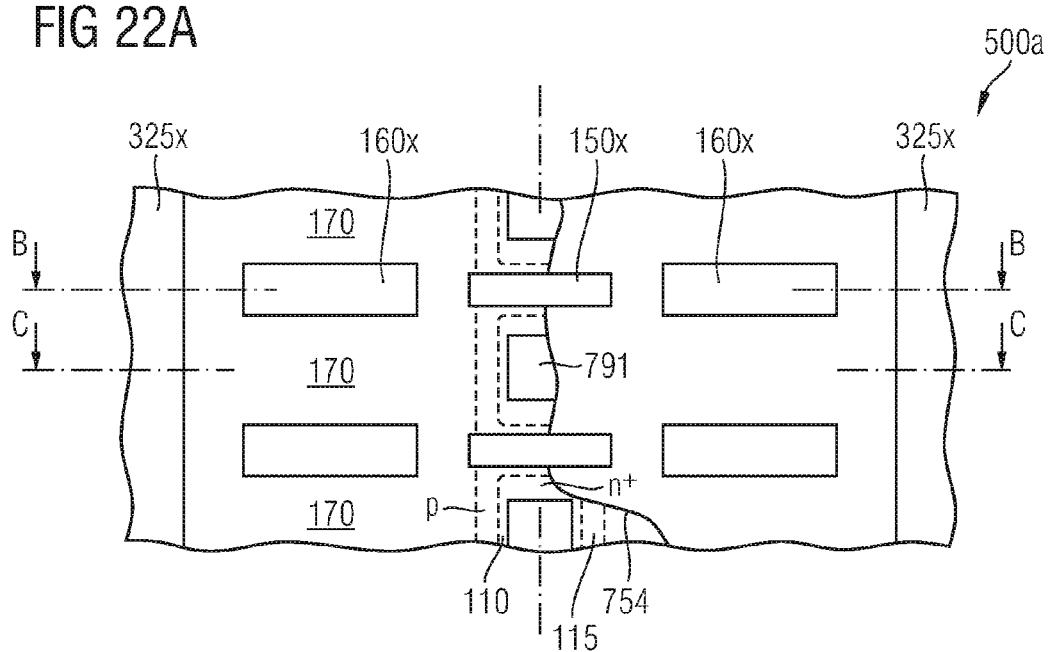
FIG. 22A is a schematic plan view of the semiconductor substrate portion of FIG. 21A, after forming gate trenches, field plate trenches and drain contact trenches.
Figure 22B:
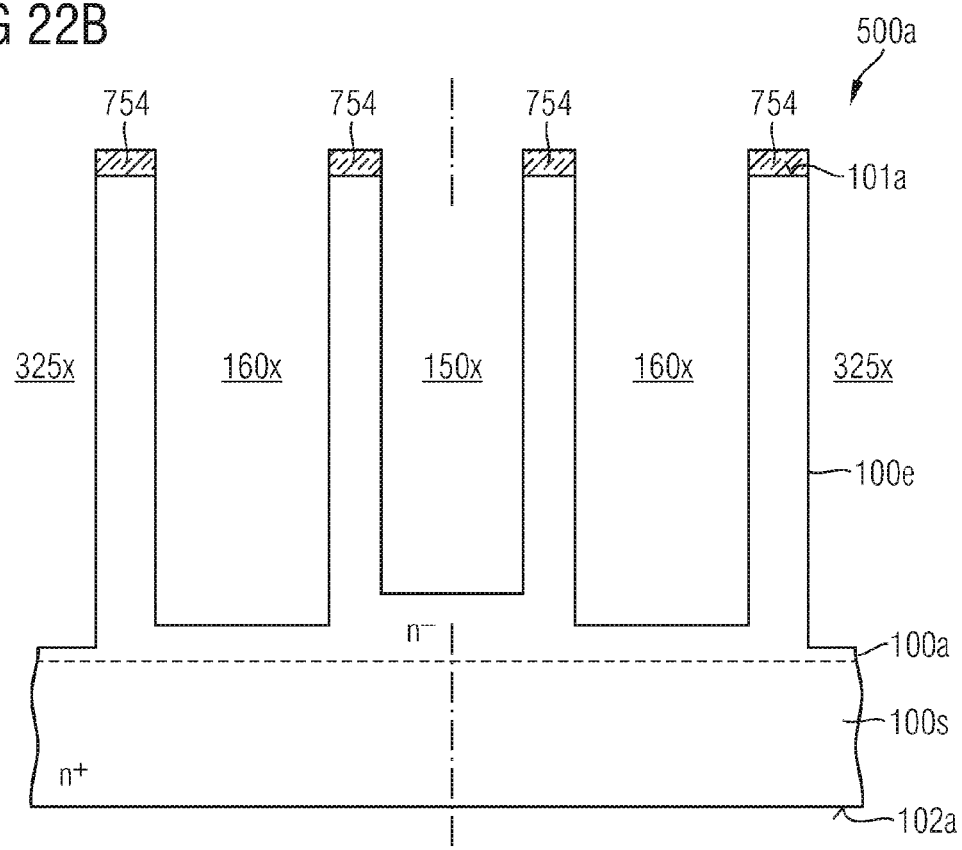
FIG. 22B is a schematic vertical cross-sectional view of the semiconductor substrate portion of FIG. 22A along line B-B along horizontal longitudinal axes of the gate and field plate trenches.
Figure 22C:
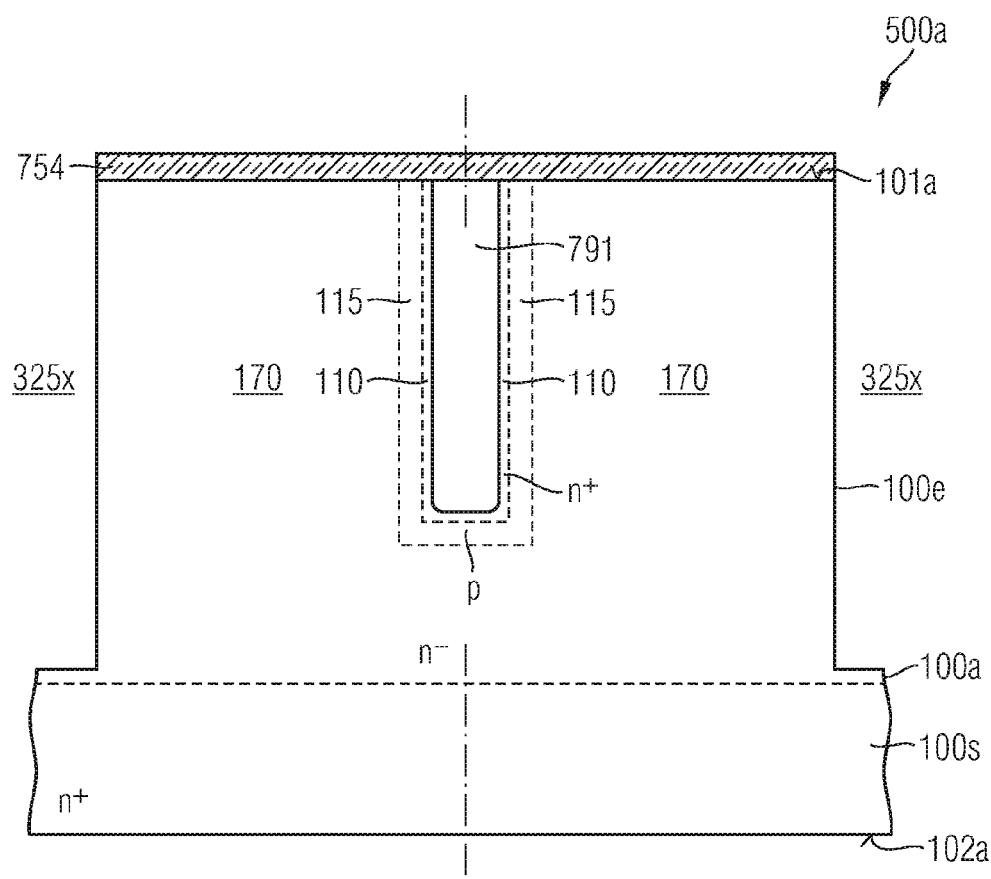
FIG. 22C is a schematic vertical cross-sectional view of the semiconductor substrate portion of FIG. 22A along line C-C through mesa portions of a drift region between neighboring lines of gate and field plate trenches and orthogonal to the horizontal longitudinal axis of the source region.

As illustrated in FIGS. 22A to 22C, the protection mask 754 covers mesa portions 170 of the epitaxy layer 100e between neighboring openings for field plate trenches 160x and neighboring openings for gate trenches 150x as well as portions of the first sacrificial material 791. A vertical extension of the drain contact trenches 325x may be greater than that of the field plate trenches 160x. The vertical extension of the field plate trenches 160x may be greater than a vertical extension of the gate trenches 150x, e.g., by at least 10% or by at least 50%.

The drain contact trenches 325x, the field plate trenches 160x and the gate trenches 150x may be filled with a second sacrificial material 792, which may be the same material as the first sacrificial material 791. Portions of the second sacrificial material 792 deposited outside of the gate trenches 150x, the field plate trenches 160x and the drain contact trenches 325x may be removed, e.g., by a CMP that stops at the protection mask 754.

Figure 23A:
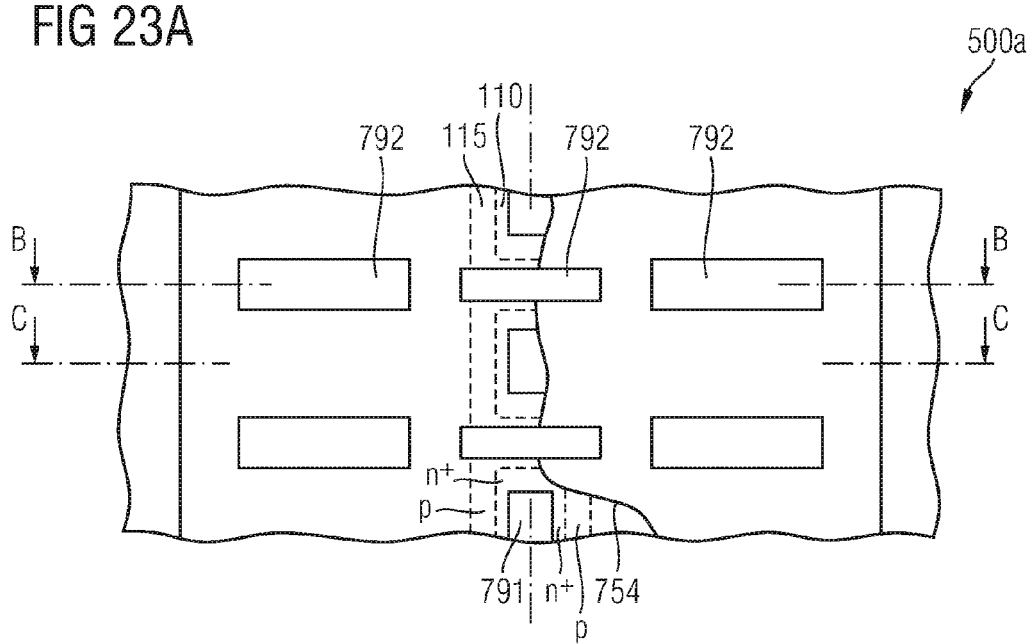
FIG. 23A is a schematic plan view of the semiconductor substrate portion of FIG. 22A, after filling the gate trenches, the field plate trenches and the drain contact trenches with a second sacrificial material.
Figure 23B:
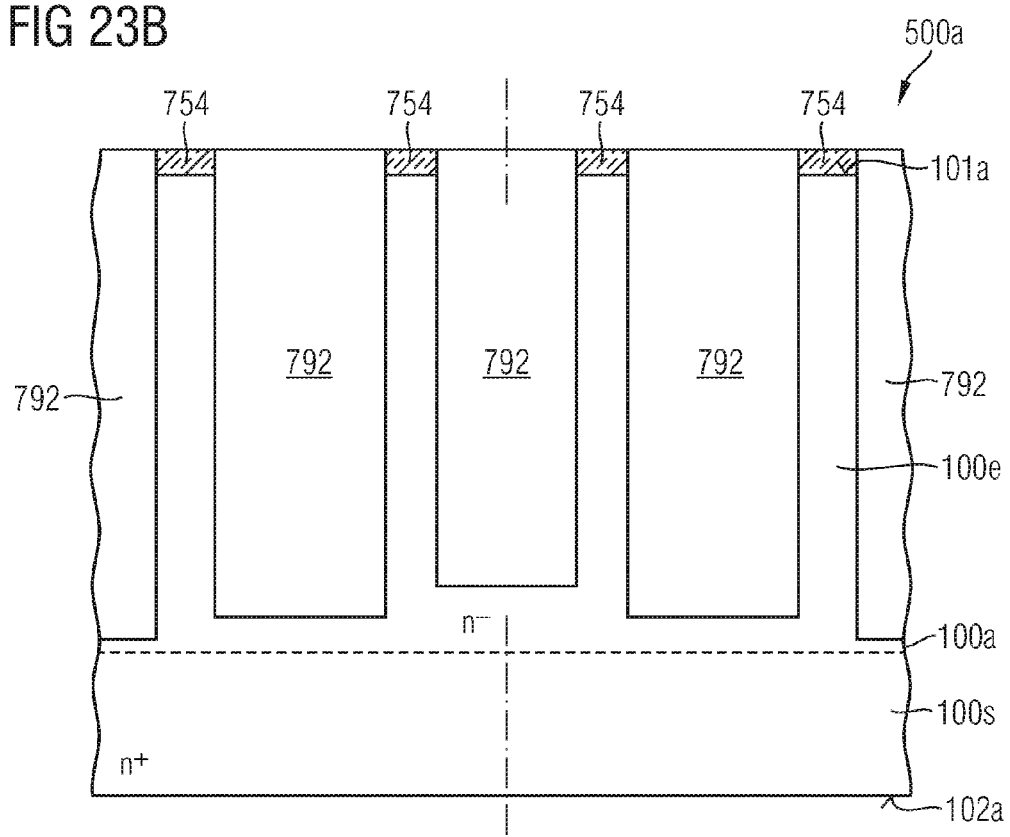
FIG. 23B is a schematic vertical cross-sectional view of the semiconductor substrate portion of FIG. 23A along line B-B along horizontal longitudinal axes of the gate and field plate trenches filled with the second sacrificial material.

FIGS. 23A to 23C show the second sacrificial material 792 filling the drain contact trenches 325x, the field plate trenches 160x and the gate trenches 150x.

A first auxiliary mask layer is deposited and patterned by photolithography to form a first auxiliary mask 762 exposing the second sacrificial material 792 in the field plate trenches 160x and covering the second sacrificial material 792 in the gate trenches 150x and in the drain contact trenches 325x. The first auxiliary mask 762 may also cover the first sacrificial material 791 in the central openings 110y.

The second sacrificial material 792 is removed from the field plate trenches 160x. The first auxiliary mask may further be used to further recess the field plate trenches 160x with respect to the gate trenches 150x.

FIGS. 24A and 24B show the first auxiliary mask 762 with stripe-shaped first auxiliary mask openings 763 exposing the area around the field plate trenches 160x. A material of the first auxiliary mask 762 may be a photoresist, by way of example. The field plate trenches 160x are empty.

The first auxiliary mask 762 may be removed and a field dielectric 161 may be formed by thermal oxidation of the semiconductor material of the base substrate 100a, by deposition of a dielectric material or by a combination of both. One or more conductive materials are deposited to fill the remaining openings in the field plate trenches 160x. Portions of the field dielectric material and the deposited conductive materials outside of the field plate trenches 160x are removed, for example by CMP using the protection mask 754 as etch stop.

Figure 25A:
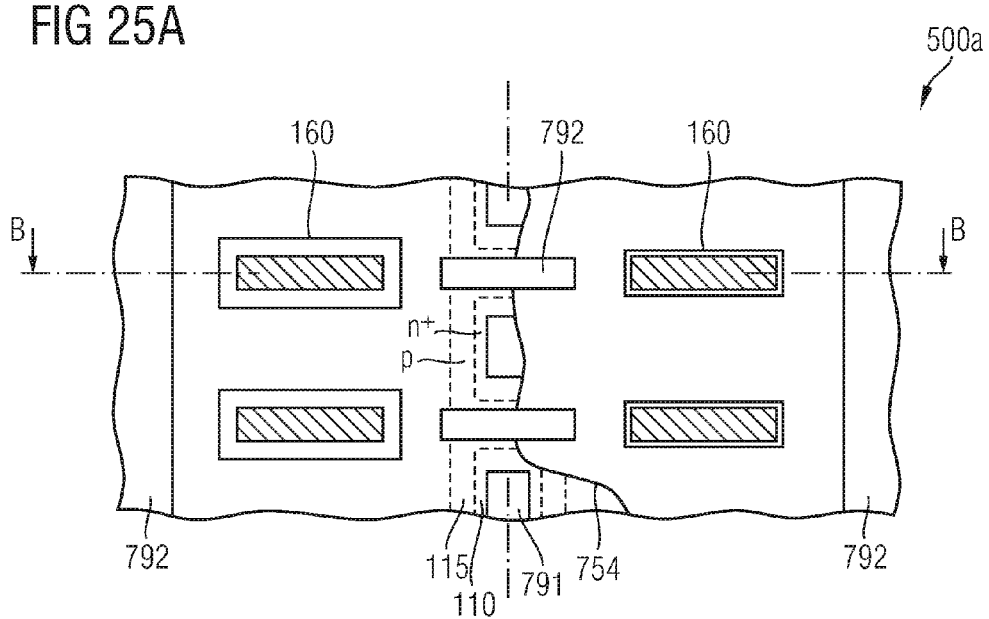
FIG. 25A is a schematic plan view of the semiconductor substrate portion of FIG. 24A, after forming field plate structures in the field plate trenches.
Figure 25B:
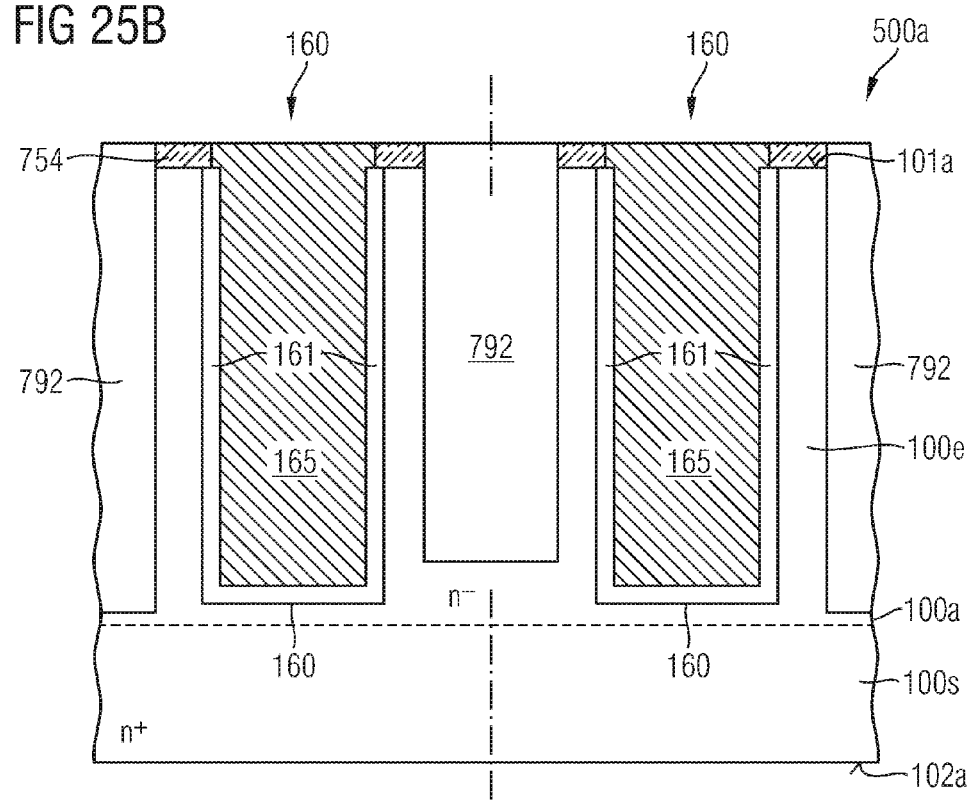
FIG. 25B is a schematic vertical cross-sectional view of the semiconductor substrate portion of FIG. 25A along line B-B along horizontal longitudinal axes of the field plate structures.

FIGS. 25A to 25B show the resulting field plate structures 160 with the field dielectric 161 separating field electrodes 165, which are formed from the deposited conductive material, from the epitaxy layer 100e.

A second auxiliary mask layer is deposited and patterned by photolithography to form a second auxiliary mask 764 that exposes the second sacrificial material 792 in the gate trenches 150x and that covers the field plate structures 160, the second sacrificial material 792 in the drain contact trenches 325x and the first sacrificial material 791 in the central openings 110y. Using the second auxiliary mask 764 as an etch mask, the second sacrificial material 792 may be removed from the gate trenches 150x. A gate shielding dielectric 412 may be formed at the bottom of the gate trenches 150x, for example from remnants of the second sacrificial material 792 or by a highly non-conformal deposition of a further dielectric material, which may be removed from the sidewalls of the gate trenches 150x by a highly isotropic etch. Alternatively or in addition, a gate shielding zone 414 may be formed in the vertical projection of the gate trench 150x.

FIGS. 26A and 26B show the second auxiliary mask 764 with a stripe-shaped second auxiliary mask opening 765 above the gate trenches 150x and covering the field plate structures 160 as well as the second sacrificial material 792 in the drain contact trenches 325x and the first sacrificial material 791 in the central openings 110y.

The second auxiliary mask 764 may be removed and a gate dielectric 151 may be formed by thermal oxidation of the material of the base substrate 100a and/or by depositing a dielectric material in a conformal manner. One or more conductive materials such as polycrystalline silicon and a metal containing material are deposited to fill the gate trenches 150x. Portions of the gate dielectric 151 and portions of the conductive materials deposited outside of the gate trenches 150x may be removed by CMP using the protection mask 754 as a stopping layer during the polishing process.

Figure 27A:
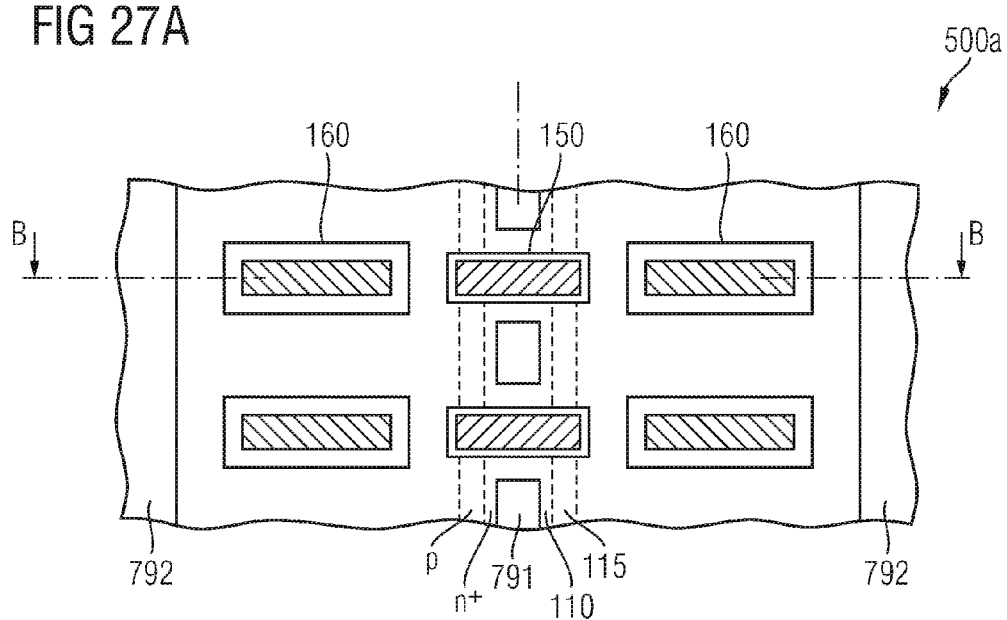
FIG. 27A is a schematic plan view of the semiconductor substrate portion of FIG. 26A, after forming gate structures in the gate trenches.
Figure 27B:
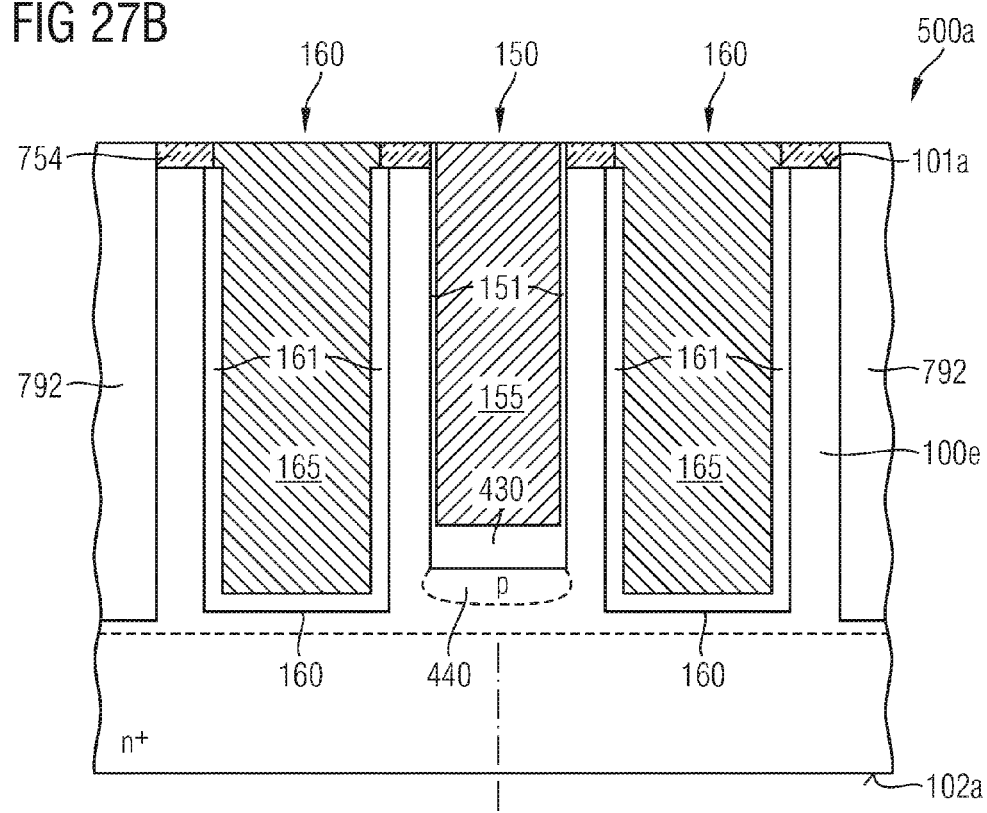
FIG. 27B is a schematic vertical cross-sectional view of the semiconductor substrate portion of FIG. 27A along line B-B along horizontal longitudinal axes of the field plate structures.

FIGS. 27A to 27B show gate structures 150 formed in the gate trenches 150x and including gate electrodes 155 formed from the deposited conductive materials.

A third auxiliary mask layer, for example a photoresist layer, may be deposited and patterned by photolithography to form a third auxiliary mask 772 with third auxiliary mask openings 773 in the vertical projection of portions of the source region 110 and the first sacrificial material 791. The third auxiliary mask openings 773 may alternate with the gate structures 150 along the horizontal longitudinal center axis of the source region 110. The third auxiliary mask openings 773 may be symmetric with respect to the horizontal longitudinal center axis of the source region 110 and may cross the source region 110, intermediate portions of the first sacrificial material 791 and may extend into the body region 115. Using the third auxiliary mask 772 as etch mask, deep body contact trenches 117x may be etched at least into portions of the source region 110 and the body region 115 exposed by the third auxiliary mask openings 773. The etch may be highly selective against the first sacrificial material, such that for each third auxiliary mask opening 773 two deep body contact trenches 117x are etched on opposite sides of the intermediate portion of the first sacrificial material 791. According to another embodiment, the etch is not selective and the first sacrificial material 791 is also removed as far as exposed by the third auxiliary mask openings 773. Then, p-type impurities are introduced into exposed portions of the body regions 115 and the source region 110 to form heavily doped body contact zones 117 for a low ohmic connection of the body region 115, for example, by an angled implant, by diffusion from a plasma phase, or by diffusion from a gaseous or solid auxiliary material containing a suitable dopant.

FIGS. 28A and 28B show the deep body contact trenches 117x as well as the heavily $p^{3o}$-doped body contact zones 117 formed along the deep body contact trenches 117x in the epitaxy layer 100e.

A third sacrificial material 793 may be deposited to fill the deep body contact trenches 117x and the third auxiliary mask 772 may be removed.

Figure 29A:
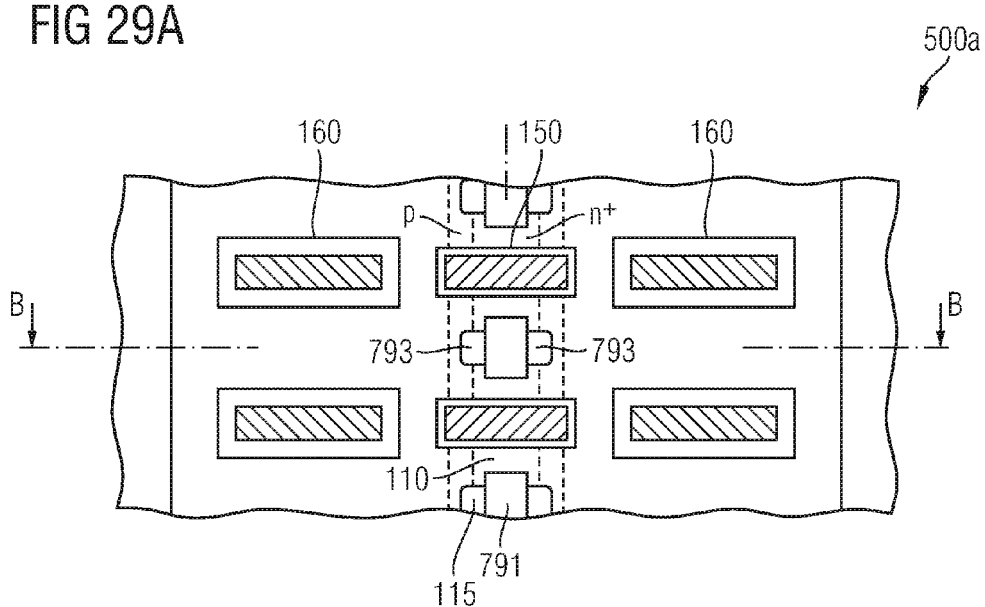
FIG. 29A is a schematic plan view of the semiconductor substrate portion of FIG. 28A, after filling the source contact trenches with a third sacrificial material.
Figure 29B:
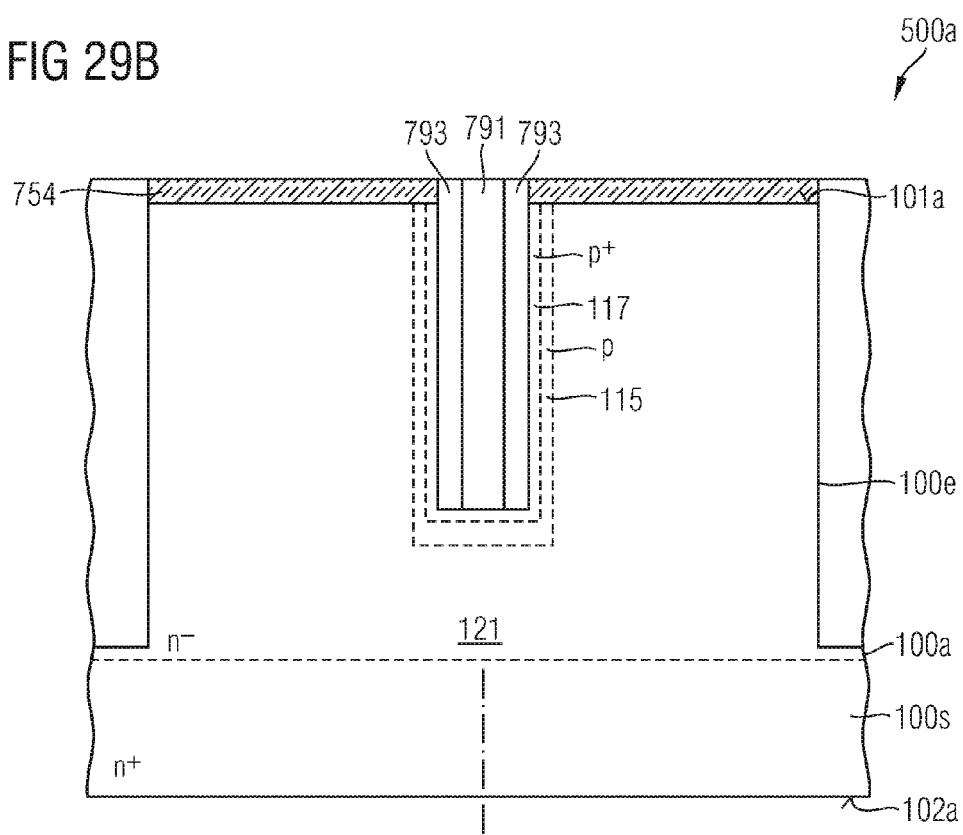
FIG. 29B is a schematic vertical cross-sectional view of the semiconductor substrate portion of FIG. 29A along line B-B through a source contact trench and orthogonal to a horizontal longitudinal axis of the source region.

FIGS. 29A and 29B show the third sacrificial material 793 that may be the same as the first and/or the second sacrificial material 791, 792.

A fourth auxiliary mask layer is deposited and patterned by photolithography to form a fourth auxiliary mask 774 with fourth auxiliary mask openings 775 exposing the second sacrificial material 792 in the drain contact trenches 325x as well as the first and second sacrificial materials in the source contact trenches 315x, wherein the fourth auxiliary mask 774 covers the field plate structures 160 and the gate structures 150. Around the source contact trenches 315x the fourth auxiliary mask openings 775 are greater than the openings of the source contact trenches 315x. Using the fourth auxiliary mask 774 as etch mask, the second sacrificial material 792 is removed from the drain contact trenches 325x and the first and third sacrificial materials 791, 793 may be removed from portions of the source contact trenches 315x.

Figure 30A:
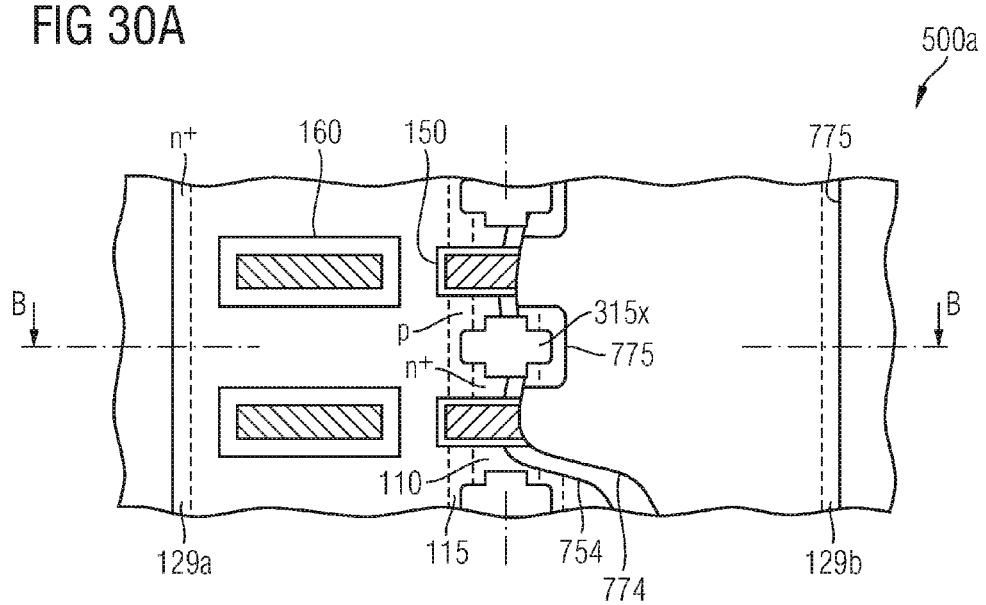
FIG. 30A is a schematic plan view of the semiconductor substrate portion of FIG. 29A, after forming an auxiliary mask with openings exposing the second sacrificial material in the drain contact trenches and the third sacrificial material in the source contact trenches.
Figure 30B:
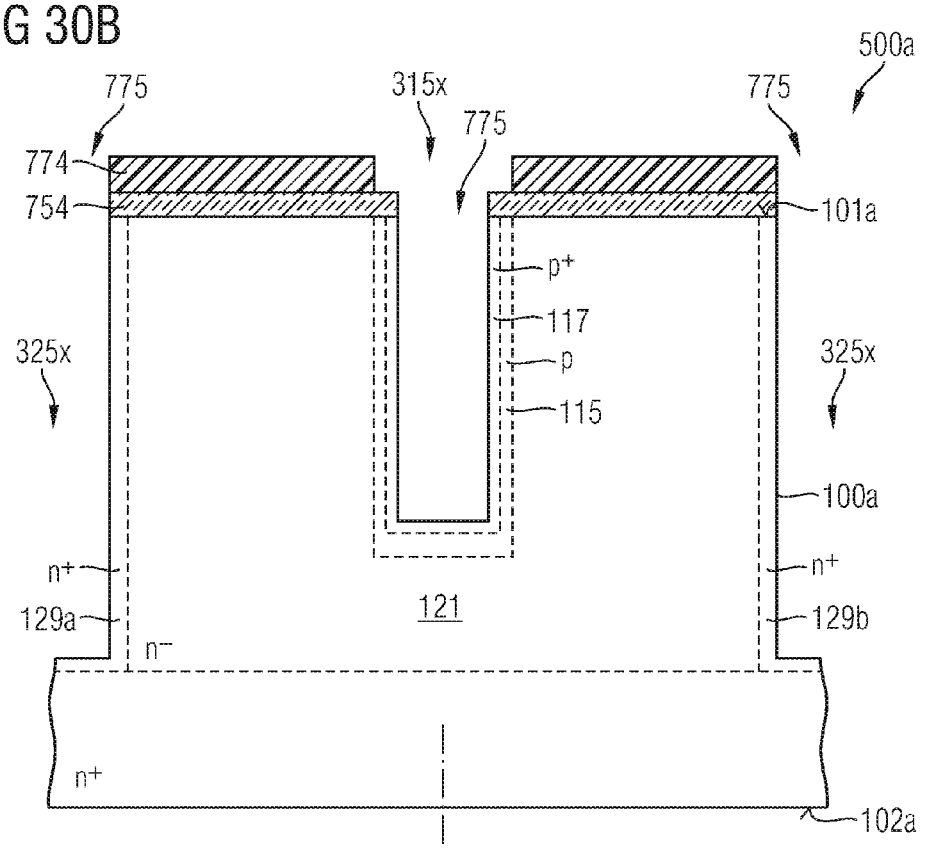
FIG. 30B is a schematic vertical cross-sectional view of the semiconductor substrate portion of FIG. 30A along line B-B through a source contact trench and orthogonal to a horizontal longitudinal axis of the source region.

FIGS. 30A and 30B show the re-opened drain contact trenches 325x as well as the opened source contact trenches 315x alternating with the gate structures 150 along the horizontal longitudinal center axes of the source region 110. The heavily $p^+$-doped body contact zones 117 provide a low-ohmic connection to the body regions 115. Since along the horizontal longitudinal axis of the source region 110 the extension of the fourth auxiliary mask openings 775 may be greater than that of the source contact trenches 315x, a horizontal cross-sectional area of the resulting source contact trenches 315x may be cross-shaped and the body contact zones 117 may be formed along a first bar orthogonal to the horizontal longitudinal axis of the source region 110, whereas the source contact is formed along a second bar parallel to the horizontal longitudinal axis of the source region 110.

Heavily $p^+$-doped collection portions 129a, 129b of a drain structure 129 may be formed by introducing dopants selectively through sidewalls of the drain contact trenches 325x, e.g., by using an additional implant mask.

The fourth auxiliary mask 774 may be used as a further etch mask to further recess the source contact trenches 315x as well as the drain contact trenches 325x. The source contact trenches 315x may be recessed such that the source contact trenches 315x cut through a horizontal portion of the source region 110 and directly shorten the body region 115 and the source region 110 at the bottom of the source contact trench 315x. A recess of the drain contact trench 325x may result in that the drain contact trenches 325x extend directly into the heavily doped substrate portion 100s.

One or two conformal metal liners may be deposited that line the source contact trenches 315x and the drain contact trenches 325x. A fill layer may be deposited that fills the remaining voids in the source contact trenches 315x and the drain contact trenches 325x.

Figure 31A:
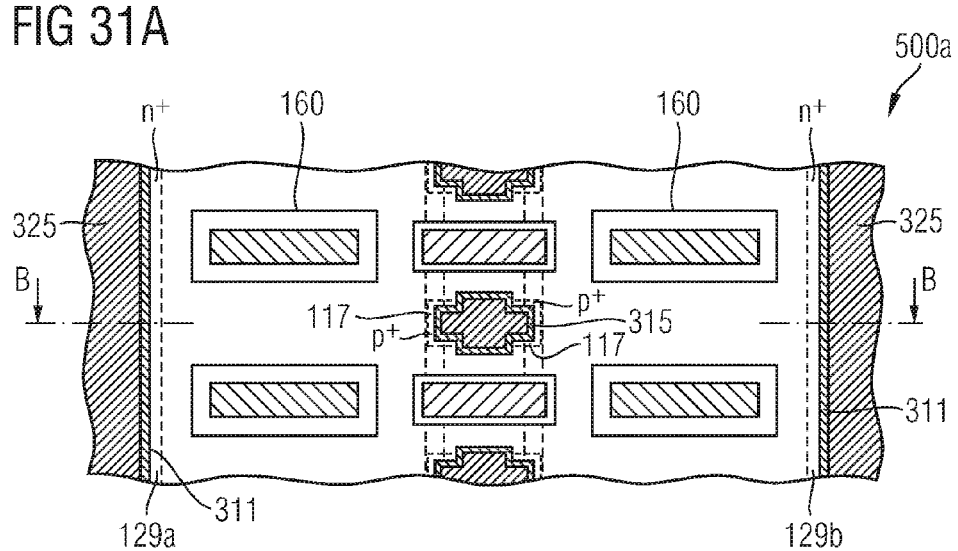
FIG. 31A is a schematic plan view of the semiconductor substrate portion of FIG. 30A, after forming contact structures in the source contact trenches and metal drain conductors in the drain contact trenches.
Figure 31B:
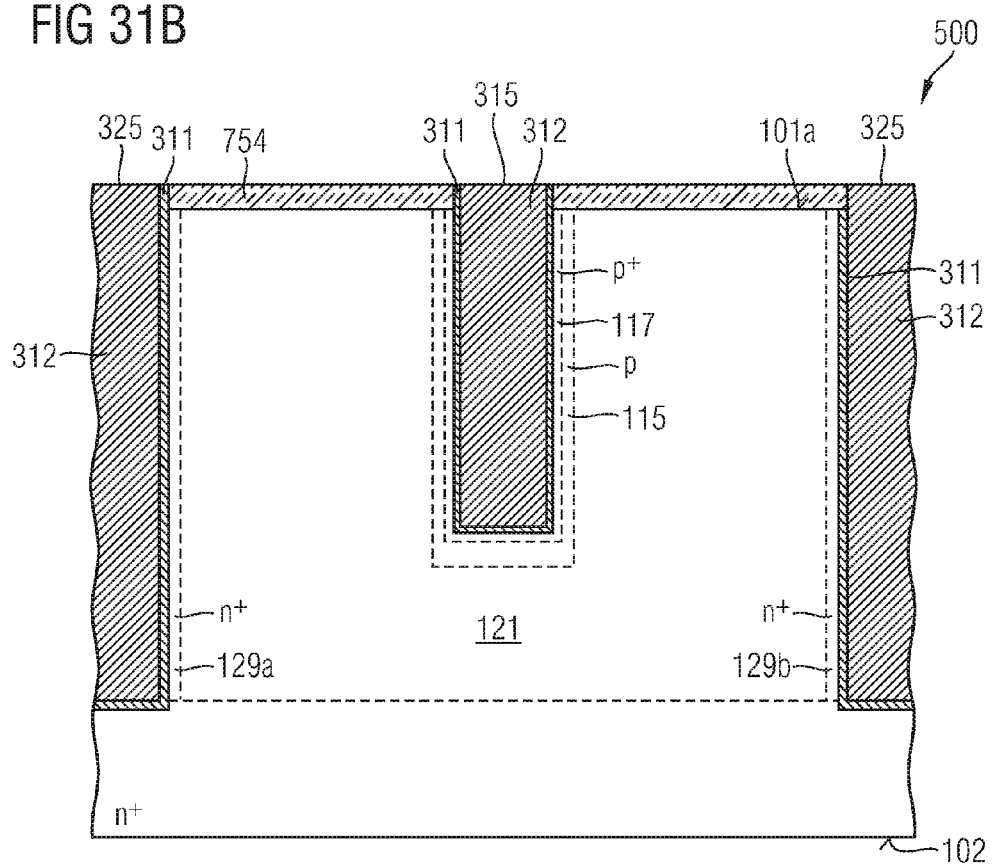
FIG. 31B is a schematic vertical cross-sectional view of the semiconductor substrate portion of FIG. 31A along line B-B through a source contact trench and orthogonal to a horizontal longitudinal axis of the source region.
Figure 32A:
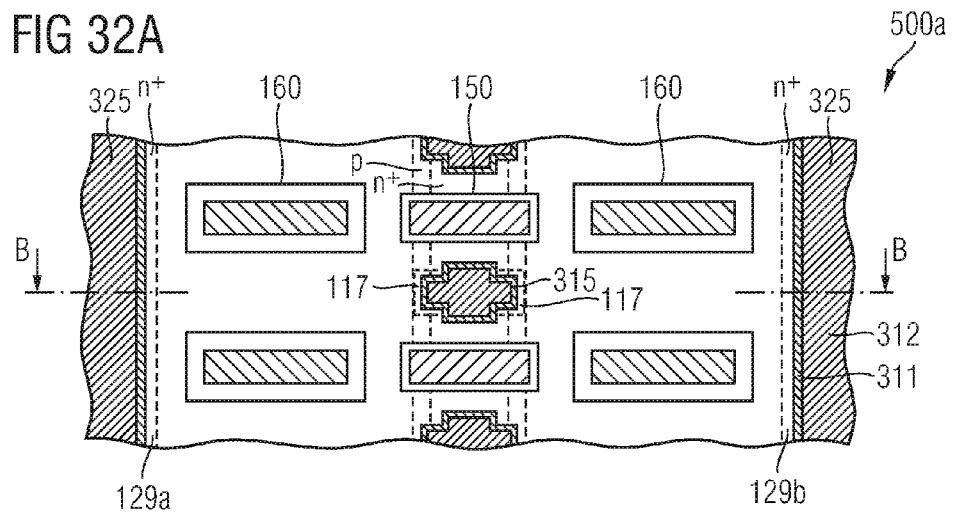
FIG. 32A is a schematic plan view of the semiconductor substrate portion of FIG. 31A, after forming load electrodes on opposite sides of the semiconductor substrate.
Figure 32B:
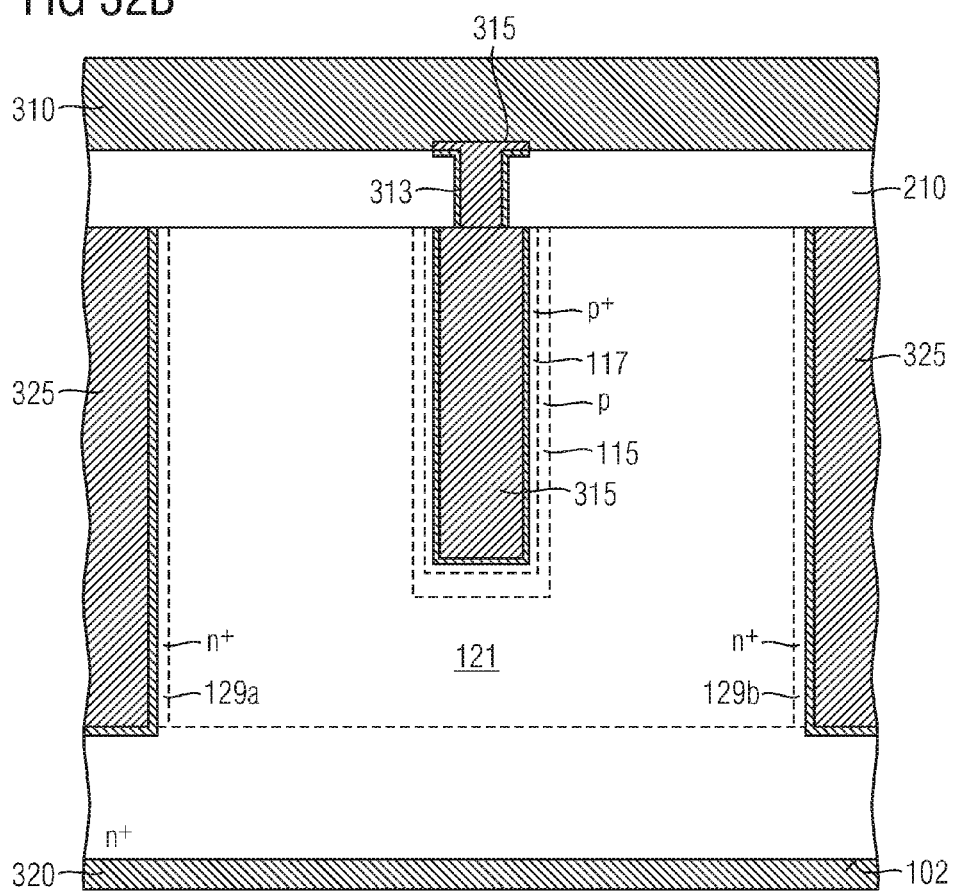
FIG. 32B is a schematic vertical cross-sectional view of the semiconductor substrate portion of FIG. 32A along line B-B through a source contact trench and orthogonal to a horizontal longitudinal axis of the source region.
Figure 32C:
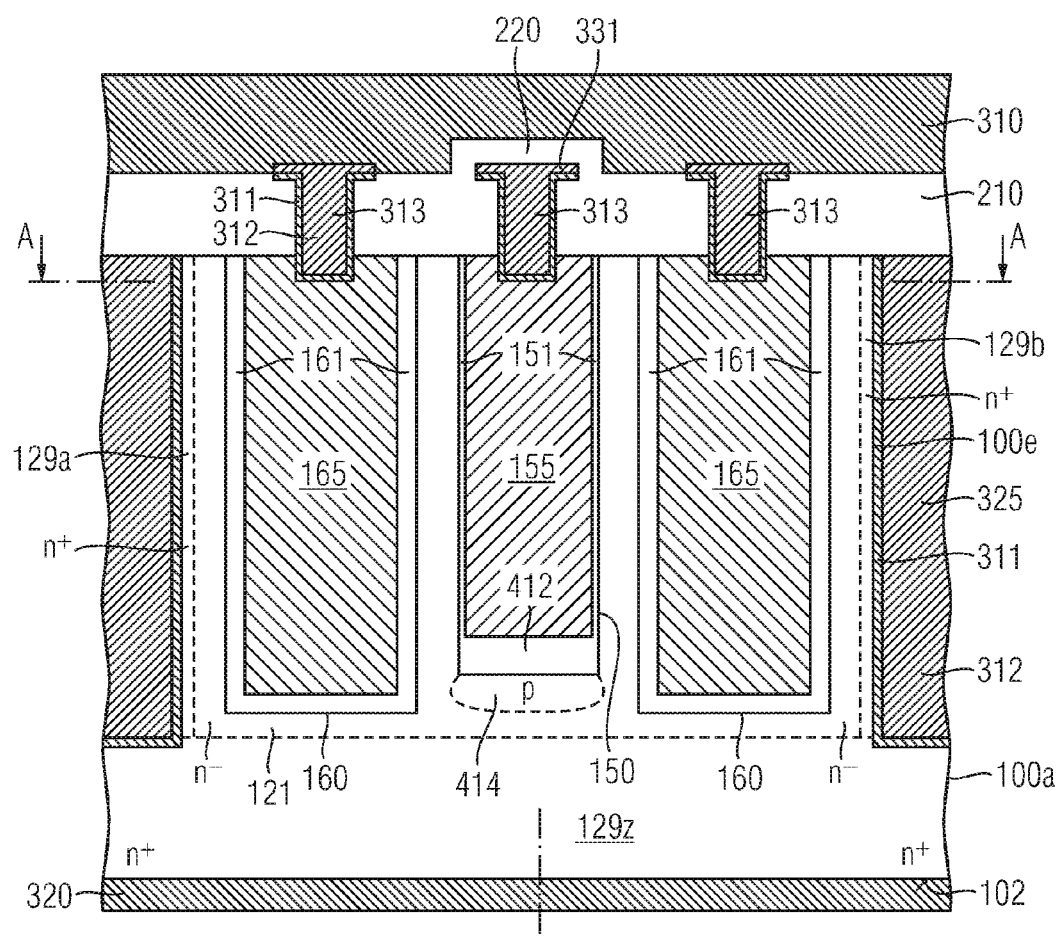
FIG. 32C is a schematic vertical cross-sectional view of the semiconductor substrate portion of FIG. 32A along line C-C along a horizontal longitudinal axis of the field plate structures.

FIGS. 31A and 31B show a barrier liner 311, which may include or consist of tantalum, titanium, tantalum nitride, titanium nitride, titanium tungsten to prevent interdiffusion between a fill layer 312, which may contain tungsten, and the semiconductor material of the base substrate 100a. The barrier liner 311 and the fill layer 312 form contact structures 315 in the source contact trenches 315x as well as metal drain conductors 325 in the drain contact trenches 325x.

Then, an interlayer dielectric 210 may be deposited and front side and backplate electrodes 310, 320 may be formed on opposite sides of the semiconductor substrate 500a as described with reference to FIGS. 17A and 17B.

The method illustrated with reference to FIGS. 33A to 34B differs from the method as illustrated in FIGS. 18A to 32B in that between neighboring gate structures 150 structures of the first sacrificial material 791, which are embedded in the source regions 110, are partially opened for the formation of body contact zones 117.

Field plate structures 160 and gate structures 150 may be formed in an epitaxy layer 100e as described with respect to FIGS. 18A to 27B. After formation of the field plate structures 160 and the gate structures 150 by using a first and a second auxiliary mask, a third auxiliary mask 772 is formed that covers the field plate structures 160 and the gate structures 150. Third auxiliary mask openings 773 in the third auxiliary mask 772 define body contact trenches 117x in the longitudinal center area of the structures of the first sacrificial material 791. Using the third auxiliary mask 772 as etch mask, the body contact trenches 117x are etched into the structures of the first sacrificial material 791.

Figure 33A:
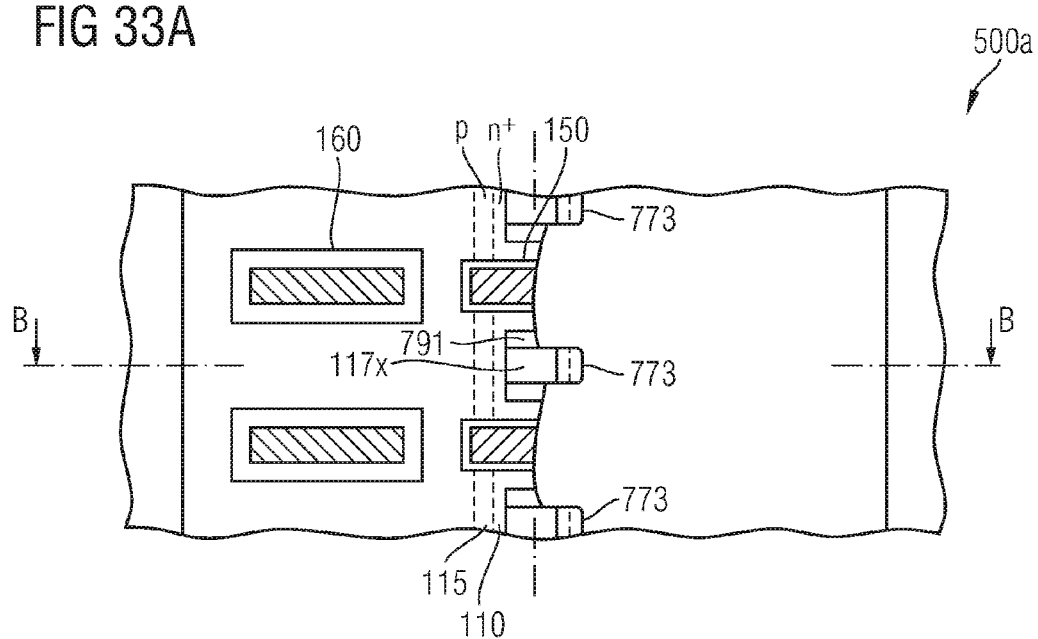
FIG. 33A is a schematic plan view of a portion of a semiconductor substrate for illustrating a method of manufacturing a semiconductor device according to an embodiment including formation of body contact zones through sidewalls of deep body contact trenches, after forming the deep body contact trenches.
Figure 33B:
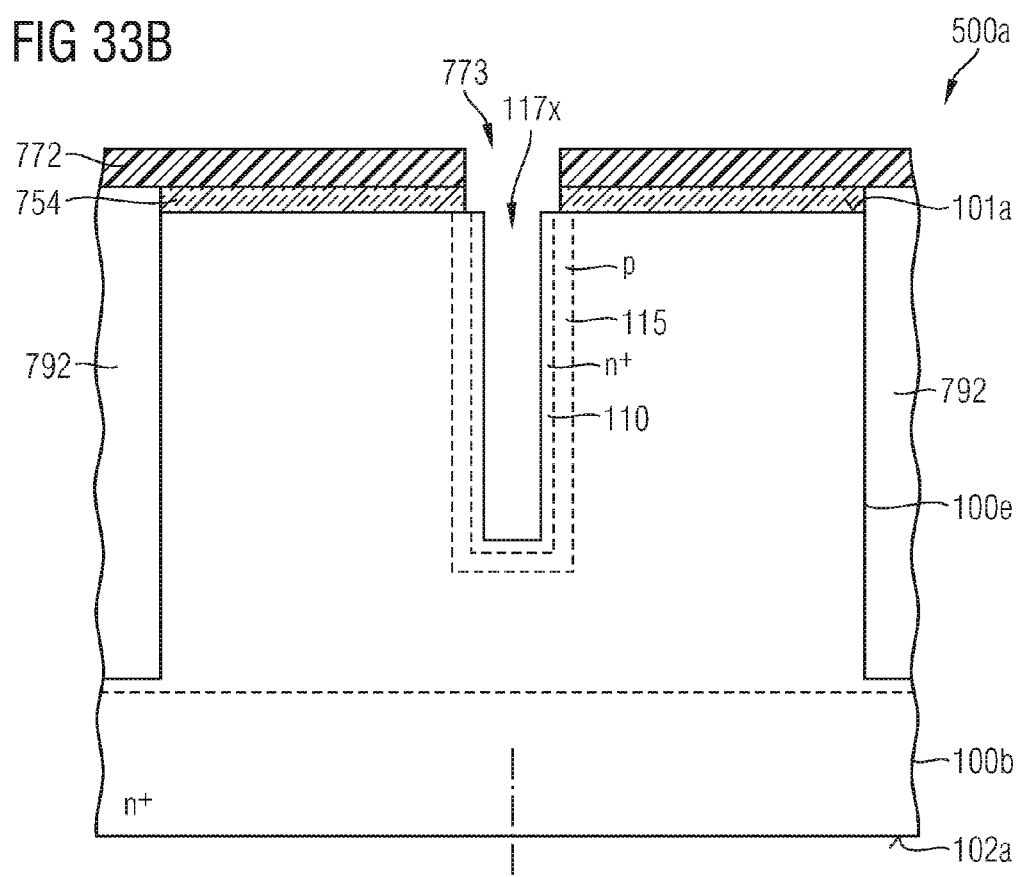
FIG. 33B is a schematic vertical cross-sectional view of the semiconductor substrate portion of FIG. 33A along line B-B orthogonal to a horizontal longitudinal axis of a body region.

As shown in FIGS. 33A and 33B, the body contact trenches 117x expose central sections of the source region 110 between neighboring gate structures 150. An auxiliary material containing p-type dopants, e.g., BSG may be deposited in the body contact trenches 117x and the dopants may diffuse into adjoining portions of the epitaxy layer 100e during a heating treatment. The auxiliary material and the first sacrificial material 791 may be replaced with conductive materials to form highly conductive contact structures.

Alternatively, a tilted implant may implant p-type dopants in a plane parallel to the horizontal transverse axis of the body region 115.

Figure 34A:
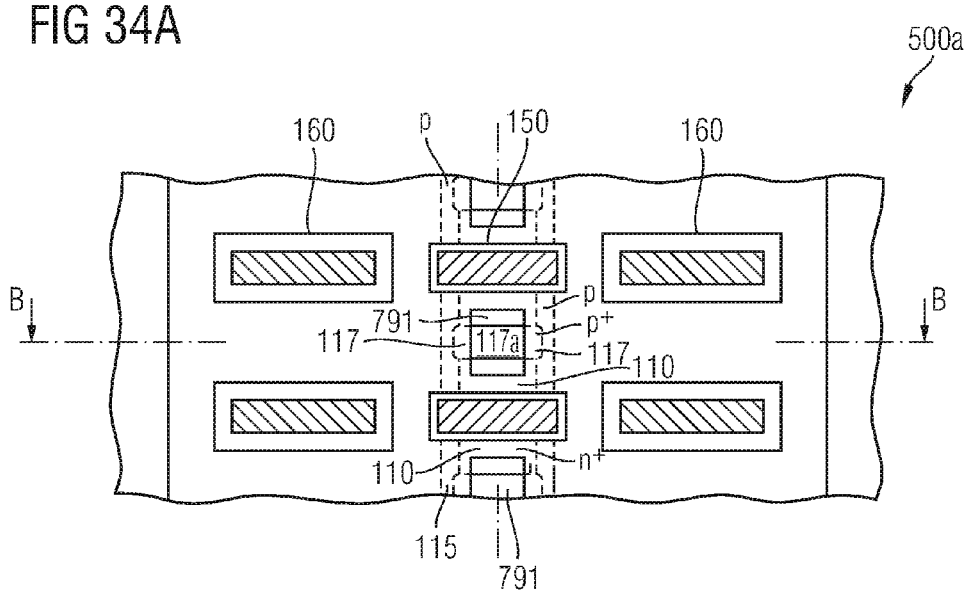
FIG. 34A is a schematic plan view of the semiconductor substrate portion of FIG. 33A, after forming the body contact zones.
Figure 34B:
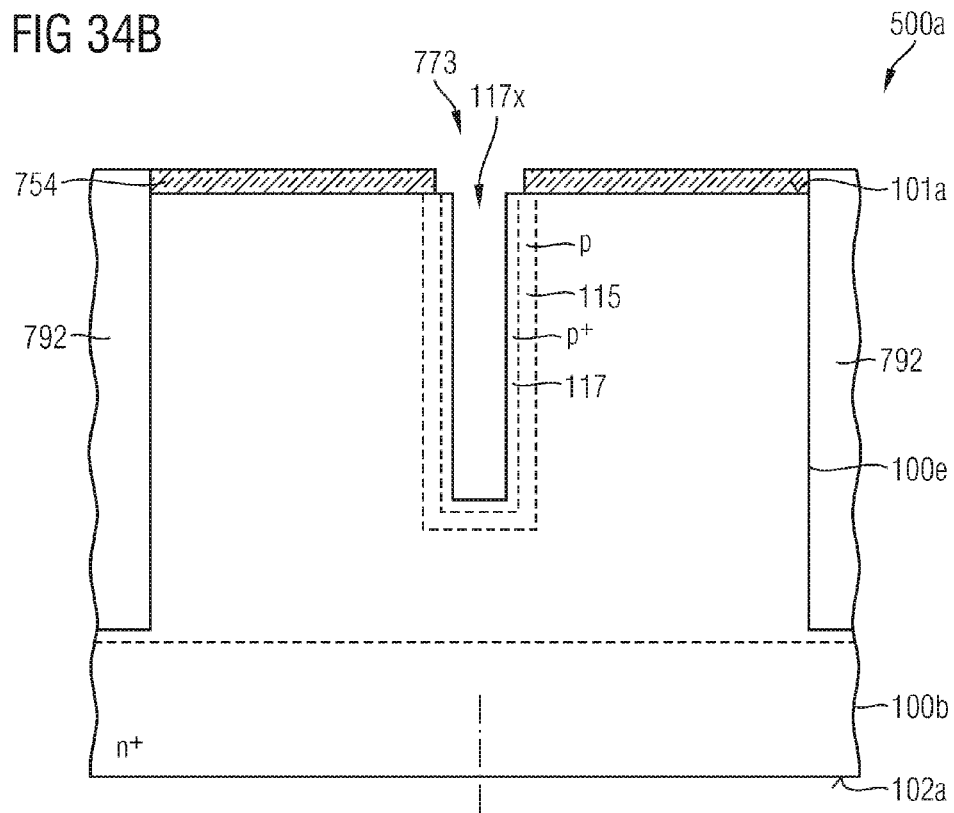
FIG. 34B is a schematic vertical cross-sectional view of the semiconductor substrate portion of FIG. 34A along line B-B orthogonal to the horizontal longitudinal axis of the body region.

FIGS. 34A and 34B show heavily doped p+-type body contact zones 117 resulting from the implant. The body contact zones 117 may form low ohmic connections for the p-type body region 115. After the implant, remnants of the first sacrificial material may be removed. In the resulting contact trenches metal contact structures may be formed.

Figure 35A:
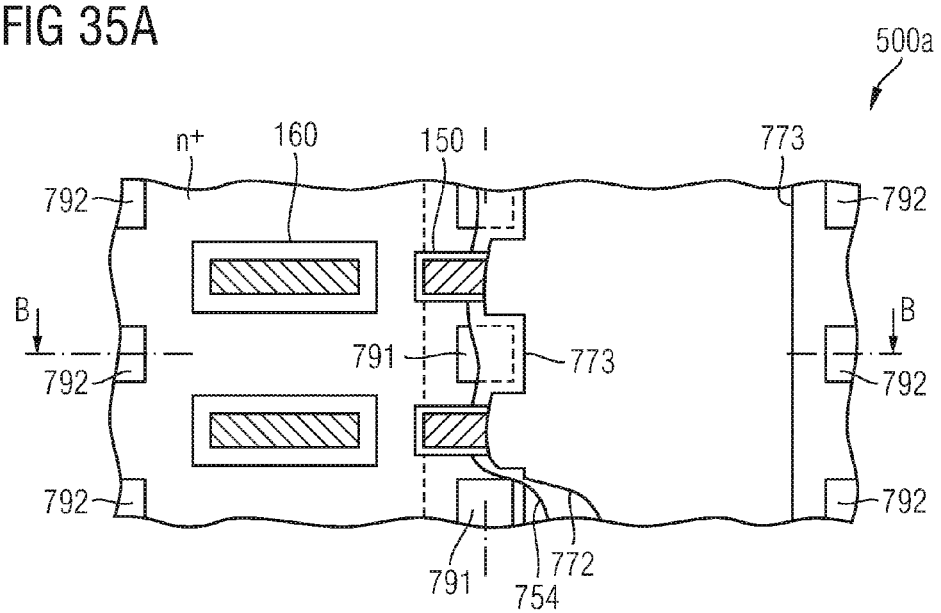
FIG. 35A is a schematic plan view of a portion of a semiconductor substrate for illustrating a method of manufacturing a semiconductor device according to an embodiment including formation of body contact zones and source zones through sidewalls of deep body contact trenches, after forming the deep body contact trenches.
Figure 35B:
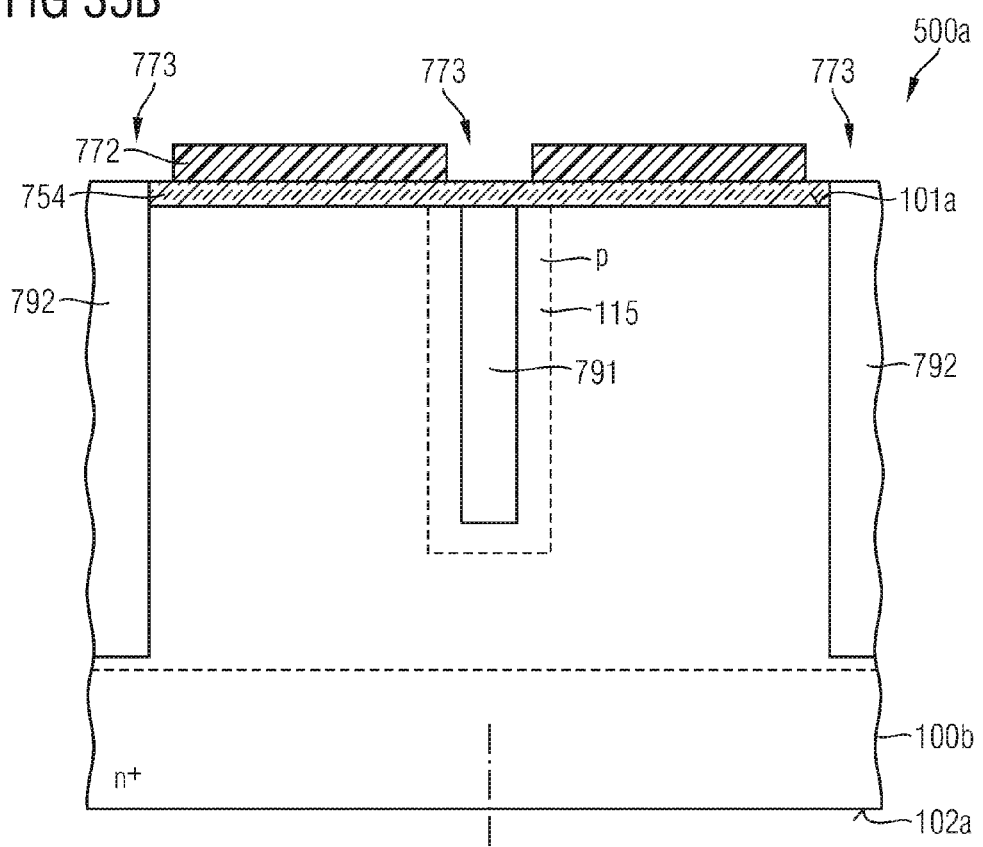
FIG. 35B is a schematic vertical cross-sectional view of the semiconductor substrate portion of FIG. 35A along line B-B orthogonal to a horizontal longitudinal axis of a body region.

FIGS. 35A to 35B refer to an embodiment combining the formation of body contact zones 117, source regions 110 and collection portions 129a, 129b of a drain structure 129.

A body region 115 may be formed around source openings 110x in an epitaxy layer 100e as described with respect to FIGS. 18A to 19B. The source openings 110x are filled with a first sacrificial material 791 as illustrated in FIGS. 21A and 21B without that source regions 110 are formed before deposition of the first sacrificial material 791. Together with field plate structures 160 and gate structures 150, rows of drain contact trenches 325x on sides of the field plate structures 160 opposite to the body region 115 may be formed in the epitaxy layer 100e as described with respect to FIGS. 22A to 27B.

After formation of the field plate structures 160 and the gate structures 150 by using a first and a second auxiliary mask, a third auxiliary mask 772 is formed that covers the field plate structures 160 and the gate structures 150. Third auxiliary mask openings 773 in the third auxiliary mask 772 expose the rows of drain contact trenches filled with the second sacrificial material 792 on sides of the field plate structures 160 opposite to the body region 115 as well as the source openings filled with the first sacrificial material 791 along the horizontal longitudinal center axis of the body region 115.

FIGS. 35A and 35B show the third mask openings 773 in the vertical projection of the rows of drain contact trenches filled with the second sacrificial material 792 and the source openings filled with the first sacrificial material 791.

Using the third auxiliary mask 772 as etch mask, body contact trenches 117x are formed by recessing the first sacrificial material 791 and rows of drain contact trenches 325x are formed by recessing the second sacrificial material, which may be the same as the first sacrificial material. The drain contact trenches 325x may be wider than and may have a greater vertical extension than the body contact trenches 117x.

A first tilted implant may implant n-type dopants in a plane parallel to the horizontal longitudinal axis of the body region 115 and a second tilted implant may implant p-type dopants in a plane parallel to the horizontal transverse axis of the body region 115.

Figure 36A:
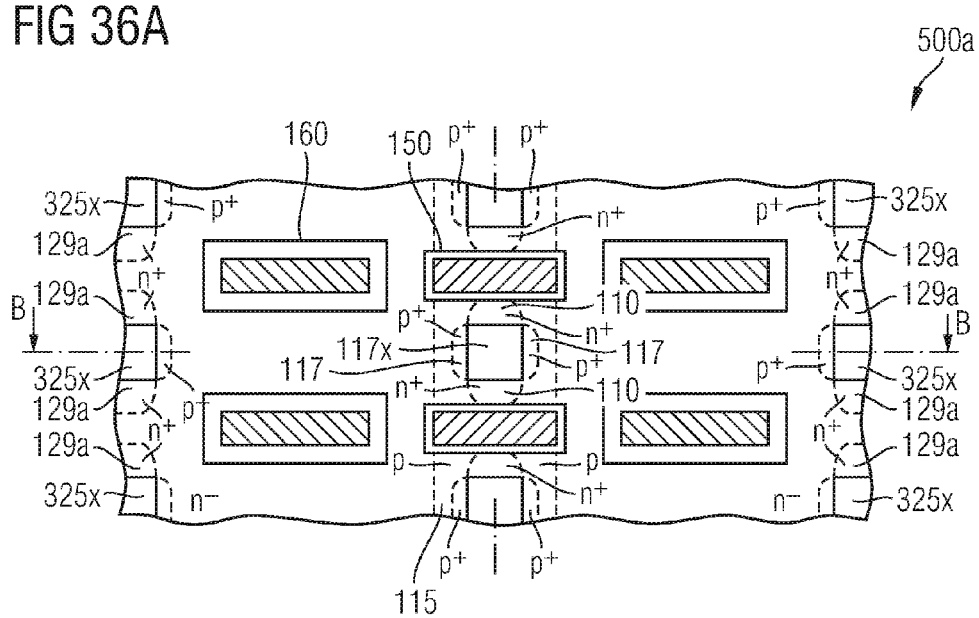
FIG. 36A is a schematic plan view of the semiconductor substrate portion of FIG. 35A, after forming the body contact and source zones.
Figure 36B:
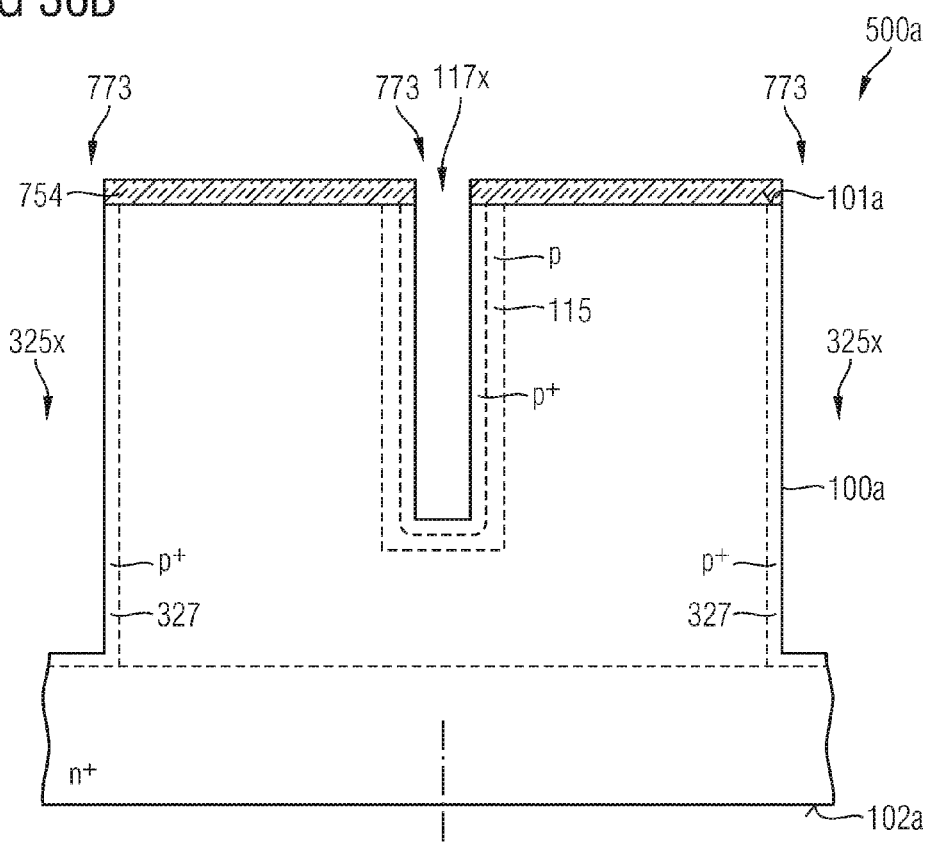
FIG. 36B is a schematic vertical cross-sectional view of the semiconductor substrate portion of FIG. 36A along line B-B orthogonal to the horizontal longitudinal axis of the body region.

FIGS. 36A and 36B show heavily doped n+-type source regions 110 formed between the gate structures 150 and the body contact trenches 117x as well as n+-type collection portions 129a, 129b of a drain structure 129 formed on opposite sides of the drain contact trenches 325x along the horizontal longitudinal axis of the body region 115. Heavily doped p+-type body contact zones 117 form low ohmic connections for the p-type body region 115. In addition, heavily doped p+-type zones 327 may be formed along the drain contact trenches 325x along the horizontal transverse axis of the body region 115.

Metal contact structures 315 may be formed in the body contact trenches 117x and metal drain conductors 325 may be formed in the drain contact trenches 325x similar to those illustrated in FIGS. 31A to 32B.

In FIGS. 37A to 38B close-to-surface body contact zones 117 are formed after formation of an interlayer dielectric 210.

Body regions 115 and source regions 110 may be formed as described with reference to FIGS. 18A to 21B, wherein the source region 110 may completely fill the source opening 110x of FIG. 20B. Field plate structures 160 and gate structures 150 may be formed in an epitaxy layer 100e as described with respect to FIGS. 21A to 27B. After formation of the field plate structures 160 and the gate structures 150 by using a first and a second auxiliary mask, a third auxiliary mask may be formed that covers the field plate structures 160 and the gate structures 150. Third auxiliary mask openings in the third auxiliary mask may define source contact trenches. Using the third auxiliary mask as etch mask, the source contact trenches may be etched into the source region 110 and into the body region 115. Contact structures 315 may be formed in the source contact trenches.

Figure 37A:
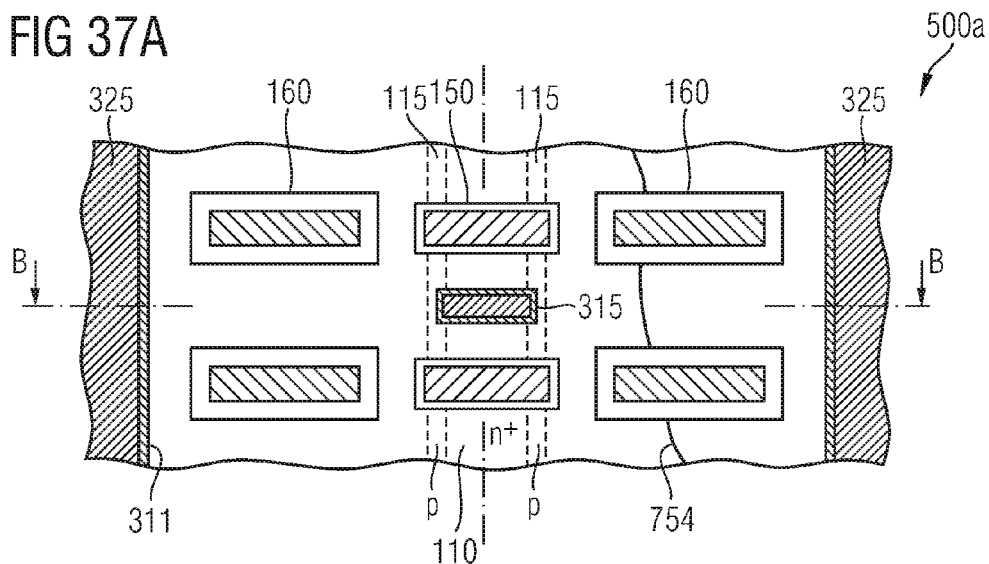
FIG. 37A is a schematic plan view of a portion of a semiconductor substrate for illustrating a method of manufacturing a semiconductor device according to an embodiment including formation of close-to-surface body contact zones, after forming contact structures.
Figure 37B:
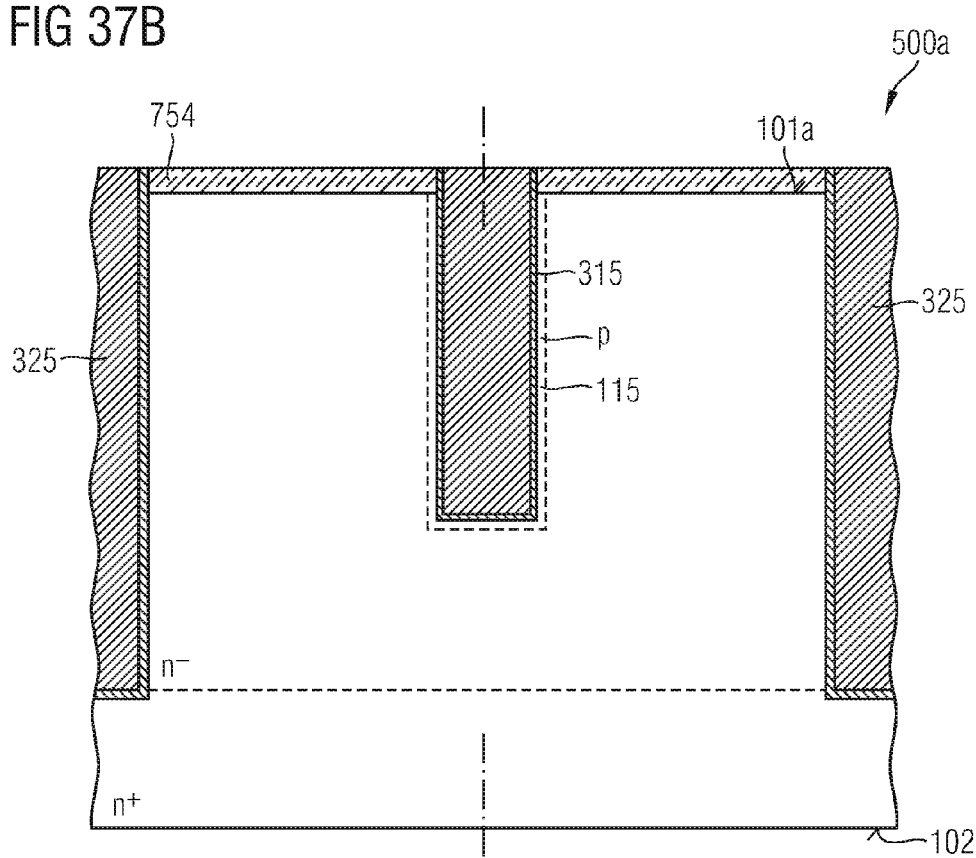
FIG. 37B is a schematic vertical cross-sectional view of the semiconductor substrate portion of FIG. 37A along line B-B orthogonal to a horizontal longitudinal axis of a body region.

As shown in FIGS. 37A and 37B, the contact structures 315 may alternate with the gate structures 150 along the horizontal longitudinal axis of the body region 115.

The protection mask 754 may be removed. An interlayer dielectric 210 may be deposited and contact openings 211 may be formed in the interlayer dielectric 210 by photolithography in the vertical projection of the gate electrodes 155, the field electrodes 165, and the contact structures 315. P-type dopants may be introduced through the openings 211, e.g., by an implant. Before or after the implant, the contact structures 315 may be slightly recessed. Conductive material may be deposited to fill the openings 211.

Figure 38A:
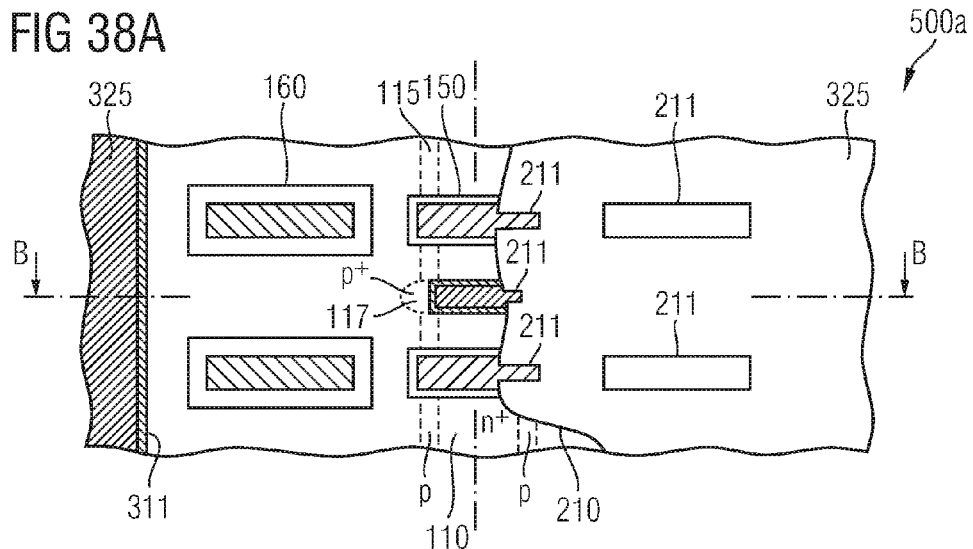
FIG. 38A is a schematic plan view of the semiconductor substrate portion of FIG. 37A, after forming the close-to-surface body contact zones.
Figure 38B:
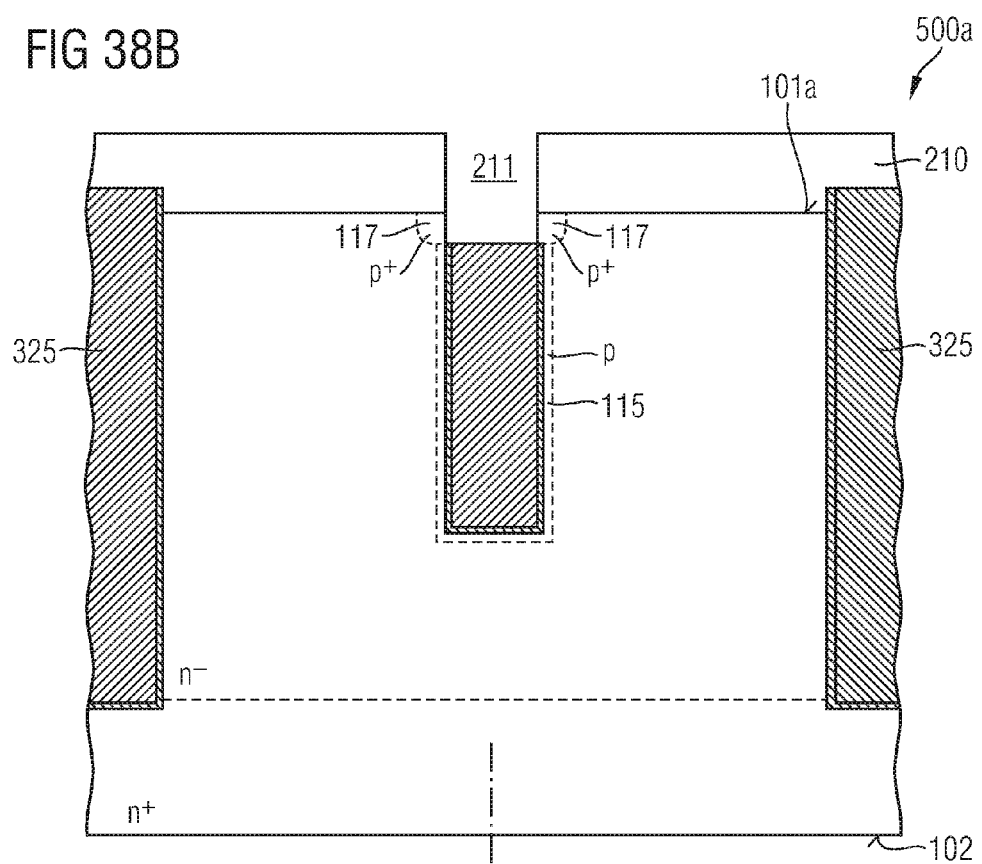
FIG. 38B is a schematic vertical cross-sectional view of the semiconductor substrate portion of FIG. 38A along line B-B orthogonal to the horizontal longitudinal axis of the body region.

FIGS. 38A and 38B show heavily doped p+-type close-to-surface body contact zones 117 formed by the implant through the openings 211 in the interlayer dielectric 210 in the vertical projection of the contact structures 315. The implant of the p-type dopants may be exclusively effective for the openings 211 in the vertical projection of the contact structures 315 or also for further openings.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a drift region extending from a first surface into a semiconductor portion;
a body region between two portions of the drift region, the body region forming a first pn junction with the drift region;
a source region between two portions of the body region, the source region forming a second pn junction with the body region, wherein the first and second pn junctions include sections perpendicular to the first surface;
gate structures extending into the body regions and including a gate electrode;
field plate structures extending into the drift region and including a field electrode separated from the gate electrode; and
a gate shielding structure in a vertical projection of the gate structures and configured to reduce a capacitive coupling between the gate structures and a backplate electrode directly adjoining a second surface opposite to the first surface.

2. The semiconductor device of claim 1, further comprising:
contact structures directly adjoining the source regions, wherein the contact structures and the gate structures alternate along a horizontal longitudinal axis of the source region.

3. The semiconductor device of claim 1, further comprising:
a drain structure forming a homojunction with the drift region, the drain structure comprising collection portions extending from the first surface into the semiconductor portion on opposite sides of the drift region.

4. The semiconductor device of claim 3, wherein the drain structure surrounds the drift region in a horizontal plane parallel to the first surface.

5. The semiconductor device of claim 3, wherein the drain structure includes a plurality of first collection portions arranged in a first row at a first side of the drift region and a plurality of second collection portions arranged in a second row at an opposite second side of the drift region.

6. The semiconductor device of claim 1, wherein the drift region surrounds the body region in a horizontal plane parallel to the first surface.

7. The semiconductor device of claim 1, wherein horizontal longitudinal axes of the field plate structures parallel to the first surface run perpendicular to a horizontal longitudinal axis of the source region.

8. The semiconductor device of claim 1, wherein the field plate structures are arranged in rows parallel to horizontal longitudinal axes of the source region parallel to the first surface.

9. The semiconductor device of claim 8, wherein the field plate structures are arranged in two rows parallel to and on opposite sides of a longitudinal axis of the source region parallel to the first surface.

10. The semiconductor device of claim 1, wherein a horizontal longitudinal axis of the body region coincides with a horizontal longitudinal axis of the source region parallel to the first surface.

11. The semiconductor device of claim 1, further comprising:
a termination field plate structure directly adjoining an end face of the body region in a horizontal direction parallel to the first surface.

12. The semiconductor device of claim 1, further comprising:
a dielectric separation layer between the drift region and a second surface of the semiconductor portion opposite to the first surface, the dielectric separation layer having a horizontal extension equal to or greater than a horizontal extension of the drift region.

13. The semiconductor device of claim 1, further comprising:
a front side electrode formed at a side of the semiconductor portion defined by the first surface and electrically connected to the source and body regions.

14. The semiconductor device of claim 1, further comprising:
a gate shielding dielectric between the gate electrode and a second surface of the semiconductor portion opposite to the first surface, wherein a thickness of the gate shielding dielectric exceeds a thickness of a gate dielectric that separates the gate electrode from the body region.

15. The semiconductor device of claim 1, further comprising:
a gate shielding zone between the gate electrode and a second surface of the semiconductor portion opposite to the first surface, wherein the gate shielding zone forms a pn junction with the drift region or wherein a net dopant concentration of the gate shielding zone is lower than a mean dopant concentration in the drift region.

16. The semiconductor device of claim 1, further comprising:
a field shielding structure between the gate structure and a second surface of the semiconductor portion opposite to the first surface, the field shielding structure comprising portions of the field plate structures outside of a horizontal projection of the gate structures and portions of the drift region between the gate structures and the second surface in the vertical projection of the gate structures.

17. The semiconductor device of claim 16, wherein a vertical extension of the field plate structures perpendicular to the first surface exceeds a vertical extension of the gate structures by at least 20%.

18. The semiconductor device of claim 16, wherein perpendicular to the first surface the field plate structures are U-shaped, the gate structures are formed between legs of the field plate structures and a separation dielectric separates the gate electrodes from the field electrodes.

19. The semiconductor device of claim 1, wherein sections of the drift region separate the gate structures from the field plate structures.

20. The semiconductor device of claim 1, wherein a vertical extension of the field plate structures perpendicular to the first surface is equal to a vertical extension of the gate structures.

21. The semiconductor device of claim 1, further comprising:
body contact zones with a net dopant concentration of at least $1E19\ cm^{-3}$ and directly adjoining to both the body regions and contact structures directly adjoining the source regions.

22. A method of forming a semiconductor device, the method comprising:
forming a drift region extending from a main surface into a base substrate;
forming a body region between two portions of the drift region, the body region forming a first pn junction with the drift region;
forming a source region between two portions of the body region, the source region forming a second pn junction with the body region, wherein the first and second pn junctions include sections perpendicular to the main surface;
forming gate structures extending into the body regions and including a gate electrode;
forming field plate structures extending into the drift region including a field electrode separated from the gate electrode; and
forming a gate shielding structure in a vertical projection of the gate structures and configured to reduce a capacitive coupling between the gate structures and a backplate electrode directly adjoining a supporting surface opposite to the main surface.

23. The method of claim 22, wherein forming the drift region comprises:
forming an epitaxy trench in the base substrate;

forming a dielectric separation layer covering a bottom of the epitaxy trench; and starting from sidewalls of the epitaxy trench, laterally overgrowing by epitaxy the dielectric separation layer to form portions of a precursor drift region, wherein the dielectric separation layer forms the gate shielding structure.

24. The method of claim 22, wherein forming the body region comprises:

forming a body trench in an epitaxy layer of the base substrate; and forming the body region along sidewalls of the body trench.

* * * * *